United States Patent
Aono et al.

(10) Patent No.: US 10,651,094 B2
(45) Date of Patent: May 12, 2020

(54) SEMICONDUCTOR DEVICE AND METHOD OF MANUFACTURING SAME

(71) Applicant: RENESAS ELECTRONICS CORPORATION, Tokyo (JP)

(72) Inventors: Hideki Aono, Tokyo (JP); Tetsuya Yoshida, Tokyo (JP); Makoto Ogasawara, Tokyo (JP); Shinichi Okamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/291,620

(22) Filed: Mar. 4, 2019

(65) Prior Publication Data
US 2019/0198402 A1    Jun. 27, 2019

Related U.S. Application Data

(63) Continuation of application No. 14/934,745, filed on Nov. 6, 2015, now abandoned.

(30) Foreign Application Priority Data

Nov. 13, 2014  (JP) .................................. 2014-230394

(51) Int. Cl.
H01L 21/8238    (2006.01)
H01L 21/762     (2006.01)
(Continued)

(52) U.S. Cl.
CPC .............. *H01L 21/823878* (2013.01); *H01L 21/26506* (2013.01); *H01L 21/76237* (2013.01);
(Continued)

(58) Field of Classification Search
CPC ......... H01L 21/823878; H01L 29/6659; H01L 21/26506; H01L 21/823814;
(Continued)

(56) References Cited

U.S. PATENT DOCUMENTS 6,479,368 B1   11/2002   Mandelman et al.
6,713,333 B2    3/2004   Mayuzumi
(Continued)

FOREIGN PATENT DOCUMENTS

CN    1201258 A   12/1998
CN    1534758 A   10/2004
(Continued)

OTHER PUBLICATIONS

T.J.J. Ho, et al., "Role of Nitrogen on the Gate Length Dependence of NBTI", IEEE Electron Device Letters, Jul. 2009, pp. 772-774, vol. 30, No. 7.
(Continued)

*Primary Examiner* — Victor A Mandala
(74) *Attorney, Agent, or Firm* — McDermott Will & Emery LLP

(57) ABSTRACT

To provide a semiconductor device having improved reliability. An element isolation region comprised mainly of silicon oxide is buried in a trench formed in a semiconductor substrate. The semiconductor substrate in an active region surrounded by the element isolation region has thereon a gate electrode for MISFET via a gate insulating film. The gate electrode partially extends over the element isolation region and the trench has a nitrided inner surface. Below the gate electrode, fluorine is introduced into the vicinity of a boundary between the element isolation region and a channel region of MISFET.

8 Claims, 31 Drawing Sheets

(51) Int. Cl.
*H01L 21/265* (2006.01)
*H01L 29/66* (2006.01)

(52) U.S. Cl.
CPC .. *H01L 21/823814* (2013.01); *H01L 29/6659* (2013.01); *H01L 29/665* (2013.01)

(58) Field of Classification Search
CPC . H01L 21/76237; H01L 29/665; H01L 29/78; H01L 21/823481; H01L 21/76224
See application file for complete search history.

(56) References Cited

U.S. PATENT DOCUMENTS

| | | | |
|---|---|---|---|
| 7,208,812 B2 | 4/2007 | Ohta | |
| 8,664,706 B2* | 3/2014 | Pan | H01L 29/66825 257/298 |
| 2001/0018274 A1* | 8/2001 | Sugizaki | H01L 21/0214 438/773 |
| 2003/0143812 A1 | 7/2003 | Lin | |
| 2004/0126990 A1 | 7/2004 | Ohta | |
| 2004/0198019 A1 | 10/2004 | Yasui et al. | |
| 2007/0077736 A1* | 4/2007 | Yamaguchi | H01L 21/26506 438/510 |
| 2013/0037888 A1 | 2/2013 | Han et al. | |
| 2013/0065374 A1* | 3/2013 | Tian | H01L 29/66272 438/353 |
| 2013/0143376 A1* | 6/2013 | Pan | H01L 29/66825 438/294 |
| 2013/0330900 A1* | 12/2013 | Pandey | H01L 21/265 438/301 |
| 2014/0042529 A1* | 2/2014 | Yamamoto | H01L 29/7827 257/330 |
| 2014/0070327 A1 | 3/2014 | Niimi et al. | |

FOREIGN PATENT DOCUMENTS

| | | |
|---|---|---|
| JP | 11-297812 A | 10/1999 |
| JP | 2001-144170 A | 5/2001 |
| JP | 2003-133549 A | 5/2003 |
| JP | 2004-207564 A | 7/2004 |
| JP | 2006-024895 A | 1/2006 |
| JP | 2007-103492 A | 4/2007 |
| JP | 2008-218852 A | 9/2008 |

OTHER PUBLICATIONS

Gaetan Math, et al., "Geometry effects on the NBTI deradation of PMOS transistors", IRW Final Report, 2008, pp. 60-63.
Communication dated Jan. 8, 2019 from the Japanese Patent Office in Application No. 2018-084841.
Non-Final Office Action issued in related parent U.S. Appl. No. 14/934,745, dated Jan. 26, 2017.
Final Office Action issued in related parent U.S. Appl. No. 14/934,745, dated Jul. 27, 2017.
Non-Final Office Action issued in related parent U.S. Appl. No. 14/934,745, dated Jan. 25, 2018.
Final Office Action issued in related parent U.S. Appl. No. 14/934,745, dated Jun. 15, 2018.
Notice of Allowance issued in related parent U.S. Appl. No. 14/934,745, dated Dec. 4, 2018.
Taiwanese Office Action issued in corresponding Taiwanese Patent Application No. 104135411, dated Mar. 13, 2019, with English Translation.
Chinese Office Action issued in corresponding Chinese Patent Application No. 2015107707516, dated Feb. 3, 2020, with English translation.

* cited by examiner

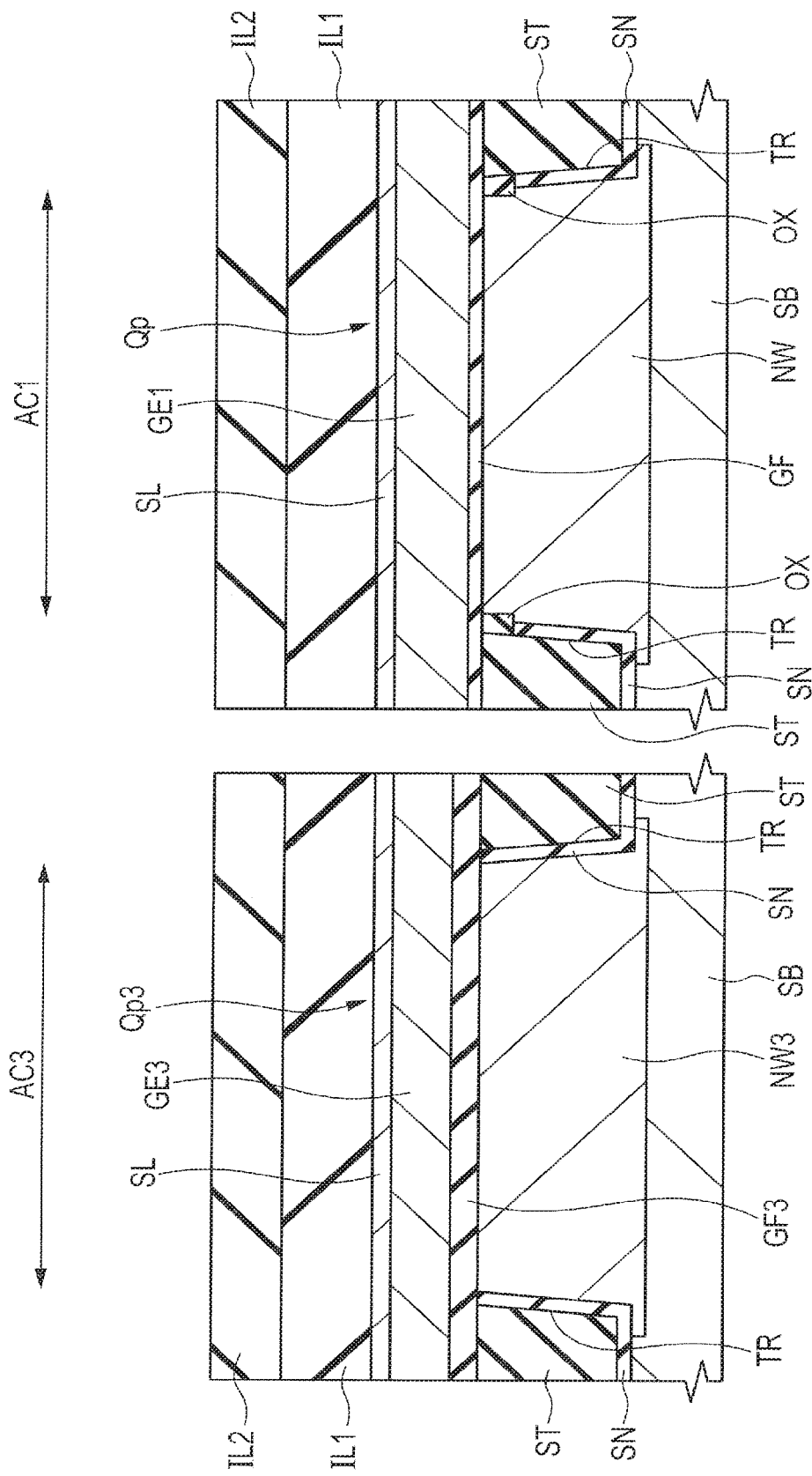

SEMICONDUCTOR DEVICE AND METHOD OF MANUFACTURING SAME

CROSS-REFERENCE TO RELATED APPLICATIONS

This application is a Continuation of U.S. patent application Ser. No. 14/934,745, filed on Nov. 6, 2015, which claims the benefit of Japanese Patent Application No. 2014-230394, filed on Nov. 13, 2014 including the specification, drawings, and abstract are incorporated herein by reference in their entirety.

BACKGROUND

The present invention relates to a semiconductor device and a method of manufacturing the same, which are suited for use in, for example, a semiconductor device having an STI-type element isolation region and MISFET and a method of manufacturing the device.

The STI type element isolation region can be formed by burying an insulating film in a trench formed in a semiconductor substrate. An MISFET and the like are then formed in an active region of the semiconductor substrate surrounded by the element isolation region.

Japanese Unexamined Patent Application Publication No. 2007-103492 (Patent Document 1) describes a technology of introducing, in forming an n type SOI transistor in an element region surrounded by a LOCOS layer, a parasitic channel preventing boron in an end portion of a channel region and introducing, as a diffusion reducing atom, fluorine or nitrogen in the end portion of the channel region.

Japanese Unexamined Patent Application Publication No. 2003-133549 (Patent Document 2) describes a technology of relaxing an electric field between a gate electrode and an end portion of a drain to suppress generation of a leakage current.

Japanese Unexamined Patent Application Publication No. 2008-218852 (Patent Document 3) describes a technology of carrying out channel doping with an n type impurity and also fluorine implantation.

Japanese Unexamined Patent Application Publication No. Hei 11(1999)-297812 (Patent Document 4) describes a technology relating to a semiconductor device using STI.

Japanese Unexamined Patent Application Publication No. 2004-207564 (Patent Document 5) describes a technology relating to a semiconductor device using STI.

Non-patent Documents 1 and 2 describe a technology relating to NBTI.

Patent Documents

[Patent Document 1] Japanese Unexamined Patent Application Publication No. 2007-103492
[Patent Document 2] Japanese Unexamined Patent Application Publication No. 2003-133549
[Patent Document 3] Japanese Unexamined Patent Application Publication No. 2008-218852
[Patent Document 4] Japanese Unexamined Patent Application Publication No. Hei 11(1999)-297812
[Patent Document 5] Japanese Unexamined Patent Application Publication No. 2004-207564

Non-Patent Documents

[Non-patent Document 1] T. J. J. Ho, et al., "Role of Nitrogen on the Gate Length. Dependence of NBTI", EDL 2009, p. 772

[Non-patent Document 2] Gaetan Math', et al., "Geometry effects on the NBTI degradation of PMOS transistors", IRW 2008

SUMMARY

Even a semiconductor device having a MISFET formed in an active region defined by an STI type element isolation region is desired to have reliability improved as much as possible.

Another object and novel features will be apparent from the description herein and accompanying drawings.

In one embodiment, a semiconductor device has a semiconductor substrate, an element isolation region buried in a trench formed in the semiconductor substrate, and a first gate electrode for first MISFET formed on the semiconductor substrate in a first active region surrounded by the element isolation region via a first gate insulating film. The element isolation region is comprised mainly of silicon oxide; the trench in the semiconductor substrate has a nitrided inner surface; and a portion of the first gate electrode extends over the element isolation region. Below the first gate electrode, fluorine is introduced into the vicinity of a boundary between the element isolation region and a channel region of the first MISFET.

In another embodiment, a semiconductor device has a semiconductor substrate, an element isolation region buried in a trench formed in the semiconductor substrate, and a first gate electrode for first MISFET formed on the semiconductor substrate in a first active region surrounded by the element isolation. region via a first gate insulating film. The element isolation region is comprised mainly of silicon oxide; the trench in the semiconductor substrate has, on an inner surface thereof, a nitride layer obtained by nitriding the inner surface; and a portion of the first gate electrode extends over the element isolation region. Below the first gate electrode, the nitride layer is not formed at a boundary between the upper portion of the semiconductor substrate in the first active region and the upper portion of the element isolation region.

In a further embodiment, a method of manufacturing a semiconductor device includes the steps of: (a) providing a semiconductor substrate, (b) forming a trench in the semiconductor substrate, (c) nitriding an inner surface of the trench in the semiconductor substrate, and (d) after the step (c), forming an element isolation region comprised mainly of silicon oxide in the trench. The method of manufacturing a semiconductor device further includes the steps of: (e) ion-implanting fluorine into the vicinity of a boundary between the element isolation region and the semiconductor substrate in the first active region surrounded by the element isolation region, and (f) after the step (e), forming a first gate electrode for first MISFET on the semiconductor substrate in the first active region via a first gate insulating film.

In a still further embodiment, a method of manufacturing a semiconductor device includes the steps of: (a) providing a semiconductor substrate, (b) forming a trench in the semiconductor substrate, (c) nitriding an inner surface of the trench in the semiconductor substrate to form a nitride layer, and (d) after the step (c), forming an element isolation region comprised mainly of silicon oxide in the trench. The method of manufacturing a semiconductor device further includes the steps of: (e) oxidizing an upper portion of the nitride layer at a boundary between the element isolation region and the semiconductor substrate in a first active region surrounded by the element isolation region, and (f) after the step (e), forming a first gate electrode for first MISFET on the semiconductor substrate in the first active region via a first gate insulating film.

According to the embodiments, a semiconductor device having improved reliability can be provided.

BRIEF DESCRIPTION OF THE DRAWINGS

FIG. 42 is another fragmentary cross-sectional view of the semiconductor device of Fourth Modification Example.

DETAILED DESCRIPTION

Figure 1:
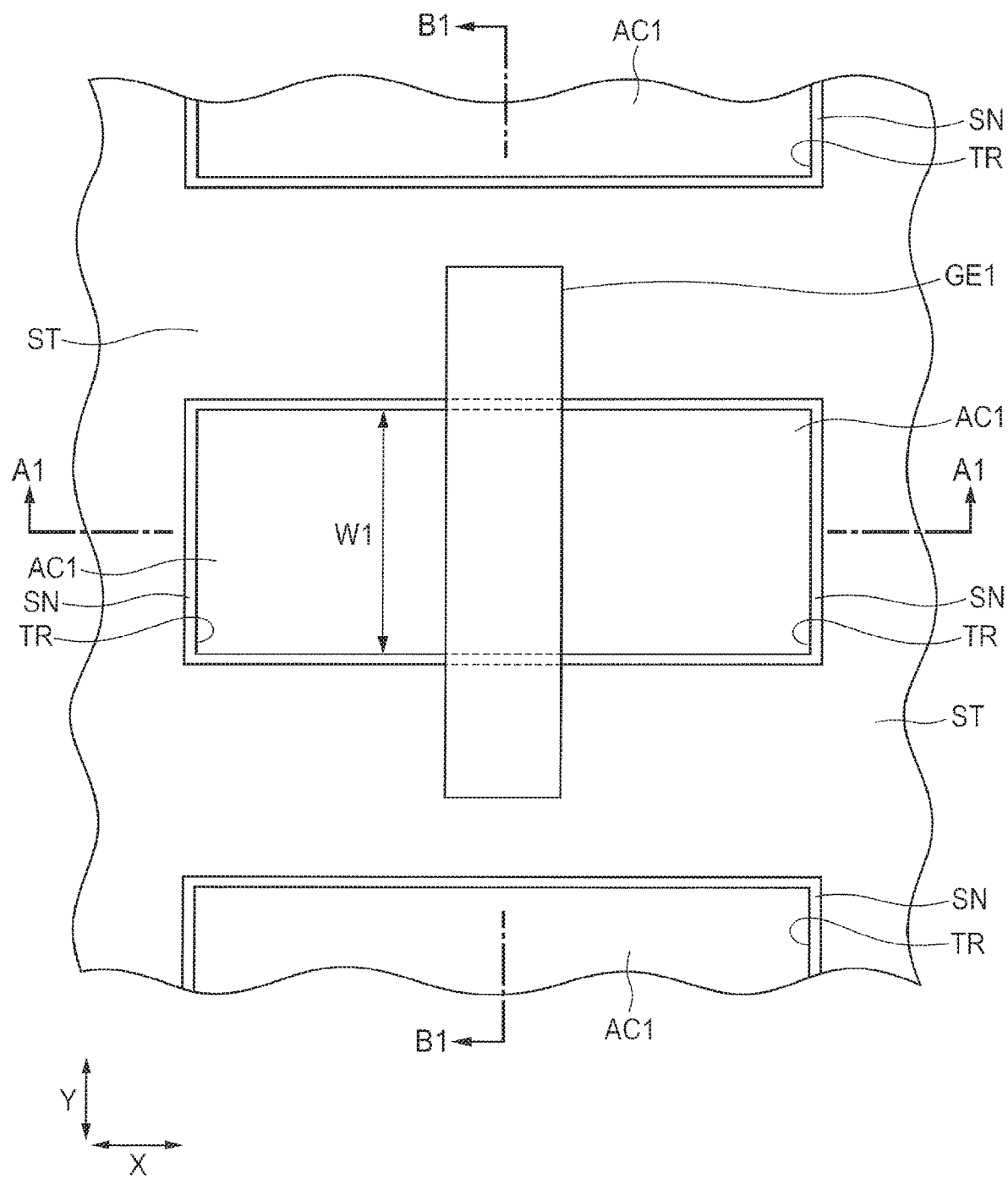
FIG. 1 is a fragmentary plan view of a semiconductor device according to First Embodiment.

In the following embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one. In the following embodiments, when a reference is made to the number (including the number, value, amount, range, or the like) of a component, the number is not limited to a specific number but may be more or less than the specific number, unless otherwise particularly specified or principally apparent that the number is limited to the specific number. Further, in the following embodiments, it is needless to say that the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number, range, or the like.

An embodiment will hereinafter be described in detail based on drawings. In all the drawings for describing the embodiment, members having the same function will be identified by the same reference numerals and overlapping descriptions will be omitted. In the following embodiments, a description on the same or similar portion is not repeated in principle unless otherwise particularly necessary.

In the drawings to be used in the following embodiment, even a cross-sectional view is sometimes not hatched to make it easier to understand. On the other hand, even a plan view is sometimes hatched to make it easier to understand.

(First Embodiment)
<Structure of Semiconductor Device>

Figure 2:
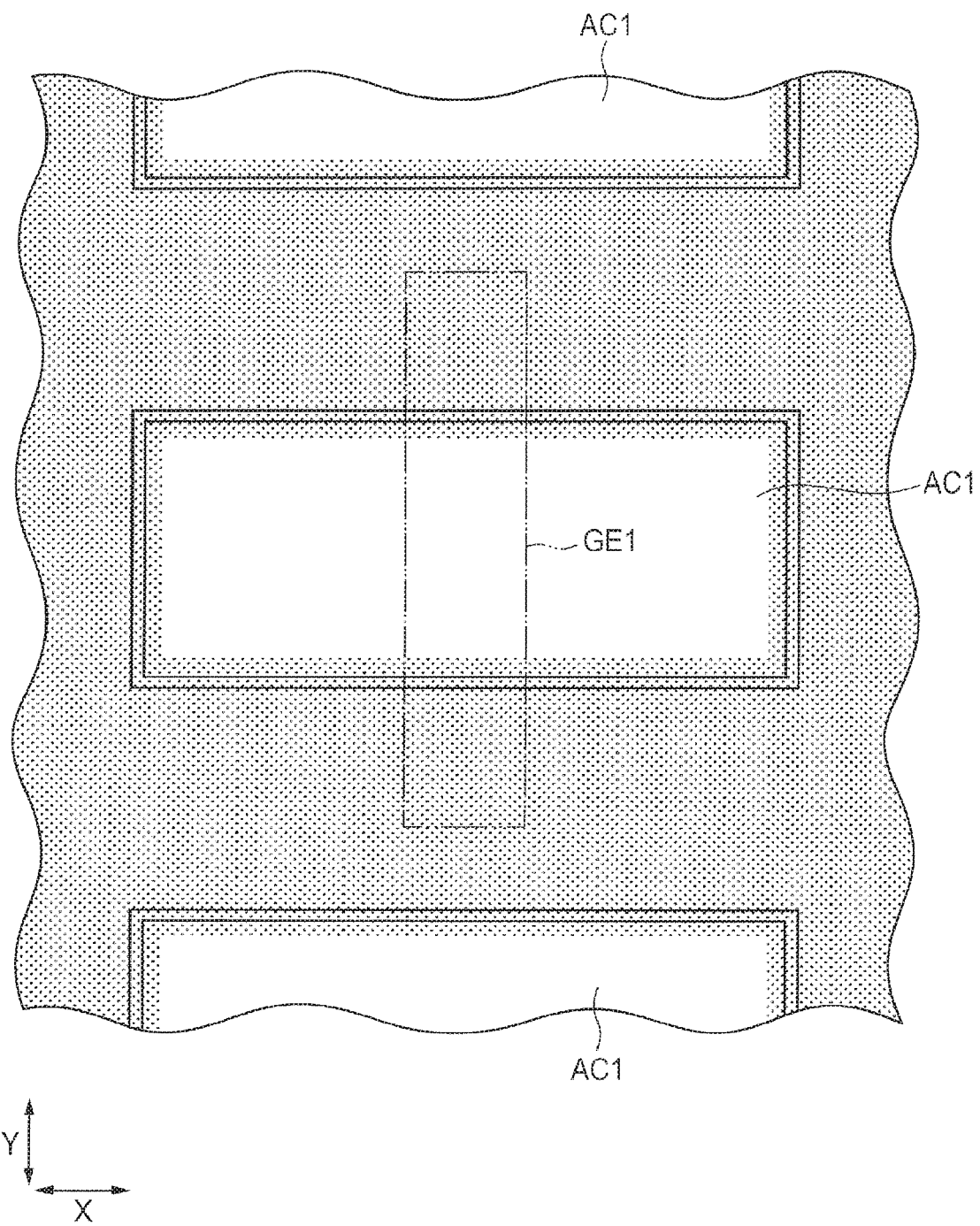
FIG. 2 is another fragmentary plan view of the semiconductor device according to First. Embodiment.
Figure 3:
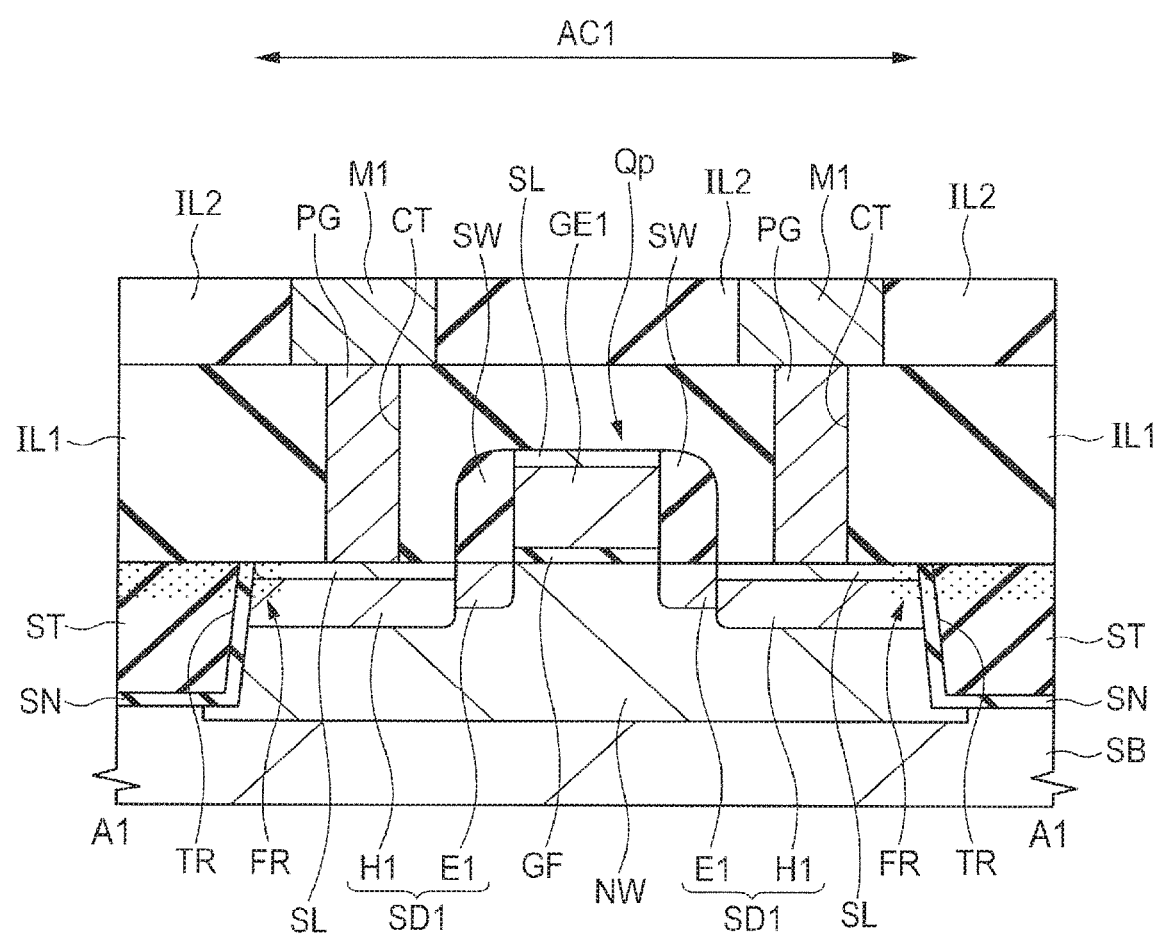
FIG. 3 is a fragmentary cross-sectional view of the semiconductor device according to First Embodiment.
Figure 4:
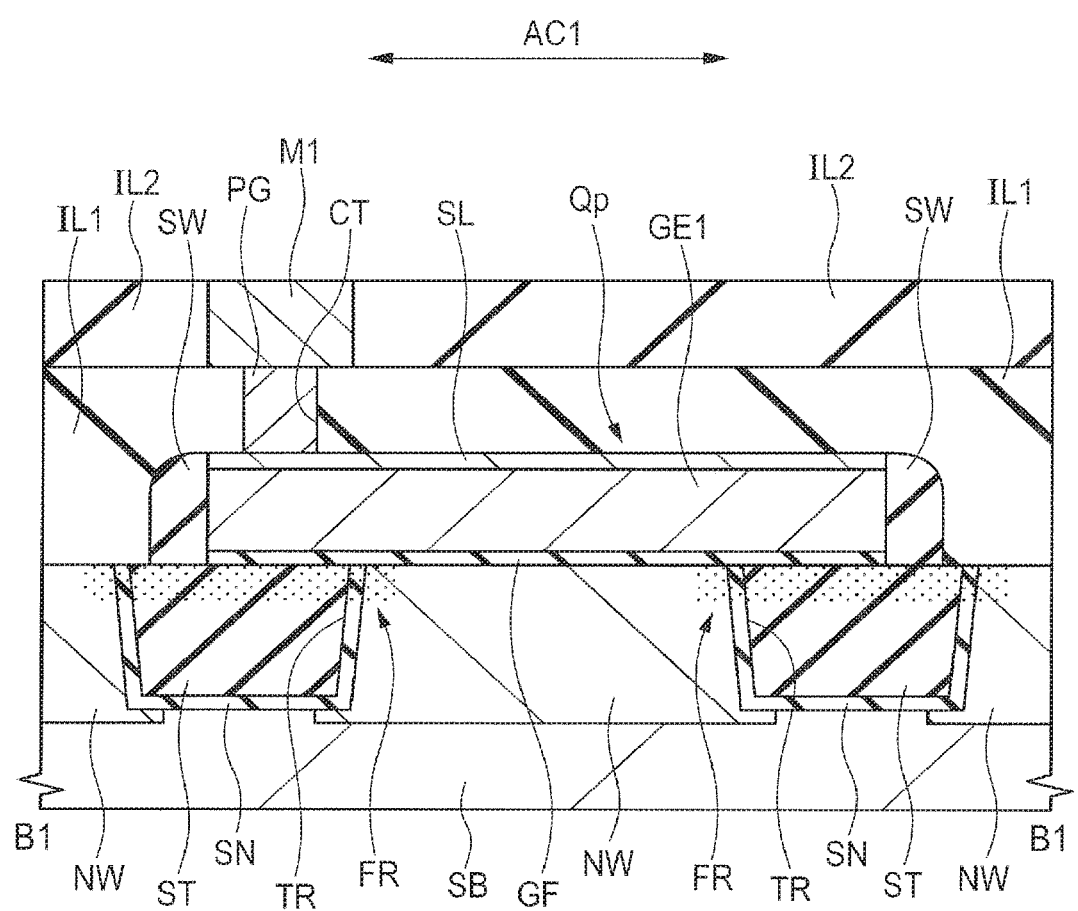
FIG. 4 is another fragmentary cross-sectional view of the semiconductor device of First Embodiment.

The semiconductor device of the present embodiment will be described referring to some drawings. FIGS. 1 and 2 are fragmentary plan views of the semiconductor device of the present embodiment. FIGS. 3 and 4 are fragmentary cross-sectional views of the semiconductor device of the present embodiment. The cross-sectional view taken along the line A1-A1 of FIG. 1 nearly corresponds to FIG. 3, while the cross-sectional view taken along the line B1-B1 of FIG. 2 nearly corresponds to FIG. 4. FIGS. 1 and 2 show the same plane region, but in FIG. 2, a fluorine implanted region (FR) is hatched with dots and the position of a gate electrode GE1 is shown by a two-dot chain line. The direction X shown in FIGS. 1 and 2 corresponds to a gate length direction of the gate electrode GE1 so that it corresponds to a channel length direction of a channel region formed below the gate electrode GE1. The direction Y shown in FIGS. 1 and 2 corresponds to a gates width direction of the gate electrode GE1 so that it corresponds to a channel width direction of a channel region formed below the gate electrode GE1. FIG. 3 is a cross-sectional view along the direction X and FIG. 4 is a cross-sectional view along the direction Y. In FIG. 1, the gate width W1 of the gate electrode GE1 is indicated by W1.

The semiconductor device of the present embodiment has an STI (shallow trench isolation) type element isolation region and an MISFET (metal insulator semiconductor field effect transistor).

The structure of the semiconductor device of the present embodiment will hereinafter be described specifically referring to FIGS. 1 to 4.

As shown in FIGS. 1 to 4, a semiconductor substrate SB has an MISFET on the main surface thereof.

The semiconductor substrate made of, for example, p type single crystal silicon having specific resistance of from about 1 to 10 Ωcm has active regions AC1 defined by an element isolation region ST made of an insulator. In plan view, the active regions AC1 are each surrounded by the element isolation region ST. This means that the active region AC1 corresponds to a plane region not having the element isolation region ST therein and having a periphery surrounded by the element isolation region ST.

The semiconductor substrate SB in the active region AC1 has a MISFET, more specifically, a p channel MISFETQp. Described specifically, the semiconductor substrate SB in the active region AC1 has therein an n well NW and the n well NW has, on the surface thereof, a gate electrode GE1 of the p channel MISFETQp via an insulating film GF functioning as a gate insulating film, of the p channel MISFETQp.

The gate electrode GE1 is made of a conductive film. For example, the gate electrode GE1 may be obtained as a silicon gate electrode by forming the electrode GE1 from a polysilicon film. In this case, the polysilicon film preferably has a resistance reduced by introducing therein an impurity. The insulating film GF is made of, for example, a thin silicon oxide film.

The gate electrode GE1 has, on the side wall thereof, a sidewall spacer SW made of an insulating film. The sidewall spacer SW can be regarded as a sidewall insulating film.

The n well NW has therein a source/drain region (semiconductor region for source or drain) SD1 having an LDD (lightly doped drain) structure for the p channel MISFETQp. This means that in the n well NW, the gate electrode GE1 has on both sides of the gate electrode GE1 (both sides in the gate length direction) the source/drain region SD1. The source/drain region SD1 is comprised of a $p^-$ type semiconductor region (extension region) E1 and a $p^+$ type semiconductor region H1 having a higher impurity concentration. The $p^+$ type semiconductor region H1 has a junction depth deeper and an impurity concentration higher than those of the $p^-$ type semiconductor region E1. The $p^-$ type semiconductor region E1 having a lower concentration lies below the sidewall spacer SW so as to be adjacent to a channel region (substrate region immediately below the gate electrode GE1) of the p channel MISFETQp, while the $p^+$ type semiconductor region H1 having a higher concentration lies so as to be adjacent to the $p^-$ type semiconductor region E1 having a lower concentration and separated from the channel region of the p channel MISFETQp by a distance corresponding to the $p^-$ type semiconductor region E1.

The channel region (channel formation region) of the MISFETQp lies, in the semiconductor substrate SB (n well NW) in the active region AC1, below the insulating film GF below the gate electrode GE1. This means that the channel region of the MISFETQp is formed in a portion of the semiconductor substrate (SB) facing to the gate electrode GE1 via the insulating film GF.

The MISFETQp (including the gate insulating film (insulating film GF), the gate electrode GE1, and the source/drain region SD1 configuring the MISFETQp) lies in the active region AC1 defined (surrounded) by the element isolation region ST. A portion of the gate electrode GE1 however extends also over the element isolation region ST (the element isolation region ST surrounding the active region AC1).

In FIG. 4, a portion of the gate electrode GE1 extends over the element isolation region ST and the element isolation region ST and the gate electrode GE1 have therebetween the insulating film GF. When the insulating film GF is formed by thermal oxidation, however, the element isolation region ST and the gate electrode GE do not have therebetween the insulating film GE and the element isolation region ST has the gate electrode GE1 directly thereon.

The $p^+$ type semiconductor region or the gate electrode GE1 has thereon a metal silicide layer SL formed by salicide (self aligned silicide) technology or the like. The metal silicide layer SL is made of, for example, a cobalt silicide layer, a nickel silicide layer, or a platinum-added nickel silicide layer. The metal silicide layer SL contributes to reduction in diffusion resistance or contact resistance.

The semiconductor substrate SB has thereon an interlayer insulating film IL1 as an insulating film so as to cover the gate electrode GE1 and the sidewall spacer SW. The interlayer insulating film IL1 is made of a single silicon oxide film or a stacked film comprised of a silicon nitride film and a silicon oxide film formed on the silicon nitride film with a thickness greater than that of the silicon nitride film. The interlayer insulating film IL1 has a planarized upper surface.

The interlayer insulating film IL1 has a contact hole (opening portion, through-hole) CT and the contact hole CT has therein a conductive plug (contact plug) PG as a conductor portion for coupling.

The plug PG is comprised of a thin barrier conductor film formed on the bottom portion and side wall (side surface) of the contact hole CT and a main conductor film formed on this barrier conductor film to fill the contact hole CT. To simplify the drawings, in FIGS. 3 and 4, the barrier conductor film and the main conductor film configuring the plug PG are shown as one film. The barrier conductor film configuring the plug PG may be, for example, a titanium film, a titanium nitride film, or a stacked film of them, while the main conductor film configuring the plug PG may be a tungsten film.

The contact hole CT and the plug PG buried therein are formed over the $p^+$ type semiconductor region H1, the gate electrode GE1, and the like. The plug PG placed on the $p^+$ type semiconductor region H1 is electrically coupled to this $p^+$ type semiconductor region H1 and the plug PG placed over the gate electrode GE1 is electrically coupled to this gate electrode GE1.

The interlayer insulating film IL1 having the plug PG buried therein has a wiring M1 on the film. The wiring M1 is, for example, a damascene wiring (buried wiring) and it is buried in a wiring trench provided in the insulating film IL2 formed on the interlayer insulating film IL1.

The wiring M1 has thereover another wiring and another insulating film, but illustration and description on them are omitted here. The wiring M1 and wirings thereover can be formed not only as damascene wiring buried wiring) but also formed by patterning a wiring conductor film. For example, a tungsten wiring, aluminum wiring, or the like can be used.

The element isolation region (STI insulating film, STI isolation film) ST is formed by STI (shallow trench isolation). STI is a method of forming a trench (element isolation trench) in the main surface of a semiconductor substrate and then filling the trench with an insulating film. The element isolation region ST is therefore comprised of an insulating film buried in a trench (element isolation trench) TR formed in the semiconductor substrate SB. The insulating film buried in the trench TR is, more specifically, a silicon oxide film so that the element isolation region ST is comprised of a silicon oxide film buried in the trench TR formed in the semiconductor substrate SB.

The trench TB in the semiconductor substrate SB has a nitrided inner surface (side surface and bottom surface). This means that the semiconductor substrate SB configuring the inner surface of the trench TR has a nitrided surface and it has, on the surface thereof, a nitride layer (nitride film) SN. The nitride layer SN is therefore adjacent to the side surface and bottom surface of the element isolation region ST (silicon oxide film buried in the trench TB). The nitride layer SN is formed by, prior to filling the trench TR with a silicon oxide film, nitriding the surface (exposed surface) of the semiconductor substrate SB exposed from the inner surface of the trench TR. When the semiconductor substrate SB is a silicon substrate, the nitride layer SN is made of silicon nitride. The nitride layer SN is preferably formed on the entirety of the inner surface (side surface and bottom surface) of the trench TR.

The semiconductor substrate SB including the element isolation region ST has, in the surface layer thereof, fluorine (F) implanted. The fluorine (F) implanted region (which will hereinafter be called "fluorine implanted region FR") is hatched with dots in FIGS. 2 to 4. Fluorine (F) implanted in the surface layer portion of the semiconductor substrate SB is, in plan view, not implanted in the entirety of the active region AC1 but implanted into the vicinity of a boundary between the active region AC1 and the element isolation region ST (meaning the outer peripheral portion of the active region AC1). Fluorine (F) is also implanted into the surface layer portion of the element isolation region ST. With respect to the implantation in the element isolation region ST, it may be implanted, in plan view, only into the vicinity of a boundary between the active region AC1 and the element region ST or may be implanted into the entirety of the element, isolation region ST. Due to the presence of the nitride layer SN between the element isolation region ST and the semiconductor substrate SB in the active region AC1, fluorine (F) is also implanted into an upper portion of the nitride layer SN present between the element isolation region ST and the semiconductor substrate SB in the active region AC1.

Although details will be described later, fluorine (F) is implanted in order to suppress or prevent deterioration of deterioration in NBTI characteristics attributable to the nitride layer SN. It is important that in a region overlapping with the gate electrode GE1 in plan view, fluorine (F) is introduced (implanted) into the vicinity of a boundary between the element isolation region ST and the channel region (channel region of the MISFETQp). The fluorine implanted region FR may therefore be formed not only in a region hatched with dots in FIG. 2 but may be formed in a region shown later in FIG. 25.

<Manufacturing Steps of Semiconductor Device>

Next, manufacturing steps of the semiconductor device of the present embodiment will be described.

FIGS. 5 to 21 are fragmentary cross-sectional views or fragmentary plan views of the semiconductor device of the present embodiment during manufacturing steps thereof. Of these, FIG. 15 is a fragmentary plan view and FIGS. 5 to 14 and FIGS. 16 to 21 are fragmentary cross-sectional views. FIGS. 11, 13, 16, 18, and 20 show a cross-section corresponding to FIG. 3, that is, a cross-section at a position corresponding to the line A1-A1 in FIG. 1; and FIGS. 5 to 10, 12, 14, 17, 19, and 21 show a cross-section corresponding to FIG. 4, that is, a cross-section at a position corresponding to the line B1-B1 in FIG. 1. FIG. 15 is a plan view but to facilitate understanding of it, a photoresist pattern is hatched with oblique lines.

Figure 5:
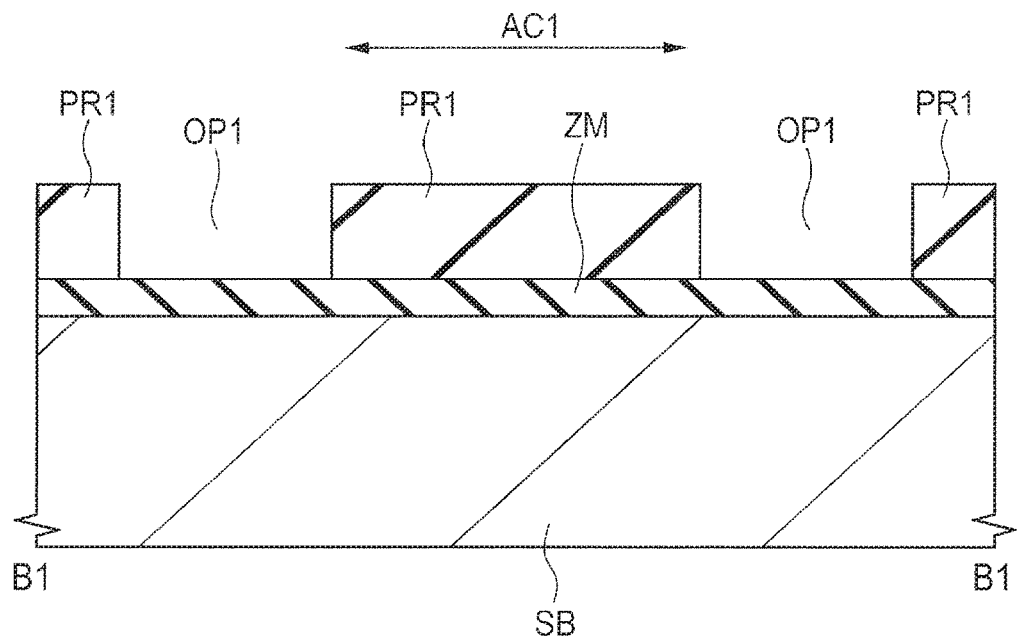
FIG. 5 is a fragmentary cross-sectional view of the semiconductor device according to First Embodiment during a manufacturing step thereof.

As shown in FIG. 5, a semiconductor substrate (semiconductor wafer) SB composed of, for example, p type single crystal silicon having a specific resistance of from about 1 to 10 Ωcm is provided (prepared).

Next, an insulating film ZM is formed on the main surface (entire main surface) of the semiconductor substrate SB. The insulating film ZM is made of, for example, a silicon nitride film and can be formed, for example, using CVD (chemical vapor deposition) (for example, thermal CVD). After oxidizing the surface of the semiconductor substrate SB to form an oxide film, a silicon nitride film may be formed as the insulating film ZM on the resulting oxide film by CVD.

Next, a photoresist layer is applied onto the main surface (entire main surface) of the semiconductor substrate SB, that is, onto the insulating film ZM and then the resulting photoresist layer is exposed and developed to form a photoresist pattern (resist pattern, resist layer, mask layer) PR1 as a mask layer as shown in FIG. 5. The photoresist pattern PR1 has an opening portion OP1 in a trench TR formation region.

Figure 6:
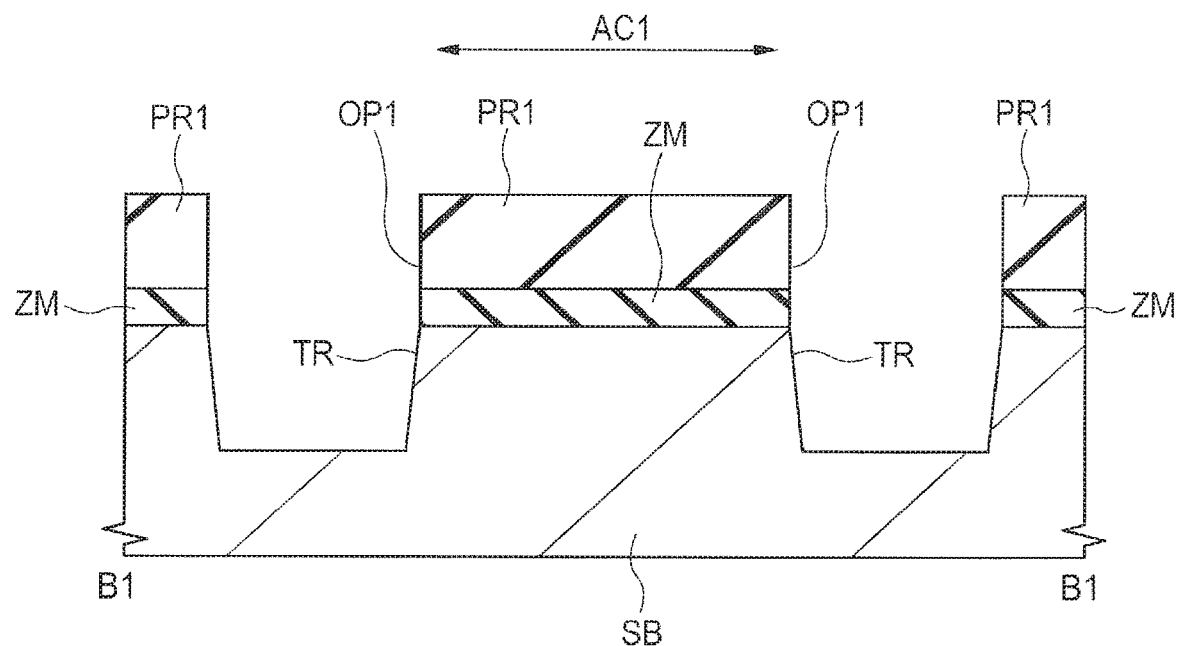
FIG. 6 is a fragmentary cross-sectional view of the semiconductor device during a manufacturing step following that of FIG. 5.

Next, with the photoresist pattern PR1 as an etching mask, the insulating film ZM and the semiconductor substrate SB are dry etched successively to form a trench TR in the semiconductor substrate SB in a region where an element isolation region ST is to be formed, as shown in FIG. 6. The trench TR is an element isolation trench, that is, a trench for the formation of the element isolation region ST.

The trench TR extends in the an film ZM and the semiconductor substrate SB. This means that the trench TR goes through the insulating film ZM and the bottom portion of the trench TR reaches the middle of the thickness of the semiconductor substrate SB. The depth of the trench TR in the semiconductor substrate SB (depth from the surface of the semiconductor substrate SB to the bottom surface of the trench TR) is, for example, from about 300 to 700 nm. After formation of the trench TR, the photoresist pattern PR1 is removed.

Figure 7:
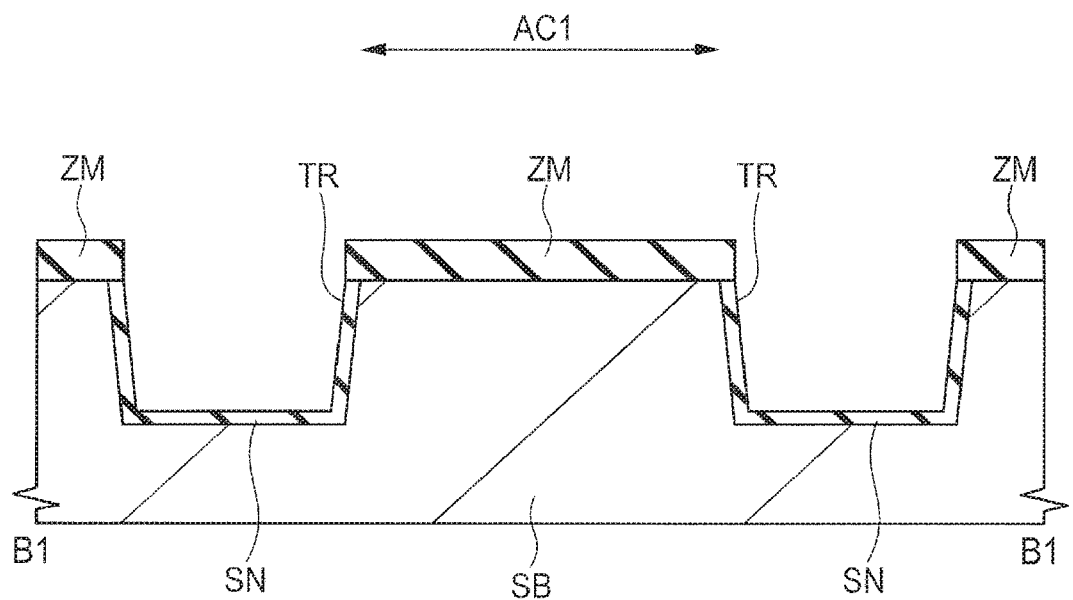
FIG. 7 is a fragmentary cross-sectional view of the semiconductor device during a manufacturing step following that of FIG. 6.

Next, as shown in FIG. 7, the surface (exposed surface) of the semiconductor substrate SB exposed on the inner surface (side surface and bottom surface) of the trench TR is nitrided. This nitriding treatment of the semiconductor substrate SB can be achieved, for example, by nitrogen annealing, more specifically, heat treatment in a nitrogen atmosphere.

By this nitriding treatment, the inner surface (side surface and bottom surface) of the trench TR in the semiconductor substrate SB is nitrided. This means that the surface (exposed surface) of the semiconductor substrate SB configuring the inner surface of the trench TR is nitrided and a nitride layer (nitride film) SN is formed as shown in FIG. 7. When the semiconductor substrate SB is a silicon substrate, the nitride layer SN is made of silicon nitride. The nitride layer SN is formed on the entire inner surface (side surface and bottom surface) of the trench TR. The thickness of the nitride layer SN can be set at, for example, from about 0.1 to 1.0 nm. Since the upper surface of the semiconductor substrate SB outside the trench TR is covered with the insulating film ZM, it can be prevented from being nitrided by this nitriding treatment.

Instead of nitriding the inner surface of the trench TR to form the nitride layer SN, a silicon nitride film may be deposited on the inner surface of the trench TR by using CVD or the like, but in order to prevent oxidation and expansion thereby of the element isolation region ST which will be formed later, it is preferred not to deposit a silicon nitride film by CVD or the like but to nitride the inner surface of the trench TR to form the nitride layer SN. In addition, with the miniaturization of semiconductor devices, the width of the trench TR decreases. In such a case, a silicon nitride film cannot be formed on the inner surface of the trench TR successfully by depositing the silicon nitride film on the inner surface of the trench TR by using CVD or the like instead of nitriding the inner surface of the trench TR to form the nitride layer SN. In the present embodiment, therefore, the nitride layer SN is formed by nitriding the inner surface of the trench TR.

Figure 8:
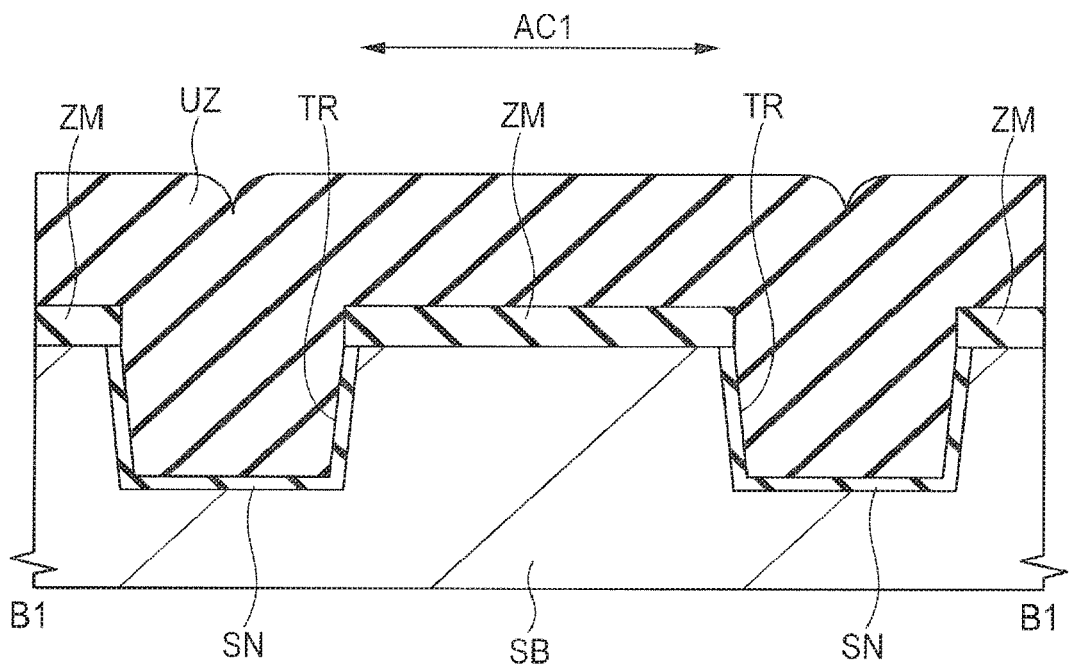
FIG. 8 is a fragmentary cross-sectional view of the semiconductor device during a manufacturing step following that of FIG. 7.

Next, as shown in FIG. 8, an insulating film UZ is formed (deposited) on the main surface (entire main surface) of the semiconductor substrate SB, that is, on the insulating film ZM so as to fill the trench TR. The insulating film UZ is preferably made of a silicon oxide film and can be formed, for example, by CVD. As a formation method of the insulating film UZ, plasma CVD is suited and HDP (high density plasma)-CVD is particularly suited. The insulating film UZ is formed so as to be thick enough to fill the trench TR.

Figure 9:
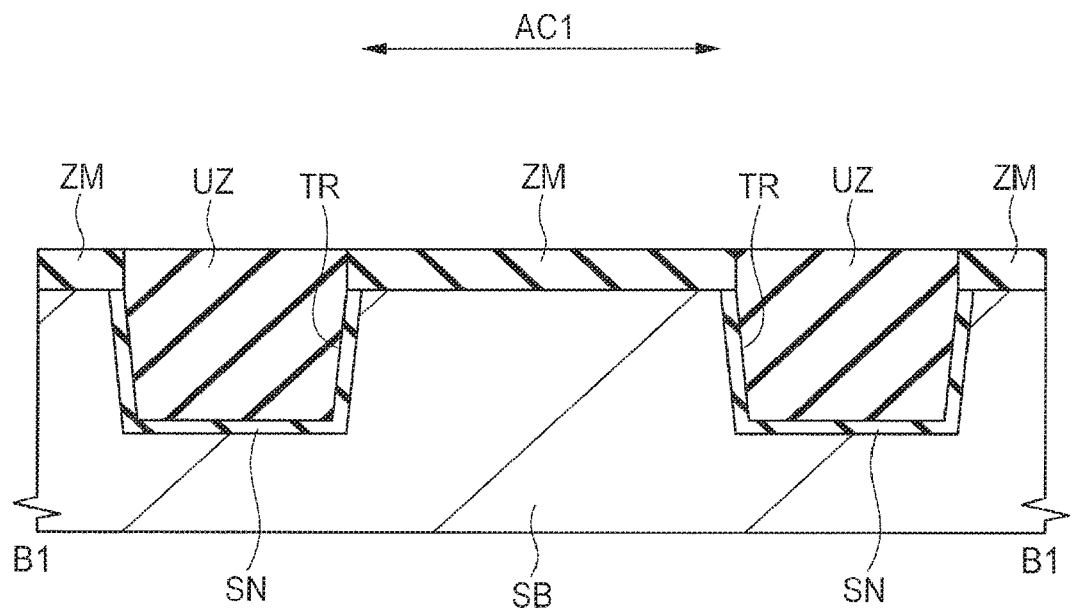
FIG. 9 is a fragmentary cross-sectional views of the semiconductor device during a manufacturing step following that of FIG. 8.

Next, the insulating film UZ is polished by CMP (chemical mechanical polishing). By this polishing, as shown in FIG. 9, the insulating film UZ outside the trench TR is removed and the insulting film UZ is left in the trench TR.

After completion of this CMP treatment, the upper surface of the insulating film ZN is exposed and the upper surface of the insulating film UZ remaining in the trench TR has a height almost equal to that of the upper surface of the insulating film ZM. This CMP treatment performed under conditions under which the polishing rate of the insulating film ZM (silicon nitride film) is smaller than that of the insulating film UZ (silicon oxide film) enables the insulating film ZM to function as a stopper film (or protective film) for the CMP treatment.

Figure 10:
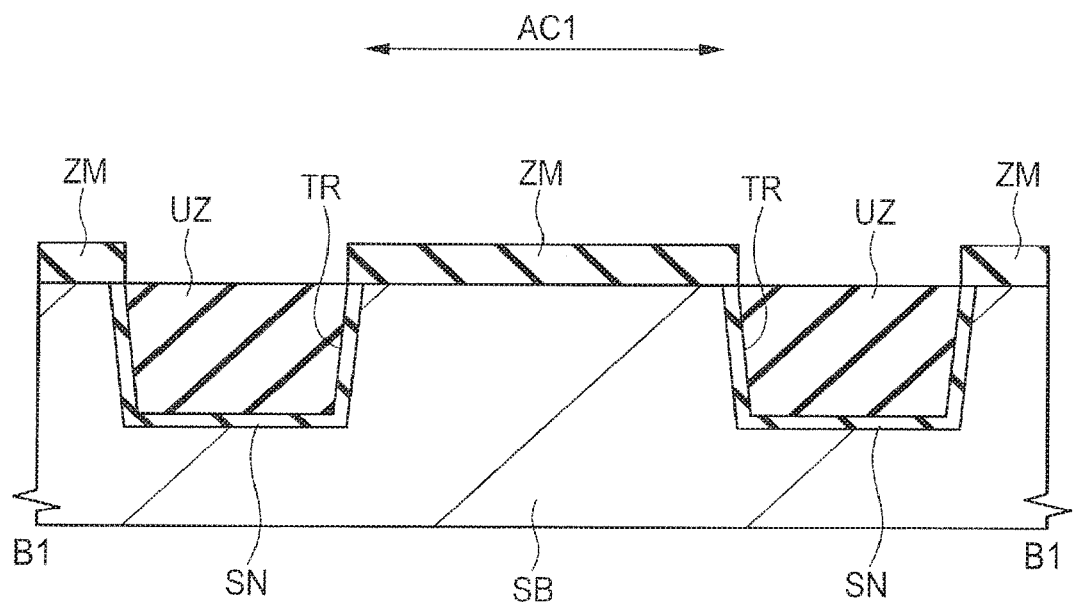
FIG. 10 is a fragmentary cross-sectional view of the semiconductor device during a manufacturing step following that of FIG. 9.

Next, as shown in FIG. 10, an upper portion (upper surface) of the insulating film UZ in the trench TR is etched back by dry etching to retract the upper surface of the insulating film UZ in the trench TR.

This etching is performed preferably under etching conditions under which an etching rate of the insulating film ZM (silicon nitride film) becomes smaller than that of the insulating film UZ (silicon oxide film). Although the height of the upper surface of the insulating film UZ in the trench TR is almost equal to that of the upper surface of the insulating film ZM before this etching (at the stage of FIG. 9), the height Of the upper surface of the insulating film UZ in the trench TR becomes lower than that of the upper surface of the insulating film ZM after this etching (at the stage of FIG. 10). It is however preferred to terminate the dry etching before the height of the upper surface of the insulating film UZ in the trench TR becomes lower than the height of the upper surface (here, the interface between the semiconductor substrate SB and the insulating film ZN) of the semiconductor substrate SB. After completion of the dry etching (at the stage of FIG. 10), the height of the upper surface of the insulating film UZ in the trench TR is almost equal to or slightly higher than the height of the upper surface of the semiconductor substrate SB.

Figure 11:
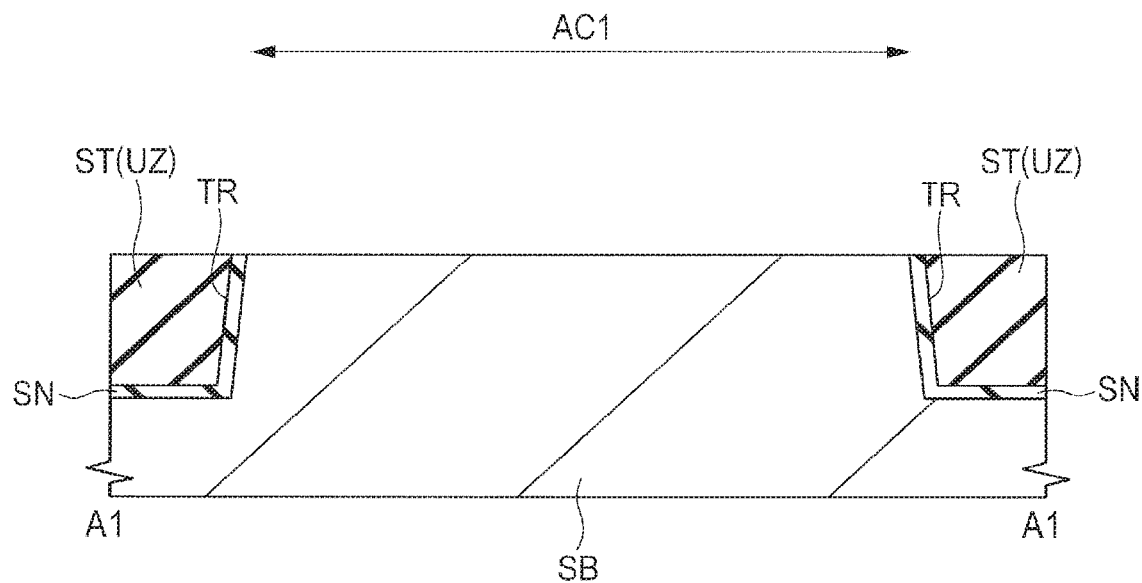
FIG. 11 is a fragmentary cross-sectional view of the semiconductor device during a manufacturing step following that of FIG. 10.
Figure 12:
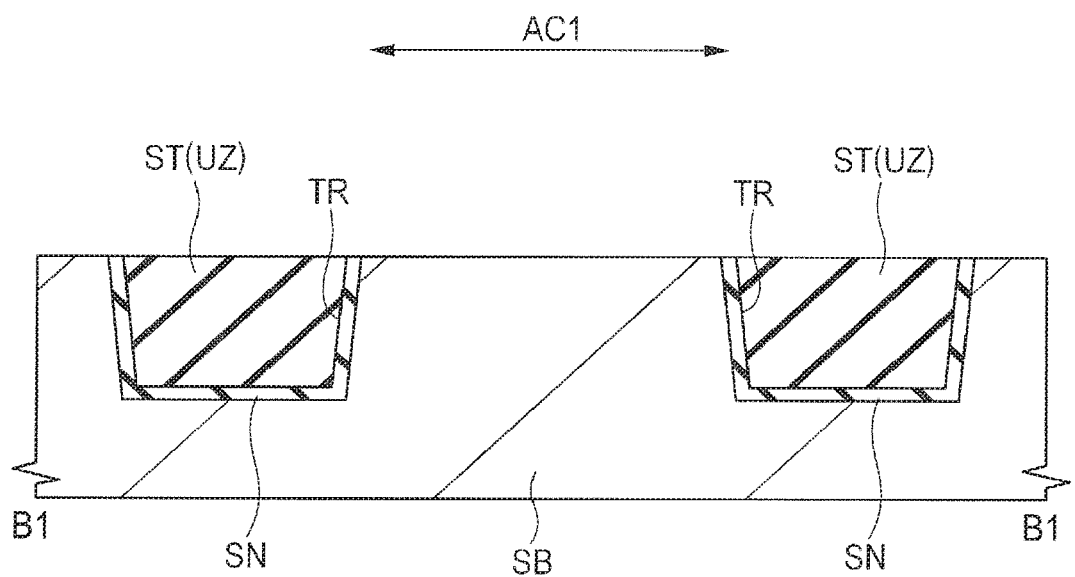
FIG. 12 is a fragmentary cross-sectional view of the semiconductor device during a manufacturing step similar to that of FIG. 11.

As shown in FIGS. 11 and 12, the insulating film ZM is removed by wet etching. This wet etching is performed preferably under the conditions under which an etching rate of the insulating film UZ (silicon oxide film) becomes smaller than the etching rate of the insulating film ZM (silicon nitride film). This wet etching can then selectively remove the insulating film ZM. When a silicon oxide film is formed on the upper surface of the semiconductor substrate SB prior to the formation of the insulating film ZM (silicon nitride film) in FIG. 5, after removal of the insulating film ZM by this wet etching, the silicon oxide film (silicon oxide film below the insulating film ZM) may be removed. By this removal, the upper surface (surface, Si surface) of the semiconductor substrate SB is exposed.

In the case described here, after formation of the insulating film UZ as shown in FIG. 8, the insulating film UZ is polished using CMP to obtain the structure shown in FIG. 9 and then, the structure shown in FIGS. 11 and 12 is obtained by etching back the insulating film UZ and then, removing the insulating film ZM. As another mode, after formation of the insulating film UZ as shown in FIG. 8, the insulating film ZM can be polished and removed when the insulating film UZ is polished using CMP. In this case, when the CMP step completed, not the structure shown in FIG. 9 but the structure shown in FIGS. 11 and 12 can be obtained.

As shown in FIGS. 11 and 12, the element isolation region ST comprised of the insulating film UZ buried in the trench TR of the semiconductor substrate SB is formed in such a manner. Thus, the element isolation region ST is formed by STI (shallow trench isolation). The nitride layer SN is formed by nitriding the inner surface of the trench TR in the semiconductor substrate SB in the step shown in FIG. 7 so that the side surface and the bottom surface of the element isolation region ST are contiguous to the nitride layer SN. This means that the side surface and bottom surface of the element isolation region ST is covered with the nitride layer SN. As a result of the formation of the element isolation region ST, the active region (AC1) is defined (partitioned) by the element isolation region ST in the semiconductor substrate SB and various semiconductor elements (MISFETQp, here) will be formed in this active region (AC1) by steps performed later.

What is important in the element isolation region ST formation step is that the element isolation region ST is formed by forming an element isolation trench (TR) in the semiconductor substrate SB in advance, nitriding the inner surface of the element isolation trench (TR), and filling the element isolation trench (TR) with an insulating film (preferably, a silicon oxide film).

Figure 13:
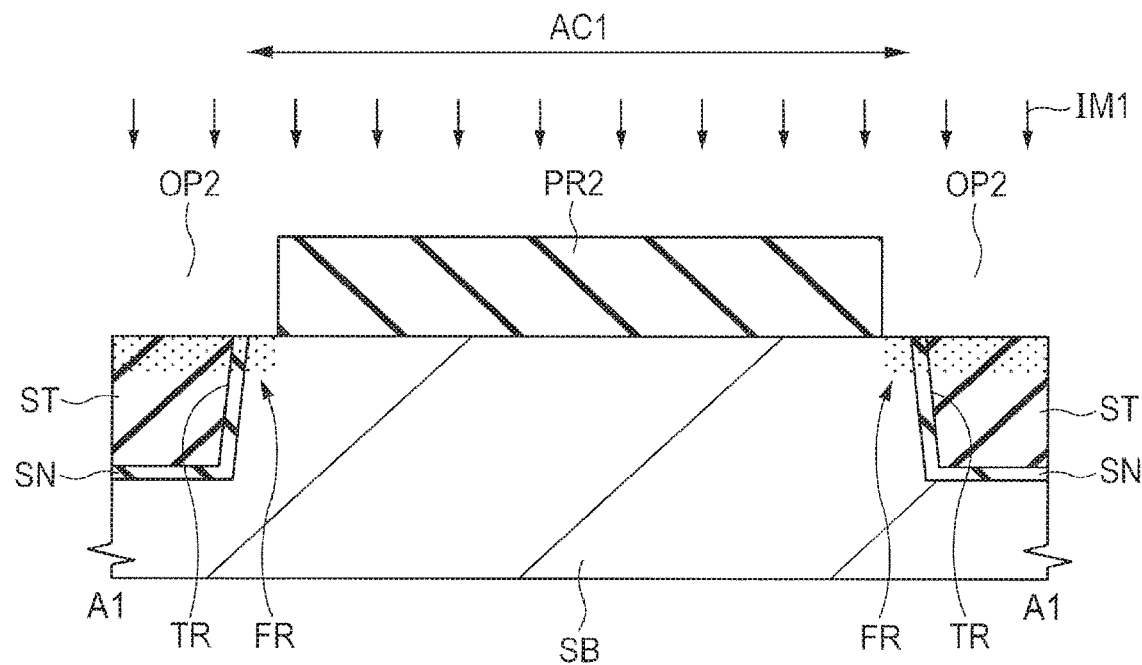
FIG. 13 is a fragmentary cross-sectional view of the semiconductor device during a manufacturing step following that of FIG. 11.
Figure 14:
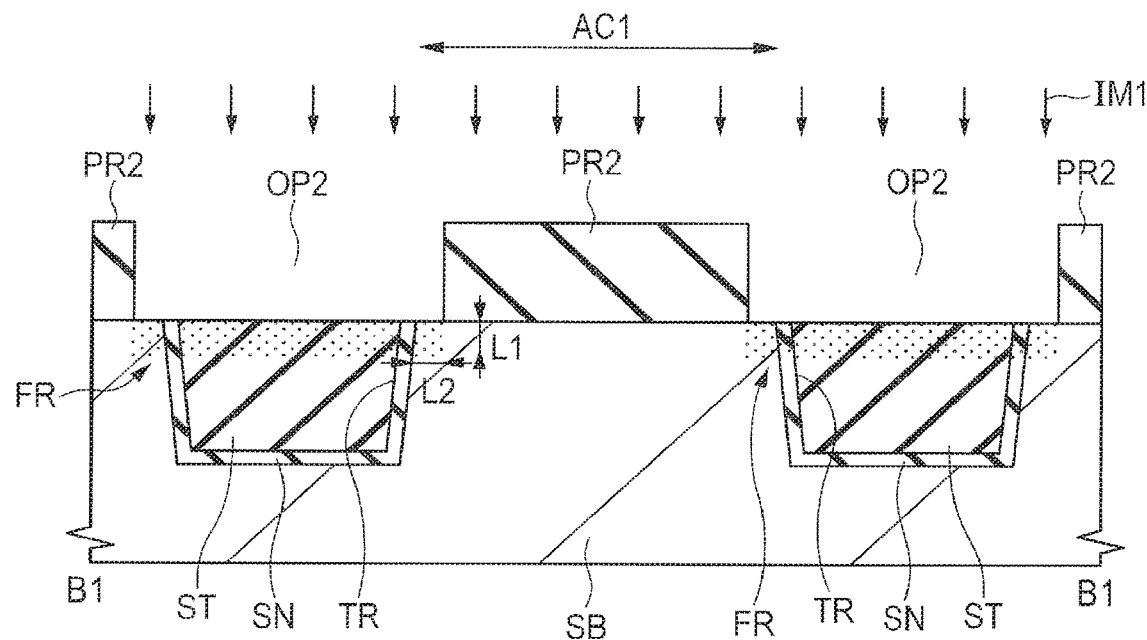
FIG. 14 is a fragmentary cross-sectional view of the semiconductor device during a manufacturing step similar to that of FIG. 13.
Figure 15:
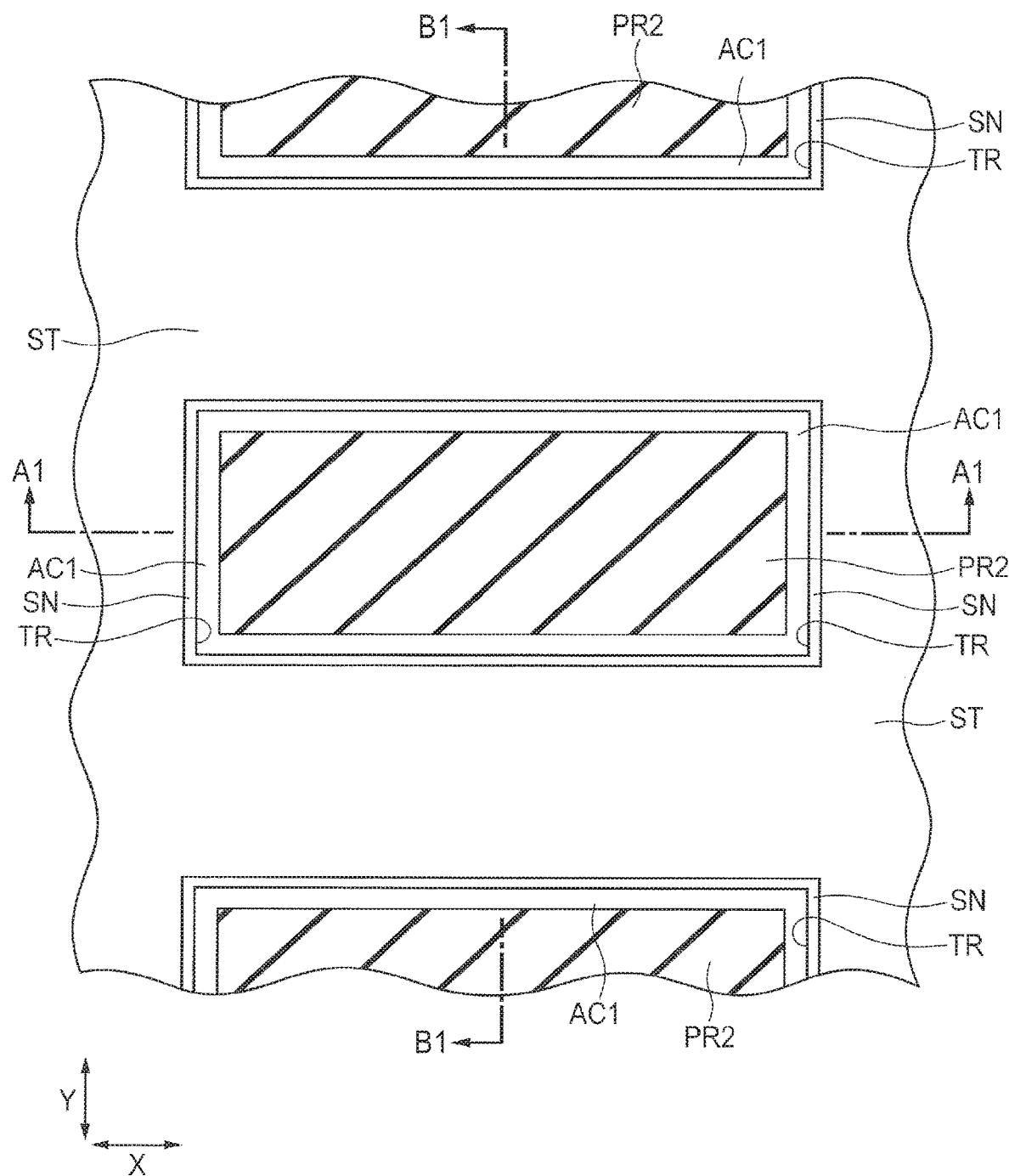
FIG. 15 is a fragmentary plan view of the semiconductor device during a manufacturing step similar to that of FIG. 13.

Next, after application of a photoresist layer onto the main surface (entire main surface) of the semiconductor substrate SB, the photoresist layer is exposed and developed to form a photoresist pattern (resist pattern, resist layer, mask layer) PR2 as shown in FIGS. 13 to 15. FIG. 15 is a plan view just after formation of the photoresist pattern PR2. The opening portion OP2 of the photoresist pattern PR2 has planar shape and size slightly greater than those of the opening portion OP1 of the photoresist pattern PR1. The opening portion OP2 of the photoresist pattern PR2 therefore includes, in plan view, the element isolation region ST and it has planar shape and size slightly greater than those of the element isolation region ST. From another viewpoint, the photoresist pattern PR2 covers the active region AC1, but in plan view, the photoresist pattern PR2 is included an she active region AC1 and has planar shape and size slightly smaller than those of the active region AC1. The element isolation region ST, the nitride layer SN, and the outer peripheral portion of the active region AC1 are therefore exposed from the opening portion OP2 of the photoresist pattern PR2.

Next, with the photoresist pattern PR2 as an ion implantation preventive mask (mask layer), fluorine (F) is ion-implanted into the semiconductor substrate SB (including the element isolation region ST). This ion implantation will hereinafter be called. "ion implantation IM1" and in FIGS. 13 and 14, ion implantation IM1 is schematically shown by an arrow.

By this ion implantation IM1, fluorine (F) is ion-implanted into the semiconductor substrate SB exposed from the opening portion OP2 of the photoresist pattern PR2. By this ion implantation IM1, fluorine (F) is ion-implanted into the surface layer portion of the element isolation region. ST exposed from the opening portion OP2 of the photoresist pattern PR2 and an upper portion of the nitride layer SN exposed from the opening portion OP2 of the photoresist pattern PR2. In addition, by the ion implantation IM1, fluorine (F) is ion-implanted also into an upper portion of a substrate region (the semiconductor substrate SB at the outer periphery of the active region AC1) adjacent to the nitride layer SN. In FIGS. 13 and 14, a fluorine implanted region FR, a region in which fluorine (F) has been implanted is hatched with dots. After the ion implantation IM1, the photoresist pattern PR2 is removed.

When viewed in the depth direction (direction substantially perpendicular to the main surface of the semiconductor substrate SB), fluorine (F) is ion-implanted into a region within depth L1 (implantation depth) from the main surface of the semiconductor substrate SB. The implantation depth of fluorine (F) can be set at, for example, from about 10 to 500 nm. This means that the depth position of the bottom surface (lower surface) of the fluorine implanted region FR can be set at from about 10 to 500 nm from the main surface of the semiconductor substrate SB. In the main surface of the semiconductor substrate SB, a distance (interval) L2 from the interface between the nitride layer SN and the substrate region to the end portion of the fluorine implanted region FR on the side of the active region AC1 can be set at, for example, from about 10 to 500 nm. This means that in the semiconductor substrate SB in the active region AC1, fluorine (F) is implanted into a region within the distance (interval) L2 from the nitride layer SN and fluorine (F) is not implanted into a region distant from the distance (interval) L2 or more from the nitride layer SN. The distance L2 is a distance (interval) in a direction parallel to the main surface of the semiconductor substrate SB. The concentration of the fluorine (F) thus implanted can be set at, for example, from about $1 \times 10^{18}$ to $1 \times 10^{21}/cm^3$.

The term "substrate region" as used herein corresponds to a portion of the semiconductor substrate SB, more specifically, a region made of single crystal silicon configuring the semiconductor substrate SB.

Figure 16:
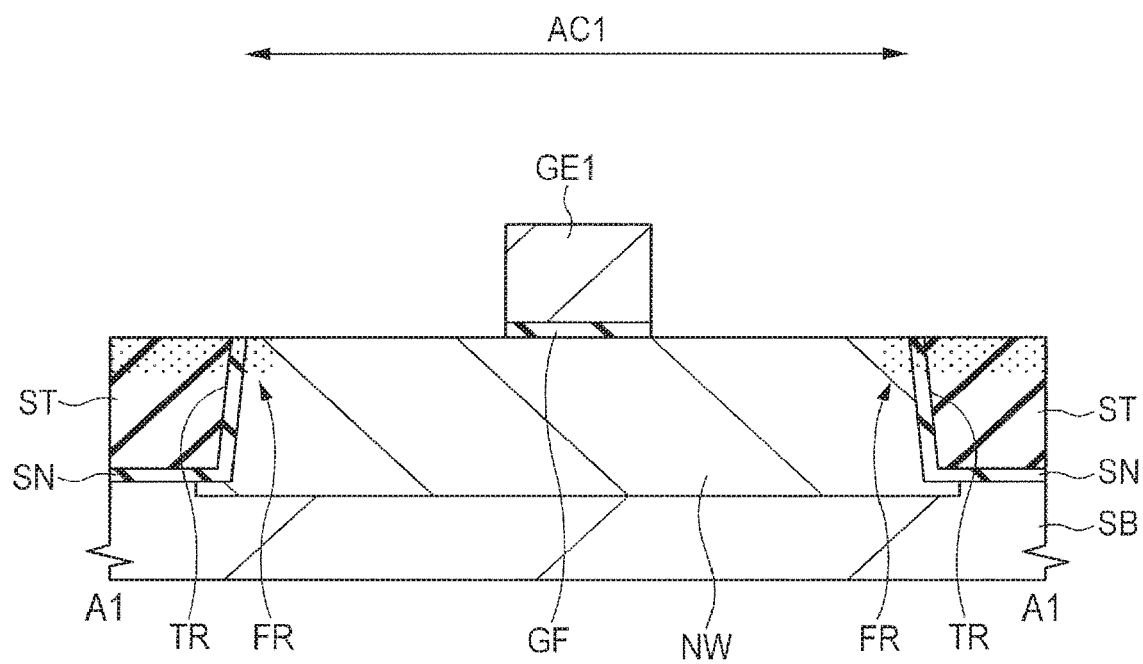
FIG. 16 is a fragmentary cross-sectional view of the semiconductor device during a manufacturing step following that of FIG. 13.
Figure 17:
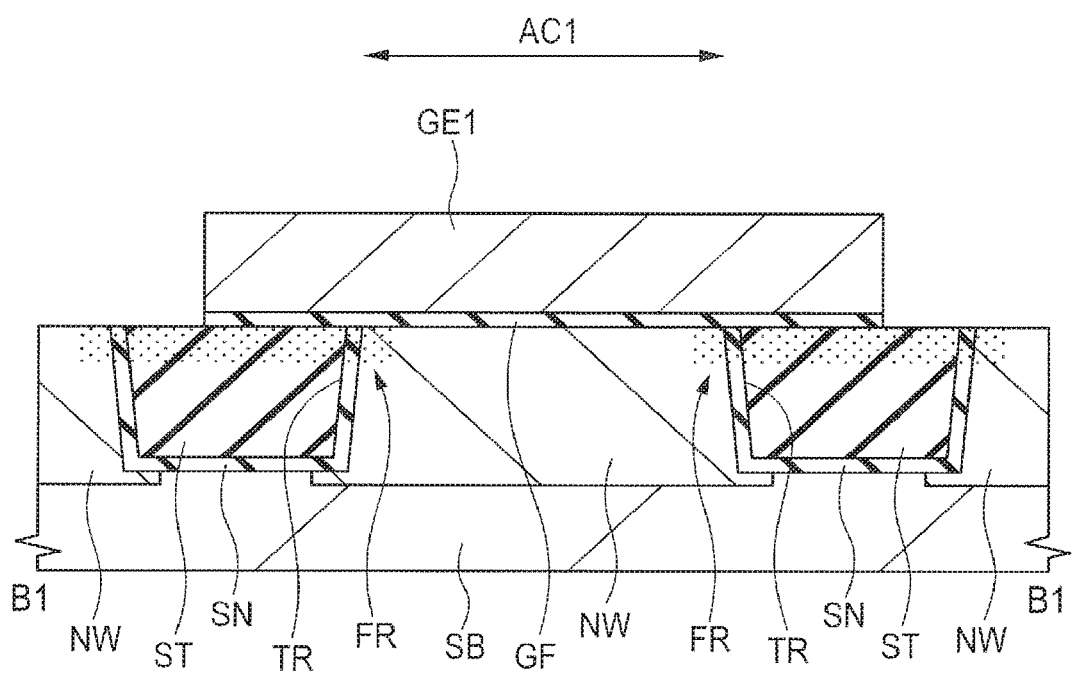
FIG. 17 is a fragmentary cross-sectional view of the semiconductor device during a manufacturing step similar to that of FIG. 16.

Next, an n well NW having a predetermined depth from the main surface of the semiconductor substrate SB is formed in the active region AC1 defined by the element isolation region ST as shown in FIGS. 16 and 17. The n well NW can be formed by ion implantation of an n type impurity such as phosphorus (P) or arsenic (As) into the semiconductor substrate SB.

Next, a gate electrode GE1 is formed on the surface of the semiconductor substrate SB, that is, on the surface of the n well NW via an insulating film GF. This step can be performed specifically in the following manner.

First, an insulating film GF for gate insulating film is formed on the surface of the semiconductor substrate SB, that is, on the surface of the n well NW. The insulating film GF is made of, for example, a thin silicon oxide film and can be formed, for example, by thermal oxidation. When the insulating film GF is formed by oxidation treatment (for example, thermal oxidation), the insulating film GF is formed on the semiconductor substrate SB in the active region AC1, that is, on the n well NW but the insulating film GF is not formed on the element isolation region ST. Then, for example, a polysilicon film, is formed as a conductive film for gate electrode on the main surface (entire main surface) of the semiconductor substrate SB. This polysilicon film has an impurity introduced therein during or after film formation and therefore has a low resistivity. After formation of a photoresist pattern (not shown) on the polysilicon film by photolithography, the polysilicon film is etched and patterned by dry etching with the resulting photoresist pattern as an etching mask. As a result, a gate electrode GE1 made of the patterned conductive film (here, the polysilicon film) can be formed as shown in FIGS. 16 and 17. The gate electrode GE1 is formed on the semiconductor substrate SB (n well NW) via the insulating film GF. The photoresist pattern is then removed. The insulating film GF remains below the gate electrode GE1 and becomes a gate insulating film.

Figure 18:
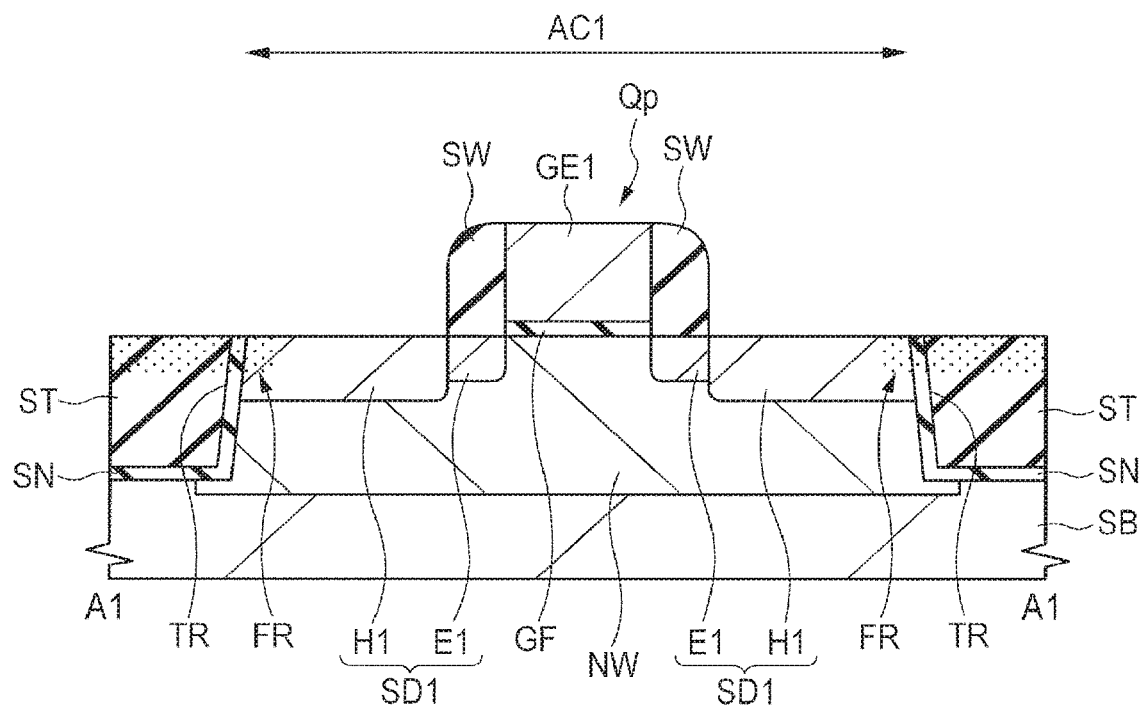
FIG. 18 is a fragmentary cross-sectional view of the semiconductor device during a manufacturing step following that of FIG. 16.
Figure 19:
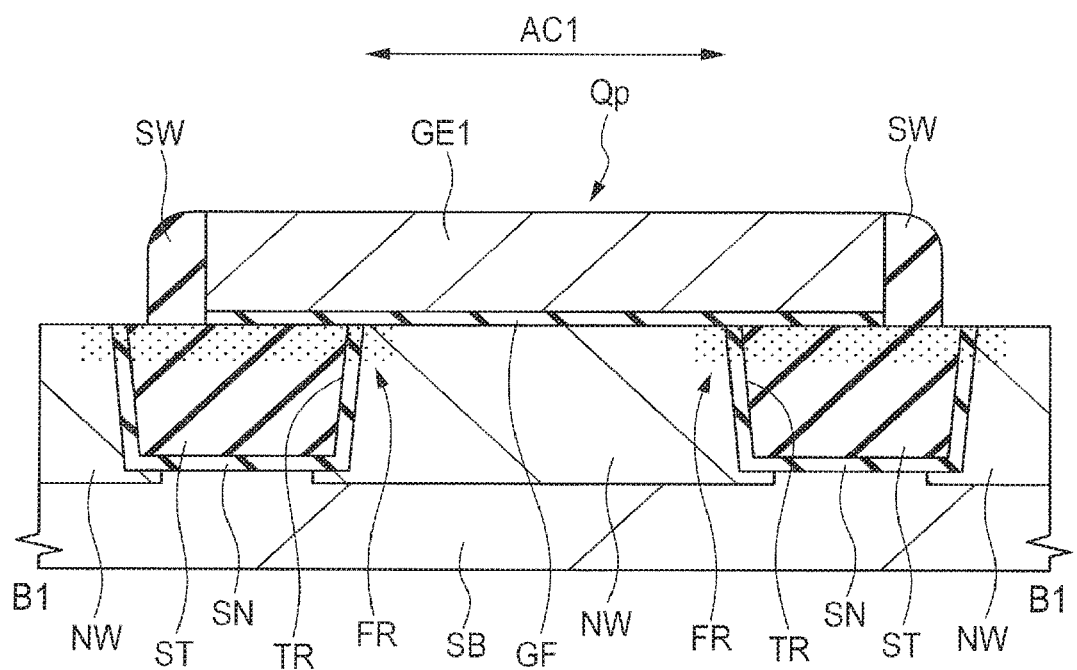
FIG. 19 is a fragmentary cross-sectional view of the semiconductor device during a manufacturing step similar to that of FIG. 18.

Next, as shown in FIGS. 18 and 19, in the active region AC1 defined by the element isolation region ST, a p⁻ type semiconductor region (extension region) E1 is formed by ion implantation of a p type impurity such as boron (B) into a region, in the n well NW, on both sides of the gate electrode GE1.

During this ion implantation, since the gate electrode GE1 can function as an ion implantation preventive mask, no impurity is ion-implanted into a region immediately below the gate electrode GE1 in the n well NW and the $p^-$ type semiconductor region E1 is formed in self alignment with the sidewall of the gate electrode GE1. The $p^-$ type semiconductor region E1 is not formed immediately below the gate electrode GE1 so that it is shown in FIG. 18 but not shown in FIG. 19.

Next, a sidewall spacer SW made of, for example, silicon oxide, silicon nitride, or a stacked film of these insulating films is formed, as a sidewall insulating film, on the side wall of the gate electrode GE1. The sidewall spacer SW can be formed, for example, by depositing an insulating film (a silicon oxide film, a silicon nitride film, or a stacked film of them) on the main surface (entire main surface) of the semiconductor substrate SB and then anisotropically etching the insulating film.

Next, in the active region AC1 defined by the element isolation region ST, a $p^+$ type semiconductor region H1 is formed by ion implantation of an n type impurity such as phosphorus (P) or arsenic (As) into a region, in the n well NW, on both sides of the gate electrode GE1 and the sidewall spacer SW.

During this ion implantation, since the gate electrode GE1 and the sidewall spacer SW on the side wall thereof can function as an ion implantation preventive mask, no impurity is ion implanted into a region, in the n well NW, immediately below the gate electrode GE1 and immediately below the sidewall spacer SW on the side wall of the gate electrode GE1. The $p^+$ type semiconductor region H1 is therefore formed in self alignment with the side surface surface (surface on the side opposite to the side contiguous to the gate electrode GE1) of the sidewall spacer SW on the side wall of the gate electrode GE1. The $p^+$ type semiconductor region H1 is not formed immediately below the gate electrode GE1 so that it is shown in FIG. 18 but not shown in FIG. 19. The $p^+$ type semiconductor region H1 has a junction depth deeper and an impurity concentration higher than those of the $p^-$ type semiconductor semiconductor region E1. The $p^-$ type semiconductor region E1 having a low impurity concentration and the $p^+$ type semiconductor region H1 having a high impurity concentration configure a source/drain region SD1 having an LDD structure.

Annealing treatment (heat treatment) is then performed for activating the thus-introduced impurities.

In such a manner, as shown in FIGS. 18 and 19, a p channel MISFETQp is formed as a field effect transistor in the active region AC1 defined by the element isolation region ST.

Figure 20:
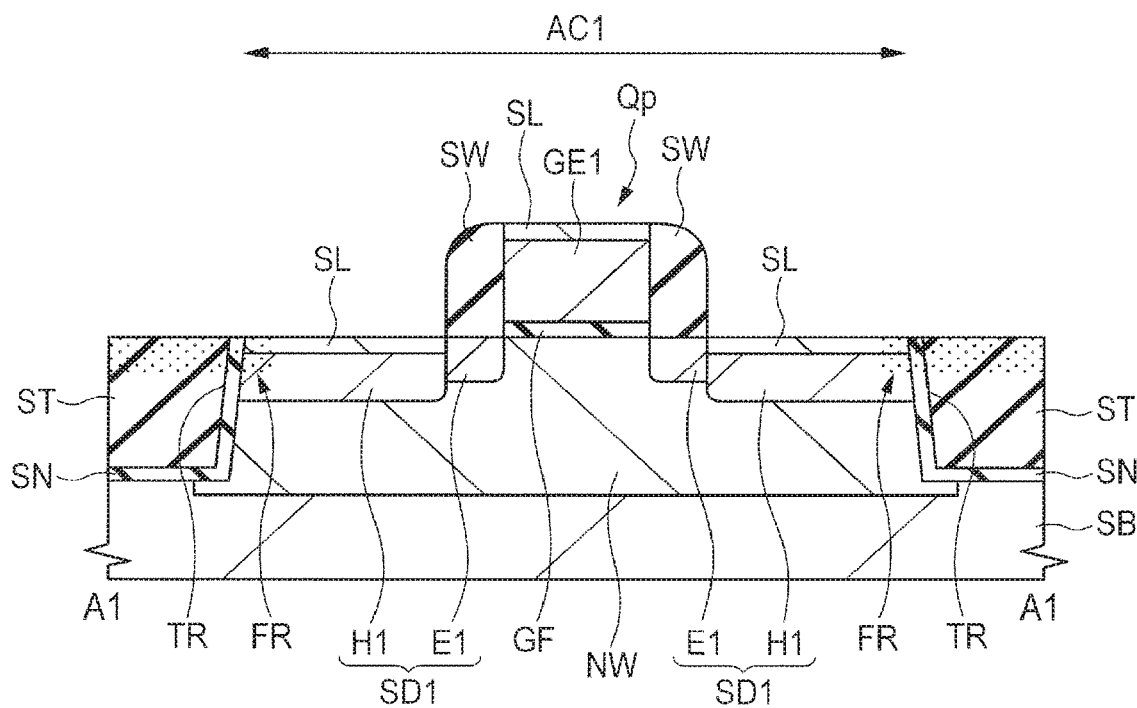
FIG. 20 is a fragmentary cross-sectional view of the semiconductor device during a manufacturing step following that of FIG. 18.
Figure 21:
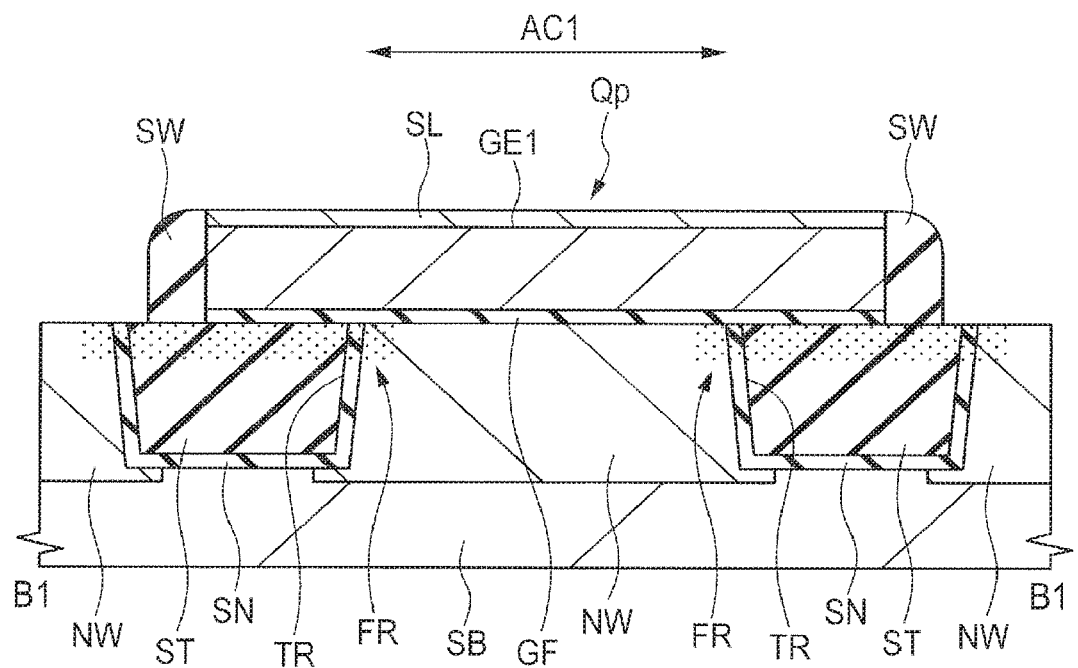
FIG. 21 is a fragmentary cross-sectional view of the semiconductor device during a manufacturing step similar to that of FIG. 20.

Next, as shown in FIGS. 20 and 21, a metal silicide layer SL is formed on the surface (surface layer portion) of the gate electrode GE1 and the p type semiconductor region H1 by salicide technology. This metal suicide layer SL can be formed by depositing a metal film, for example, a cobalt (Co) film, a nickel (Ni) film, or a platinum-nickel alloy film on the gate electrode GE1 and the $p^+$ type semiconductor region H1 so as to cover them, followed by heat treatment. An unreacted portion of the metal film is then removed.

Next, as shown in FIGS. 3 and 4, an interlayer insulating film IL1 is formed on the main surface (entire main surface) of the semiconductor substrate SB so as to cover the gate electrode GE1 and the sidewall spacer SW. Then, the upper surface of the interlayer insulating film IL1 may be polished or the like by CMP to planarize the upper surface of the interlayer insulating film IL1.

Next, with a photoresist pattern (not shown) formed on the interlayer insulating film IL1 as an etching mask, the interlayer insulating film IL1 is dry etched to form a contact hole CT the interlayer insulating film IL1. A conductive plug PG composed mainly of, for example, tungsten (W) is formed in the contact hole CT.

The plug PG is formed, for example, by forming a barrier conductor film (for example, a titanium film, a titanium nitride film, or a stacked film of them) on the interlayer insulating film IL1 including the inside (bottom portion and side wall) of the contact hole; forming a main conductor film made of a tungsten film or the like on the barrier conductor film so as to fill the contact hole CT therewith; and removing an unnecessary portion of the main conductor film and the barrier conductor film outside the contact hole CT by CMP or etch-back.

Next, an insulating film IL2 is formed on the interlayer insulating film IL1 having the plug PG buried therein. The insulating film IL2 may be formed as a single-layer insulating film or a stacked film of a plurality of insulating films.

Next, a wiring M1 which is a first-layer wiring is formed by the single damascene process. Described specifically, the wiring M1 can be formed in the following manner. First, a wiring trench is formed in the insulating film IL2 by using photolithography and dry etching. Then, after formation of a barrier conductor film on the insulating film IL2 including the bottom surface and the inner wall of the wiring trench, a thin copper film is deposited as a seed film on the barrier conductor film by sputtering or the like. A copper plating film is then deposited as a main conductor film on the seed film by electroplating and the wiring trench is filled with this copper plating film. Then, an unnecessary portion of the copper plating film, the seed film, and the barrier conductor film outside the wiring trench is removed by CMP or the like to form, a first layer wiring M1 in the wiring trench. In such a manner, the structure shown in FIGS. 3 and 4 can be obtained.

Second and upper wirings are thereafter formed by the dual damascene process, but illustration and description of them are omitted. The wiring M1 and wirings thereabove are not limited to the damascene wiring but can be formed by patterning a wiring conductor film. For example, they may be formed as a tungsten wiring or aluminum wiring.

The semiconductor device of the present embodiment is manufactured as described above.

<Investigation Example>

Next, examples investigated by the present inventors will be described.

Figure 22:
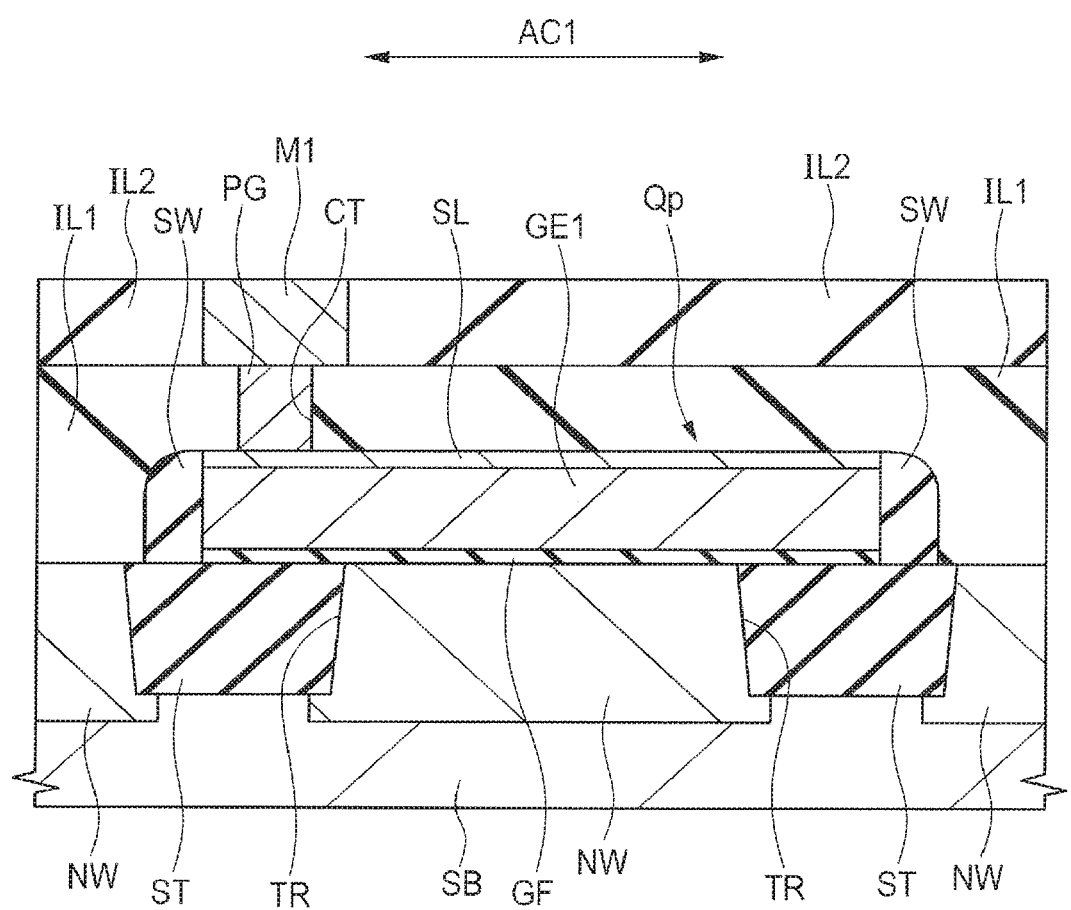
FIG. 22 is a fragmentary cross-sectional view of a semiconductor device of First Investigation Example.
Figure 23:
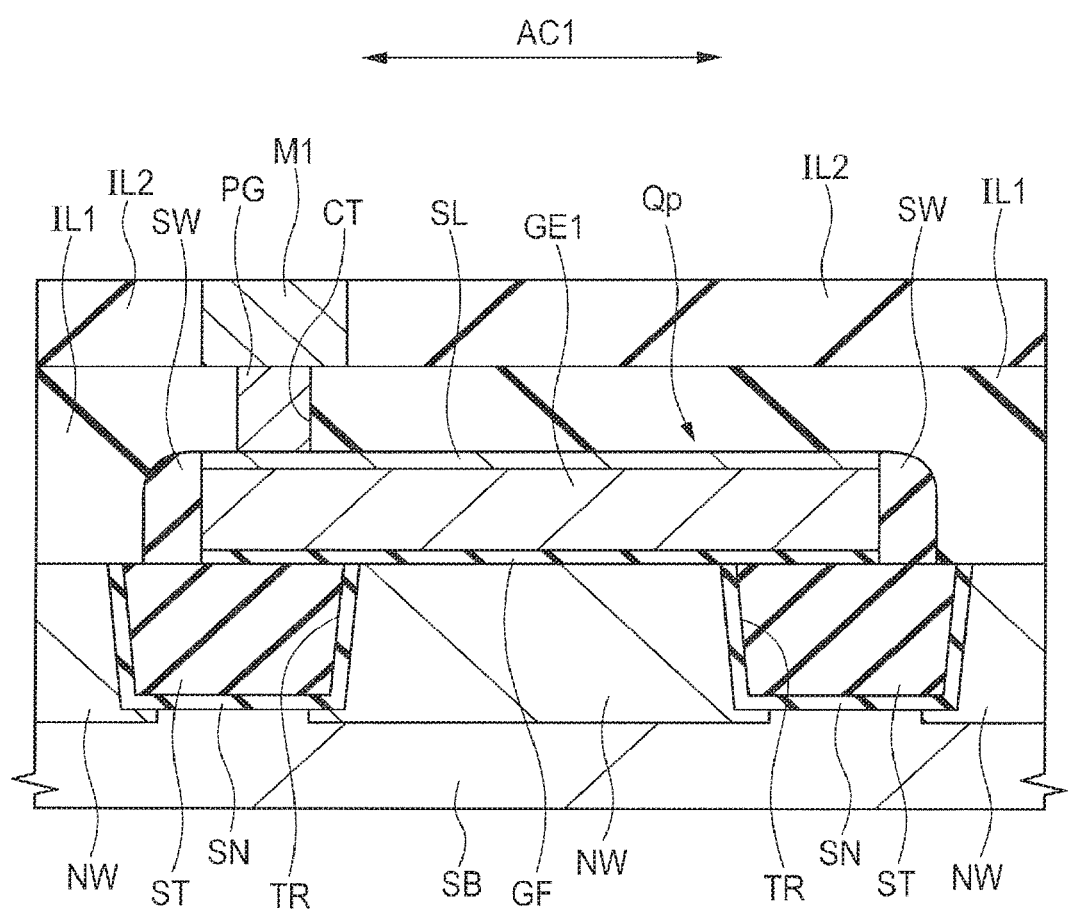
FIG. 23 is a fragmentary cross-sectional view of a semiconductor device of Second Investigation Example.

FIG. 22 is a fragmentary cross-sectional view of a semiconductor device of First Investigation Example investigated by the present inventors and FIG. 23 is a fragmentary cross-sectional view of a semiconductor device of Second Investigation Example investigated by the present inventors. Each shows a cross-section corresponding to FIG. 4 of the present embodiment.

In the semiconductor device of First Investigation Example shown in FIG. 22, the trench TR does not have a nitrided inner surface (side surface and bottom surface). This means that in manufacturing steps of the semiconductor device of First Investigation Example shown in FIG. 22, a step (the step of FIG. 7) of nitriding the inner surface (side surface and bottom surface) of the trench TR in the semiconductor substrate SB is not performed before formation of a silicon oxide film (insulating film UZ) which fills a trench TR formed in the semiconductor substrate SB. A film corresponding to the nitride layer SN is therefore not formed between the element isolation region ST and the semiconductor substrate SB in the semiconductor device of First Investigation Example shown in FIG. 22 and the element isolation region ST and the substrate region are adjacent to each other. In the manufacturing steps of the semiconductor device of First Investigation Example shown in FIG. 22, since a step (step shown in FIGS. 13 to 15) corresponding to the ion implantation IM1 is not performed, the semiconductor device of First Investigation Example shown in FIG. 22 does not have therein a region corresponding to the fluorine implanted region FR.

In the semiconductor device of First Investigation Example shown in FIG. 22, the element isolation region ST in the trench TR may be re-oxidized and thereby expand in various steps after formation of the element isolation region ST. For example, in a thermal oxidation step for forming an insulating film for a gate insulating film, the element isolation region ST which has filled the trench TR inevitably expands. Expansion of the element isolation region ST may cause crystal detects in the semiconductor substrate SB in the active region and as a result, the semiconductor device thus manufactured may have deteriorated reliability.

The semiconductor device of Second Investigation Example shown in FIG. 23 is therefore investigated.

In the semiconductor device of Second Investigation Example shown in FIG. 23, different from the semiconductor device of First Investigation Example shown in FIG. 22, the trench TR of the semiconductor substrate SB has a nitrided inner surface (side surface and bottom surface). This means that in manufacturing steps of the semiconductor device of Second Investigation Example, after formation of the trench TR in the semiconductor substrate SB but before formation of the silicon oxide film (insulating film UZ) for filling the trench TR, the inner surface (side surface and bottom surface) of the trench TR in the semiconductor substrate SB is nitrided. In the semiconductor device of Second Investigation Example shown in FIG. 23, the element isolation region ST and the semiconductor substrate SB have therebetween the nitride layer SN. The nitride layer SN extends over the entirety of the inner surface of the trench TR. In manufacturing steps of the semiconductor device of Second Investigation Example shown in FIG. 23, a step (step shown in FIGS. 13 to 15) corresponding to the ion implantation IM1 is not performed so that the semiconductor device of Second Investigation Example shown in FIG. 23 does not have there in a region corresponding to the fluorine implanted region FR.

In the semiconductor device of Second Investigation Example shown in FIG. 23, the entire inner surface of the trench TR in the semiconductor substrate SB is nitrided so that reoxidation and expansion thereby of the element isolation region ST filled in the trench TR can be suppressed or prevented. For example, the element isolation region ST which has filled the trench TR can re suppressed or prevented from expanding in the thermal oxidation step for forming an insulating film for a gate insulating film. Generation of crystal defects in the semiconductor substrate SB in the active region due to expansion of the element isolation region ST can therefore be suppressed or prevented and as a result, the semiconductor device thus manufactured can have improved reliability.

The present inventors have however found as a result of investigation that the semiconductor device of Second Investigation Example shown in FIG. 23 is likely to have deteriorated NBTI (negative bias temperature instability) characteristics. The term "NBTI characteristics" means a phenomenon of MISFET characteristics (threshold voltage) varying due to application of a bias voltage (negative bias voltage) at high temperatures. Deterioration (worsening) of NBTI characteristics increases a change in the threshold voltage of the MISFET when a bias voltage (negative bias voltage) is applied at high temperatures.

Described specifically, the present inventors have found as a result of investigation that the semiconductor device of Second Investigation Example of FIG. 23 has greatly deteriorated NBTI characteristics and furthermore, the deterioration degree of NBTI characteristics depends on the gate width and with a decrease in the gate width, the deterioration of NBTI characteristics of the p channel MISFET becomes severer.

Figure 24:
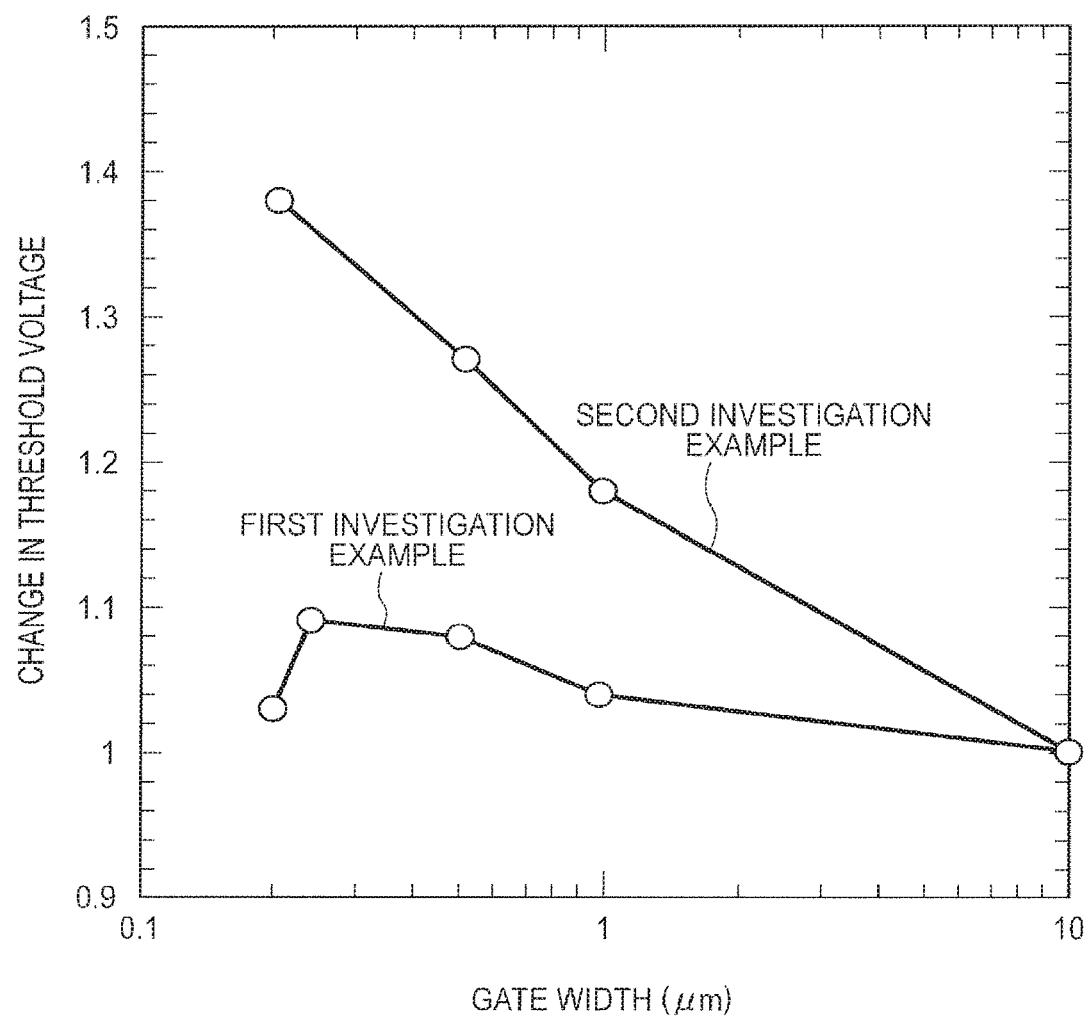
FIG. 24 is a graph showing the gate-width dependence of NBTI characteristics of the semiconductor device of First Investigation Example and the semiconductor device of Second Investigation Example.

FIG. 24 is a graph showing the gate width dependence of NBTI characteristics of each of the semiconductor device of First Investigation Example and the semiconductor device of Second Investigation Example. The gate width of the gate electrode of the p channel MISFET is plotted along the abscissa of the graph shown in FIG. 24. A change in the threshold voltage of the p channel MISFET before and after application of high-temperature negative bias voltage (NBT stress) is plotted along the ordinate in FIG. 24. Values along the ordinate in the graph of FIG. 24 are standardized based on a change in threshold voltage before and after application of an NBT stress when the gate width is 10 μm, in each of the semiconductor device of First Investigation Example and the semiconductor device of Second Investigation Example.

It has been found from the graph of FIG. 24 that compared with the semiconductor device of First Investigation Example shown in FIG. 22, the semiconductor device of Second Investigation Example shown in FIG. 23 has more greatly deteriorated NBTI characteristics and with a decrease in the gate width, the deterioration degree of the NBTI characteristics of the p channel MISFET becomes severer.

<Main Characteristics and Advantages>

The semiconductor device of the present embodiment has the semiconductor substrate SB, the element isolation region ST buried in the trench TR formed in the semiconductor substrate SB, the gate electrode GE1 formed, via the insulating film GF (first insulating film), on the semiconductor substrate SB in the active region AC1 (first active region) surrounded by the element isolation region ST, and the source/drain region SD1 formed in he semiconductor substrate SB in the active region AC1.

The gate electrode GE1 (first gate electrode) is a gate electrode for MISFETQp (first MISFET), the insulating film GF (first gate insulating film) below the gate electrode GE1 functions as a gate insulating film of the MISFETQp (first MISFET), the source/drain region SD1 (first source/drain region) is a source/drain region for the MISFETQp (first MISFET). The element isolation region ST is composed mainly of silicon oxide and more specifically, it is made of a silicon oxide film buried in the trench TR.

One of the main characteristics of the present embodiment is a nitrided inner surface (side surface and bottom surface) of the trench TR in the semiconductor substrate SB.

When the trench TR to be filled with the element isolation region ST does not have a nitrified inner surface as in the semiconductor device of First Investigation Example shown in FIG. 22, the element isolation region ST buried in the trench TR may be re-oxidized and thereby expand in various steps performed after formation of the element isolation region ST, as described above. This may generate crystal defects in the semiconductor substrate SB in the active region and as a result, the semiconductor device thus provided inevitably has deteriorated reliability.

In the present embodiment, on the other hand, since the trench TR in the semiconductor substrate SB to be filled with the element isolation region ST has a nitrided inner surface (side surface and bottom surface), the element isolation region ST can be suppressed or prevented from being re-oxidized and thereby expanding in various steps after formation of the element isolation region ST. For example, the element isolation region ST buried in the trench TR can be suppressed or prevented from expanding in a thermal oxidation step for the formation of an insulating film (corresponding to the insulating film GF) for gate insulating film. This therefore makes it possible to suppress or prevent generation of crystal defects in the semiconductor substrate SB in the active region, which would otherwise be caused by expansion of the element isolation region ST. As a result, the semiconductor device thus manufactured can have improved reliability.

Another one of the main characteristics of die present embodiment is that a portion of the gate electrode GE1 extends over the element isolation region ST; and below the gate electrode GE1, fluorine (F) is introduced into the is of a boundary between the element isolation region ST and the channel region of the MISFETQp. In other words, in plan view, a portion of the gate electrode GE1 overlaps with the element isolation region. ST and in an overlapping region with the gate electrode GE1 in plan view, fluorine (F) is introduced into the vicinity of the boundary between the element isolation region ST and the channel region of the MISFETQp. This makes it possible to suppress or prevent deterioration of NBTI characteristics and thereby provide a semiconductor device having improved reliability. A specific description will next be made on this characteristic.

When the gate electrode extends over not only the semiconductor substrate but also the element isolation region surrounding the active region of the substrate, the nitrided inner surface of the trench in the semiconductor substrate SB to be filled with the element isolation region may lead to deterioration in NBTI characteristics. This means that compared with First Investigation Example shown in FIG. 22, deterioration in NBTI characteristics of the semiconductor device of Second Investigation Example shown in FIG. 23 is larger and at the same time, the deterioration degree of NBTI characteristics depends on the gate width With a decrease in gate width, the deterioration degree of the NBTI characteristics of the p channel MISFET becomes severer.

Nitriding of the inner surface of the trench in the semiconductor substrate to be filled with the element isolation region is effective for preventing reoxidation and expansion thereby of the element isolation region, but it inevitably enhances deterioration of NBTI characteristics.

Different from the present embodiment, there may also be a case in which a gate electrode extends over a semiconductor substrate in an active region but does not extend over an element isolation region surrounding the active region; and the gate electrode has both end portions in the gate width direction on the semiconductor substrate in the active region. In this case, even when the inner surface of a trench of a semiconductor substrate to be filled with an element isolation region is nitrided and a nitride layer is formed on the inner surface, this nitride layer is much distant from the gate insulating film or channel region of the MISFET so that the nitride layer has almost no influence on the NBTI characteristics of the MISFET and presence or absence of the nitride layer causes almost no change in NBTI characteristics.

It is however common that a portion of the gate electrode extends also over an element isolation region. This structure is employed to place, when a plug buried in a contact hole formed on a gate electrode is electrically coupled to the gate electrode, the contact hole and the plug to be buried therein on a portion of the gate electrode located on the element isolation region. Then, even if, during formation of the contact hole, the formation position of the contact hole slightly deviates from its designed position, the element isolation region is exposed from the contact hole and the substrate region remains unexposed so that the plug to be coupled to the gate electrode can be prevented from being electrically coupled to the semiconductor substrate. When one gate electrode extending over the semiconductor substrate serves as a gate electrode for a plurality of MISFETs, the gate electrode is required to extend over the element isolation region between the MISFETs.

In any of the semiconductor device of First Investigation Example shown above in FIG. 22, the semiconductor device of Second Investigation Example shown above in FIG. 23, the semiconductor device of the present embodiment (including a modification example), and a semiconductor device of Second Embodiment (including a modification example) which will be described later, a portion of the gate electrode also extends over the element isolation region (element isolation region surrounding the active region).

When the gate electrode extends not only over the semiconductor substrate in the active region but also over the element isolation region surrounding the active region, a nitride layer formed by nitriding the entire inner surface of the trench of the semiconductor substrate to be filled with the element isolation region is likely to adversely affect the NBTI characteristics of the MISFET because the nitride layer is near the gate insulating film or channel region of the MISFET. In the semiconductor device of Second Investigation Example shown in FIG. 23, the nitride layer SN is near the gate insulating film or channel region of the MISFET so that the nitride layer SN adversely affects the NBTI characteristics of the MISFET and enhances the deterioration in NBTI characteristics. The degree of deterioration in NBTI characteristics depends on the gate width so that with a decrease in the gate width, the p channel MISFET is presumed to have severely deteriorated NBTI characteristics.

In the present embodiment, on the other hand, below the gate electrode GE1, fluorine (F) is introduced into the vicinity of a boundary between the element isolation region ST and the channel region of the MISFETQp. Nitrogen is an element promoting deterioration in NBTI characteristics, while fluorine (F) is an element effective for suppressing deterioration in NBTI characteristics. In the present embodiment, below the gate electrode GE1, fluorine (F) is introduced into the vicinity of a boundary between the element isolation region ST and the channel region of the MISFETQp so that deterioration in NBTI characteristics can be suppressed or prevented. In addition, dependence of the degree of deterioration in NBTI characteristics on the gate width can be suppressed or prevented.

In the present embodiment, therefore, by nitriding the inner surface (side surface and bottom surface) of the trench TR in the semiconductor substrate SB and thereby forming a nitride layer SN, reoxidation and expansion thereby of the element isolation region ST buried in the trench TR can be prevented. At the same time, deterioration in NBTI characteristics by the nitride layer SN is prevented by fluorine (F) thus introduced.

Thus, introduction of fluorine (F) is effective for suppressing or preventing deterioration in NBTI characteristics. As a fluorine introduced region, a region in the vicinity of a boundary between the element isolation region ST and the channel region of the MISFETQp below the gate electrode GE1 is particularly effective. The reason is that a portion of the nitride layer formed on the inner surface of the trench TR in the semiconductor substrate SB and near the gate insulating film or channel region of the MISFET is likely to contribute to the deterioration in NBTI characteristics. This is a portion of the nitride layer SN present in the vicinity of a boundary between the element isolation region ST and the channel region below the gate electrode GE1. Introduction of fluorine (F) into a portion of the nitride layer SN or in the vicinity thereof which is likely to contribute to deterioration in NBTI characteristics is therefore effective for suppressing or preventing deterioration in NBTI characteristics due to the nitride layer SN. In a region below the gate electrode GE1, introduction of fluorine (F) into the vicinity of a boundary between the element isolation region ST and the channel region of the MISFET (Qp) is therefore particularly effective for suppressing or preventing deterioration in NBTI characteristics of the MISFET (Qp). In short, introduction of fluorine (F) into a region hatched with dots in FIG. 25 is particularly effective for suppressing or preventing deterioration in NBTI characteristics.

Figure 25:
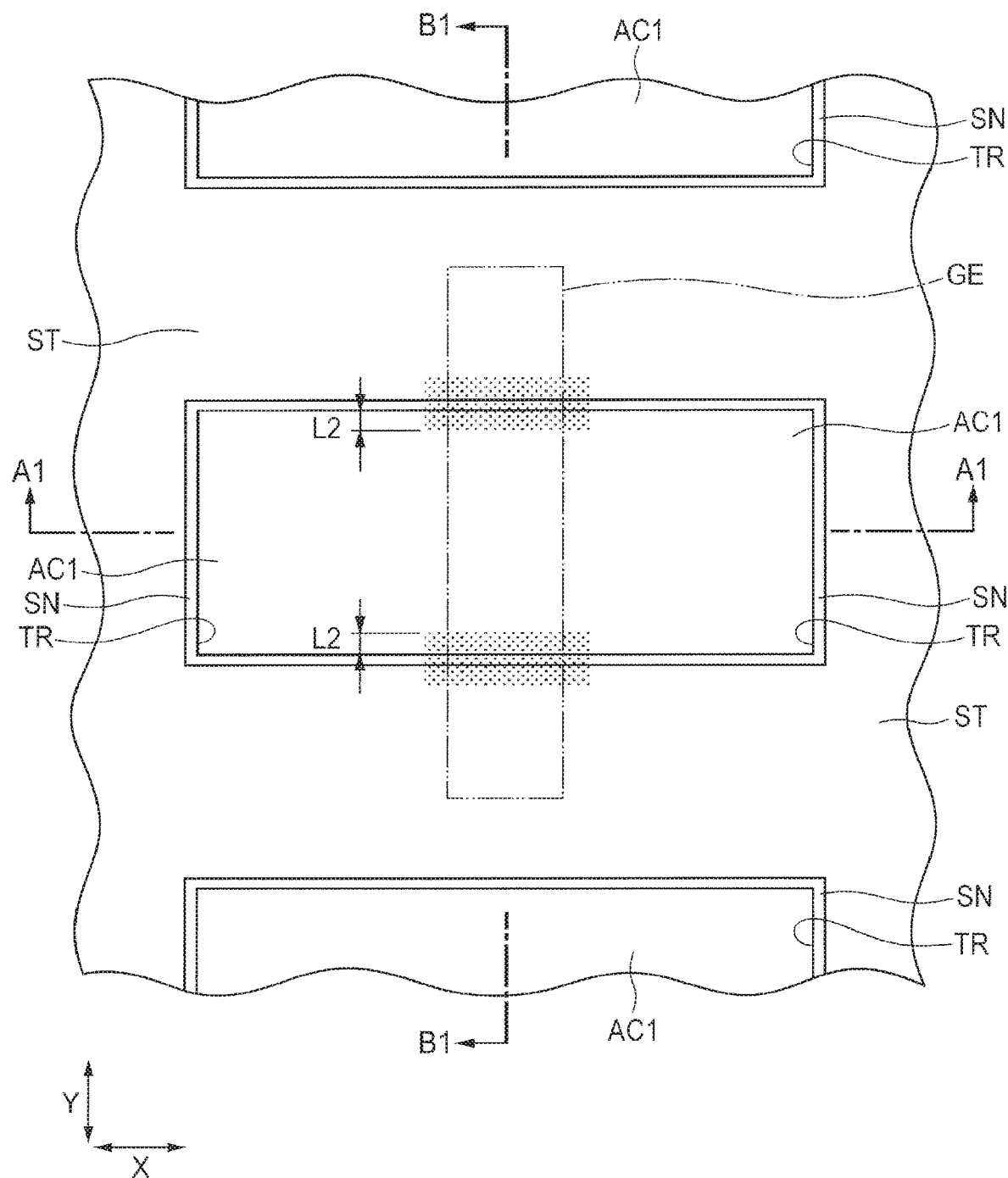
FIG. 25 is a fragmentary plan view of a semiconductor device of another mode.

FIG. 25 is a fragmentary plan view of a semiconductor device of another mode and it corresponds to FIG. 2. Also in FIG. 25, as in FIG. 2, a region implanted with fluorine (F) (fluorine implanted region FR) is hatched with dots. The cross-sectional view taken along the line B1-B1 in FIG. 25 is similar to that in FIG. 4, but the cross-sectional view taken along the lane A1-A1 in FIG. 25 corresponds to a drawing obtained by removing the fluorine implanted region FR from FIG. 3. In FIG. 25, fluorine (F) is introduced (implanted) into the vicinity of a boundary between the element isolation region ST and the channel region below the gate electrode GE1, but fluorine (F) is not introduced (implanted) into the other region.

In other words, in the present embodiment, fluorine (F) is introduced into the vicinity of a boundary between the active region AC1 and the element isolation region ST surrounding the active region AC1. Introduction of fluorine (F) into the vicinity of a boundary between the channel region and the element isolation region immediately below the gate electrode GE1 is at least necessary. Introduction of fluorine (F) into an upper portion of the nitride layer SN between the element isolation region ST and the channel region immediately below the gate electrode GE1 is particularly effective for suppressing deterioration in NBTI characteristics.

When the semiconductor substrate SB in the active region has fluorine (F) introduced therein, there is a risk of fluorine (F) causing an unintentional change in the characteristics of the MISFET formed in the active region. In the semiconductor substrate SB in the active region AC1, implantation of fluorine (F) into the outer peripheral portion of the active region AC1 is permitted, but fluorine (F) is preferably not implanted into a region other than the outer peripheral portion (region inside the outer peripheral portion). This makes it possible to reduce the risk of fluorine (F) thus introduced causing an unintentional change in the MISFET characteristics. In the element isolation region ST, on the other hand, fluorine (F) may be implanted into a region adjacent to the active region ACT or fluorine may be implanted into the entirety of the element isolation region ST. This is because compared with introduction of fluorine (F) into the semiconductor substrate SB in the active region AC1, introduction of fluorine (F) into the element isolation region ST does net easily enhance the risk of the thus-introduced fluorine (F) causing an unintentional change in the MISFET characteristics.

The fluorine implanted region FR is therefore not limited to a region hatched with dots in FIG. 2, but may be formed, for example, in a region hatched with dots in FIG. 25.

Thus, in the present embodiment, the trench TR of the semiconductor substrate SB has a nitrided inner surface so that generation of crystal defects in the semiconductor substrate SB in the active region due to expansion of the element isolation region ST can be suppressed or prevented. Further, due to fluorine (F) introduced as described above, deterioration in NBTI characteristics can be suppressed or prevented. The semiconductor device thus manufactured can therefore have properly improved reliability.

<First Modification Example>

Next, a modification example (application example) of she present embodiment will be described.

Figure 26:
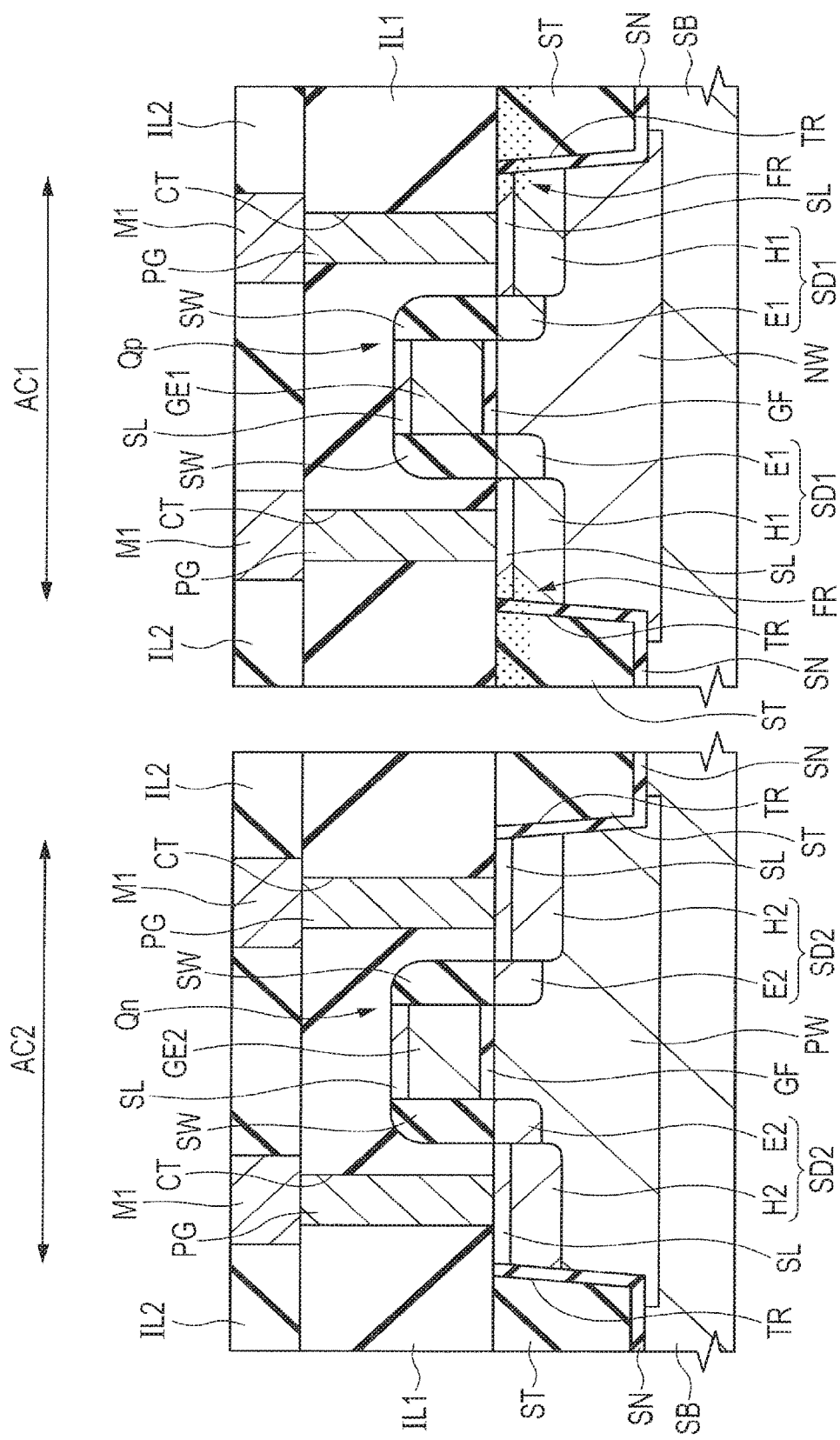
FIG. 26 is a fragmentary cross-sectional view of a semiconductor device of First Modification Example.
Figure 27:
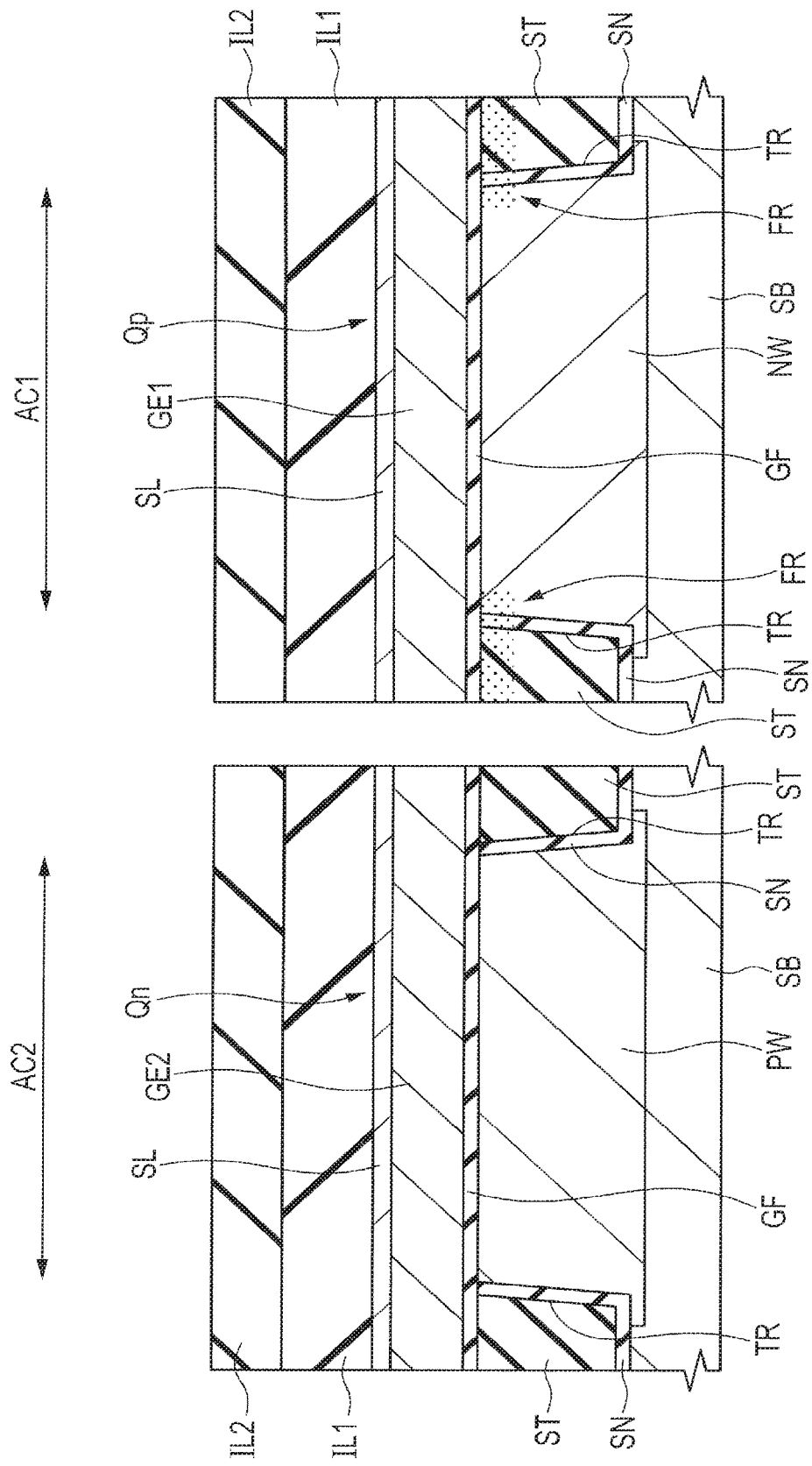
FIG. 27 is another fragmentary cross-sectional view of the semiconductor device of First Modification Example.

FIGS. 26 and 27 are fragmentary cross-sectional views showing a semiconductor device of First Modification Example of the present embodiment. FIG. 26 slows a cross-section corresponding to FIG. 3 (cross-section along a gate length direction) and FIG. 27 shows a cross-section corresponding to FIG. 4 (cross-section along a gate width direction.).

In the semiconductor device of First Modification Example shown in FIGS. 26 and 27, a semiconductor substrate SB has thereon both a p channel MISFET and an n channel MISFET.

Described specifically, the semiconductor device of First Modification Example shown in FIGS. 26 and 27 has, in the semiconductor substrate SB, an element isolation region ST and active regions AC1 and AC2 surrounded by the element isolation region ST. The active region AC1 has therein a p channel MISFETQp and the active region AC2 has therein an n channel MISFETQn.

The active region AC1, the element isolation region ST surrounding the active region AC1 therewith, and the p channel MISFETQp formed in the active region AC1 are similar to those described above referring to FIGS. 1 to 4 and FIG. 25. Described specifically, the semiconductor substrate SB in the active region AC1 has therein an n type well NW; the semiconductor substrate SB (n well NW) in the active region AC1 has thereon a gate electrode GE1 via an insulating film GF; and the semiconductor substrate SB (n well NW) in the active region AC1 has therein a source/drain region SD1. The gate electrode GE1 is a gate electrode for p channel MISFETQp; the gate insulating film GF below the gate electrode GE1 functions as a gate insulating film for p channel MISFETQp; and the source/drain region SD1 is a source/drain region for the p channel MISFETQp.

The active region AC2, the element isolation region ST surrounding the active region AC2, and the n channel MISFETQn formed in the active region AC2 are different in the following points from the active region AC1, the element isolation region ST surrounding the active region AC1, and the p channel MISFETQp formed in the active region AC1.

Described specifically, the semiconductor substrate SB in the active region AC2 has therein a p well PW, the semiconductor substrate SB (p well PW) in the active region AC2 has thereon a gate electrode GE2 via the insulating film GF; and the semiconductor substrate SB (p well PW) in the active region AC2 has therein a source/drain region SD2. The gate electrode GE2 is a gate electrode for the n channel MISFETQn; the insulating film GF below the gate electrode GE2 functions as a gate insulating film for the n channel MISFETQn; and the source/drain region SD2 is a source/drain region for the n channel MISFETQn.

The configuration of the p well PW, the gate electrode GE2, and the source/drain region SD2 is almost similar to the configuration of the n type well NW, the gate electrode GE1, and the source/drain region SD1 except for the conductivity type. This means that the source/drain region SD1 is a p type semiconductor region, while the source/drain region SD2 is an n type semiconductor region. The gate electrode GE1 is made of p type doped polysilicon, while the gate electrode GE2 is made of n type doped polysilicon. The source/drain region SD2 is therefore comprised of an $n^-$ type semiconductor region E2 corresponding to the $p^-$ type semiconductor region E1 and an $n^+$ type semiconductor region H2 corresponding to the $p^+$ type semiconductor region H1. The $n^+$ type semiconductor region H2 has an impurity concentration higher and a junction depth deeper than those of the $n^-$ type semiconductor region E2. Similar to a portion of the gate electrode GE1 extending over the element isolation region ST surrounding the active region AC1, a portion of the gate electrode GE2 extends over the element isolation region ST surrounding the active region AC2.

Not only the gate electrode GE1 but also the gate electrode GE2 has, on the side wall thereof, a sidewall spacer SW. The $p^+$ type semiconductor region H1, the $n^+$ type semiconductor region H2, the gate electrode GE1, and the gate electrode GE2 each have, on the upper portion thereof, a metal silicide layer SL. An interlayer insulating film IL1 covers the gate electrodes GE1 and GE2 and the sidewall spacer SW and a contact hole CT and a plug PG buried therein are present on the $p^+$ type semiconductor region. H1, the $n^+$ type semiconductor region H2, the gate electrode GE1, the gate electrode GE2, and the like.

Similar to the element isolation region ST described referring to FIGS. 1 to 4 and FIG. 5, the element isolation region ST in First Modification Example shown in FIGS. 26 and 27 is also buried in the trench TR formed in the semiconductor substrate SB. It is composed mainly of silicon oxide. More specifically, it is made of a silicon oxide film buried in the trench TR. The trench TR in the semiconductor substrate SB has a nitrided inner surface (side surface and bottom surface). The element isolation region ST surrounding the active region AC1 and the element isolation region ST surrounding the active region AC2 are in common in this point. Therefore, the element isolation region ST surrounding the active region AC1 and the element isolation region ST surrounding the active region AC2 are in common in that the trench TR filled with the element isolation region ST has a nitride layer SN obtained by nitriding the inner surface of the trench. The element isolation region ST surrounding the active region AC1 and the element, isolation region ST surrounding the active region AC2 can therefore be suppressed or prevented from being re-oxidized and thereby expanding in various steps performed after formation of the element isolation region ST. This makes it possible to suppress or prevent generation of crystal defects in the semiconductor substrate SB in the active regions AC1 and AC2 which would otherwise be caused by expansion of the element isolation region ST. As a result, the semiconductor device thus manufactured can have improved reliability.

In the semiconductor device of First Modification Example shown in FIGS. 26 and 27, as in the semiconductor device described above referring to FIGS. 1 to 4 and FIG. 25, a portion of the gate electrode GE1 of the p channel MISFETQp extends over the element isolation region ST and in a region below the gate electrode GE1, fluorine (F) is introduced into the vicinity of a boundary between the element isolation region ST and the channel region of the p channel MISFETQp. This makes it possible to suppress or prevent the p channel MISFETQp from having deteriorated NBTI characteristics and suppress or prevent dependence of a deterioration degree of the NBTI characteristics on the gate width.

On the other hand, a portion of the gate electrode GE2 of the n channel MISFETQn extends over the element isolation region ST. In some cases, fluorine (F) is introduced into the vicinity of a boundary between the element isolation region ST and the channel region of the n channel MISFETQn below the gate electrode GE2 and in some cases, fluorine (F) is not introduced therein.

When in both the p channel MISFETQp and the n channel MISFETQn, fluorine (F) is introduced into the vicinity of a boundary between the element isolation region ST and the channel region below the gate electrodes (GE1 and GE2), deterioration in NBTI characteristics can be suppressed or prevented in both the p channel MISFETQp and the n channel MISFETQn. In addition, dependence of a deterioration degree of the NBTI characteristics on the gate width can be suppressed or prevented in both the p channel MISFETQp and the n channel MISFETQn.

In the active region AC2 for the n channel MISFET and the element isolation region ST surrounding it, however, it is possible not to introduce fluorine (F) into the vicinity of a boundary between the element isolation region ST and the channel region below the gate electrode GE2. Even in this case, however, in the active region AC1 for the p channel MISFET and the element isolation region ST surrounding it, fluorine (F) is introduced into the vicinity of a boundary between the element isolation region ST and the channel region below the gate electrode GE1. The problem of deterioration in the NBTI characteristics mainly occurs in the p channel MISFET. In the n channel MISFET, compared with the p channel MISFET, deterioration in the NBTI characteristics hardly occurs and at the same time, in the n channel MISFET, a negative voltage is not applied so frequently to the gate electrode of it. Suppression of deterioration in the NBTI characteristics is required in the p channel MISFET and in the n channel MISFET, compared with the p channel MISFET, suppression of deterioration in the NBTI characteristics is not required so much.

In First Modification example, in the active region AC1 for the p channel MISFET and the element isolation region ST surrounding it, fluorine (F) is therefore introduced into the vicinity of a boundary between the element isolation region ST and the channel region below the gate electrode GE1. In the active region AC2 for the n channel MISFET and the element isolation region ST surrounding it, fluorine (F) is preferably not introduced into the vicinity of a boundary between the element isolation region ST and the channel region below the gate electrode GE2. In other words, it is preferred in First Modification Example to apply the configuration described above referring to FIGS. 1 to 4 and FIG. 25 to the p channel MISFET and the configuration described above referring to Second Investigation Example shown in FIG. 23 to the n channel MISFET.

In the active region AC1 for the p channel MISFET and the element isolation region ST surrounding it, fluorine (F) introduced into the vicinity of a boundary between the element isolation region ST and the channel region below the gate electrode GE1 makes it possible to suppress or prevent the p channel MISFETQp, which is required to have less deteriorated NBTI characteristics, from having deteriorated NBTI characteristics. On the other hand, in the n channel MISFETQn not so required to have less deteriorated NBTI characteristics, since fluorine (F) is not introduced into the vicinity of a boundary between the element isolation region ST and the channel region below the gate electrode GE2, it is possible to avoid a risk of the n channel MISFETQn undergoing an unintentional change in the characteristics which would otherwise be caused by the introduction of fluorine (F). As a result, the semiconductor device thus manufactured can have improved reliability more properly.

In the above ion implantation IM1, fluorine (F) is ion-implanted with the photoresist pattern PR2 as an ion implantation preventive mask (mask layer). During this ion implantation, it is recommended to cover the active region AC2 for the n channel MISFET and the element isolation region ST surrounding it with the photoresist pattern PR2. This makes it possible to prevent fluorine (F) from being ion implanted by the above ion implantation IM1 into the semiconductor substrate SB in the active region AC2 or in the vicinity of a boundary between the semiconductor substrate SB in the active region AC2 and the element isolation region ST. The semiconductor device thus manufactured can therefore have no fluorine (F) introduced into the vicinity of a boundary' between the element isolation region ST and the channel region below the gate electrode GE2.

The step of forming the n channel MISFETQn is essentially similar to that of the p channel MISFETQp except that the conductivity type is opposite.

Described specifically, in forming the n well NW in the steps shown in FIGS. 16 and 17, not only the n well NW but also a p well PW is formed. Since the n well NW and the p well PW are different in conductivity type, an ion implantation step for forming the n well NW and an ion implantation step for forming the p well PW are performed separately. In forming an insulating film GF in the steps shown in FIGS. 16 and 17, the insulating film GF is formed on the surface of the n well NW and on the surface of the p well PW. By the steps shown in FIGS. 16 and 17, a polysilicon film is formed as a conductive film for gate electrode and the polysilicon film is then patterned to form a gate electrode GE1 and a gate electrode GE2. The gate electrode GE1 is formed on the semiconductor substrate SB (n type well NW) via the insulating film GF and the gate electrode GE2 is formed on the semiconductor substrate SB (p well PW) via the insulating film. GF. When a p⁻ type semiconductor region E1 is formed in the steps shown in FIGS. 18 and 9, not only the p⁻ type semiconductor region E1 but also an n⁻ type semiconductor region E2 is formed. The p⁻ type semiconductor region E1 and the n⁻ type semiconductor region E2 are however different in conductivity type so that an ion implantation step for forming the p⁻ type semiconductor region E1 and an ion implantation step for forming the n⁻ type semiconductor region E2 are performed separately. In forming a sidewall spacer SW in the steps of FIGS. 18 and 19, the sidewall spacer SW is formed on the side wall of the gate electrode GE1 and the side wall of the gate electrode GE2. In forming a p⁺ type semiconductor region H1 in the steps shown in FIGS. 18 and 19, not only the p⁺ type semiconductor region H1 but also an n⁺ type semiconductor region H2 is formed. Since the p⁺ type semiconductor region H1 and the n⁺ type semiconductor region H2 are different in conductivity type, an ion implantation step for forming the p⁺ type semiconductor region H1 and an ion implantation step for forming the n⁺ type semiconductor region H2 are performed separately. In forming a metal silicide layer SL in the steps shown in FIGS. 20 and 21, the metal silicide layer SL is formed on the surface of the gate electrode GE1, the gate electrode GE2, the p⁺ type semiconductor region H1, and the n⁺ type semiconductor region H2. Steps other the above-described ones are essentially similar to those described referring to FIGS. 3 to 21 so that overlapping description is omitted here.

<Second Modification Example>

Figure 28:
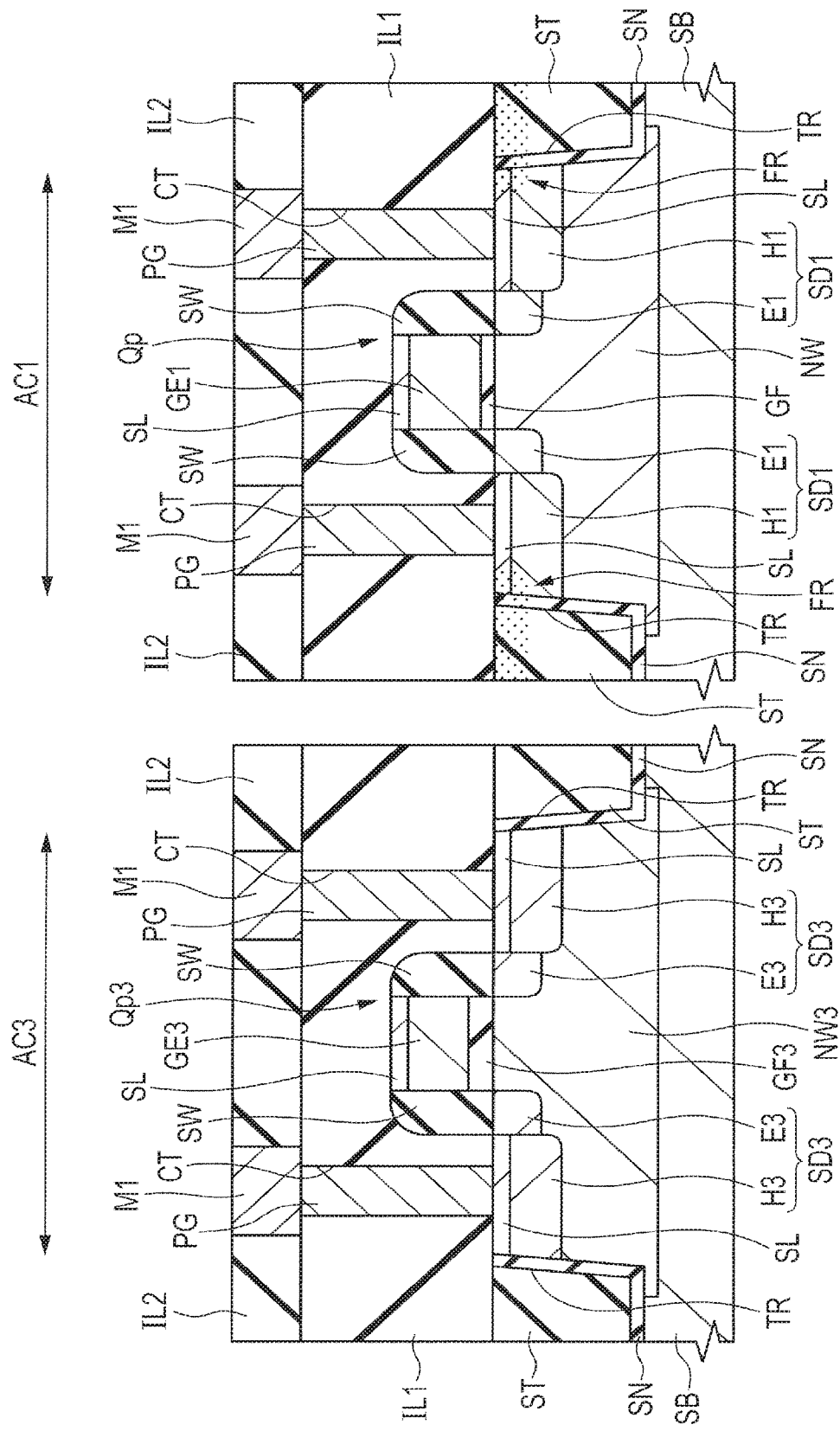
FIG. 28 is a fragmentary cross-sectional view of a semiconductor device of Second Modification Example.
Figure 29:
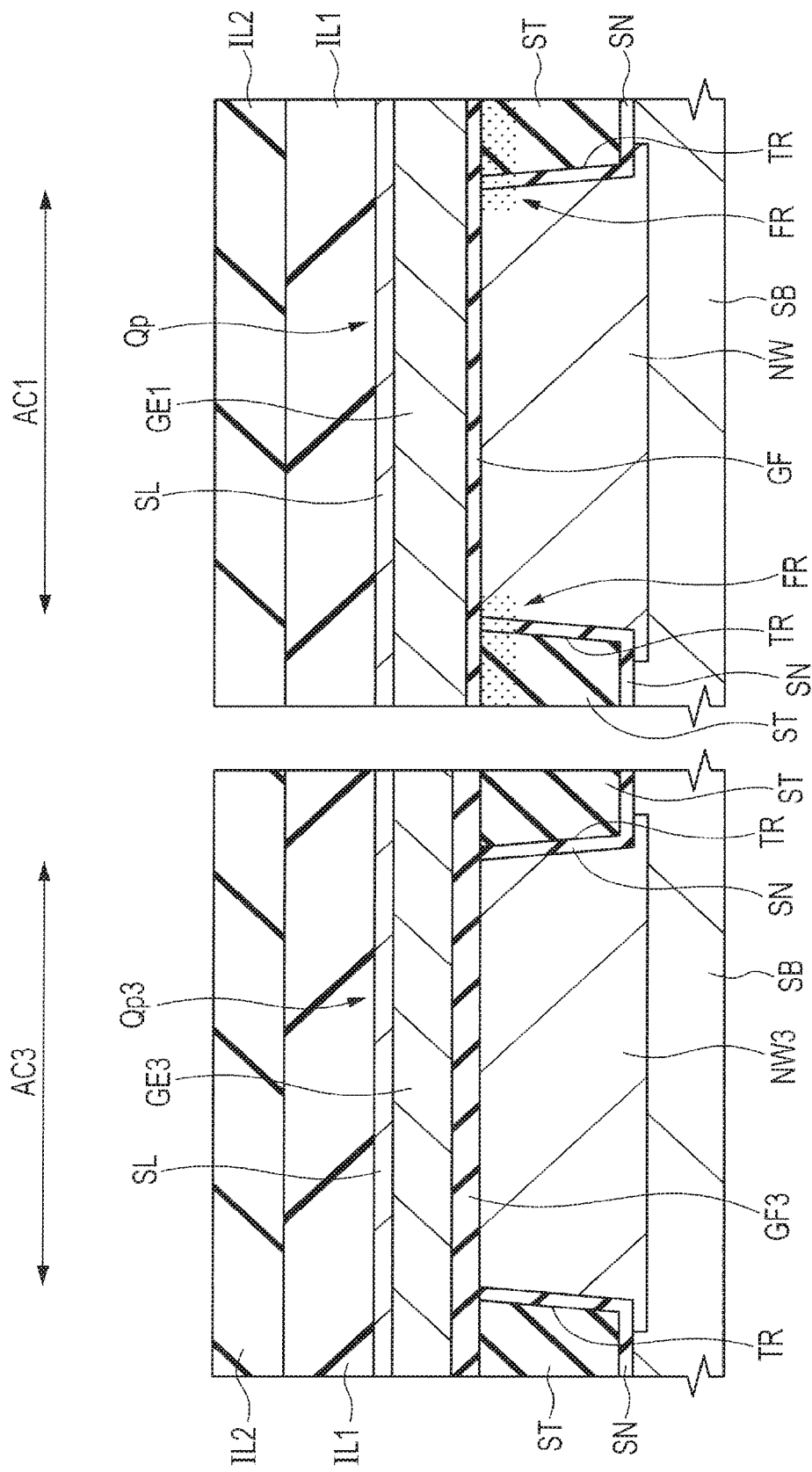
FIG. 29 is another fragmentary cross-sectional view of the semiconductor device of Second Modification Example.

FIGS. 28 and 29 are fragmentary cross-sectional views showing a semiconductor device of Second Modification Example of the present embodiment. FIG. 28 shows, similar to FIG. 26, a cross-section (cross-section along a gate length direction) corresponding to FIG. 3 and FIG. 29 shows, similar to FIG. 27, a cross-section (cross-section along a gate width direction) corresponding to FIG. 4.

The semiconductor device of Second Modification Example shown in FIGS. 28 and 29 has, on the semiconductor substrate SB thereof, a low-breakdown-voltage MISFET and a high-breakdown-voltage MISFET.

This means that the semiconductor device of Second Modification Example shown in FIGS. 28 and 29 has, on the semiconductor substrate SB thereof, an element isolation region ST and active regions AC1 and AC3 surrounded by the element isolation region ST. The active region AC1 has therein a low-breakdown-voltage p channel MISFETQp and the active region AC3 has therein a high-breakdown-voltage p channel MISFETQp3.

The active region AC1, the element isolation region ST surrounding the active region AC1, and the low-breakdown-voltage p channel MISFETQp formed in the active region AC1 are similar to those described above referring to FIGS. 1 to 4 and FIG. 25. Described specifically, the semiconductor substrate SB in the active region has therein an n well NW; the semiconductor substrate SB (n well NW) in the active region AC1 has thereon a gate electrode GE1 via an insulating film GF; and the semiconductor substrate SB (n well NW) in the active region AC1 has therein a source/drain region SD1. The gate electrode GE1 is a gate electrode for low-breakdown-voltage p channel MISFETQp; the insulating film GF below the gate electrode GE1 functions as a gate insulating film for low-breakdown-voltage p channel MISFETQp; and the source/drain region SD1 is a source/drain region for the low-breakdown-voltage p channel MISFETQp.

The active region AC3, the element isolation region ST surrounding the active region AC3, and the high-breakdown-voltage p channel MISFETQp3 formed in the active region AC3 are different in the following points from the active region AC1, the element isolation region ST surrounding the active region AC1, and the low-breakdown-voltage p channel MISFETQp formed in the active region AC1.

Described specifically, the semiconductor substrate SB in the active region AC3 has therein an n well NW3; the semiconductor substrate SB (n well NW3) in the active region AC3 has thereon a gate electrode GE3 via an insulating film GF3; and the semiconductor substrate SB (n well NW3) in the active region. AC3 has therein a source/drain region SD3. The gate electrode GE3 is a gate electrode for high-breakdown-voltage p channel MISFETQp3; the insulating film GF3 below the gate electrode GE3 functions as a gate insulating film for high-breakdown-voltage p channel MISFETQp3; and the source/drain region SD3 is a source/drain region for high-breakdown-voltage p channel MISFETQp3.

The thickness of the gate insulating film (here, the gate insulating film GF3) of the high-breakdown-voltage p channel MISFETQp3 is greater than that of the gate insulating film (here, the gate insulating film GF) of the low-breakdown-voltage p channel MISFETQp. The breakdown voltage of the p channel MISFETQp3 is therefore larger than that of the p channel MISFETQp. An operating voltage of the high-breakdown-voltage p channel MISFETQp3 is greater than that of the low-breakdown-voltage p channel MISFETQp. The high-breakdown-voltage p channel MISFETQp3 is an MISFET used, for example, for I/O circuit (input/output circuit), while the low-breakdown-voltage p channel MISFETQp is an MISFET used, for example, for core circuit (such as control circuit) or SRAM.

The configuration of the n well NW3, the gate electrode GE3, and the source/drain region SD3 is almost similar to the configuration of the n well NW, the gate electrode GE1, and the source/drain region SD1. The source/drain region SD3 is comprised of a p⁻ type semiconductor region E3 corresponding to the p⁻ type semiconductor region E1 and a p⁺ type semiconductor region H3 corresponding to the p⁺ type semiconductor region H1. The p⁺ type semiconductor region H3 has an impurity concentration higher and a junction depth deeper than those of the p⁻ type semiconductor region E3. Similar to a portion of the gate electrode GE1 extending over the element isolation region ST surrounding the active region AC1, a portion of the gate electrode GE extends over the element isolation region ST surrounding the active region AC3.

Not only the gate electrode GE1 but also the gate electrode GE3 has, on the side wall thereof, a sidewall spacer SW. The p⁺ type semiconductor region H1, the p⁺ type semiconductor region H3, the gate electrode GE1, and the gate electrode GE3 each have, on an upper portion thereof, a metal silicide layer. An interlayer insulating film IL1 covers the gate electrodes GE1 and GE3, and the sidewall spacer SW. A contact hole CT and a plug PG buried therein are formed on the p⁺ type semiconductor region Hi, the p⁺ type semiconductor region H3, the gate electrode GE1, the gate electrode GE3, and the like.

Similar to the element isolation region S1 described above referring to FIGS. 1 to 4 and FIG. 25, the element isolation region ST in Second Modification Example shown in FIGS. 28 and 29 is buried in a trench TR formed in the semiconductor substrate SB and it is composed mainly of silicon oxide, more specifically, is comprised of a silicon oxide film buried in the trench TR. The trench TR in the semiconductor substrate SB has a nitrided inner surface (side surface and bottom surface). In this point, the isolation region S1 surrounding the active region AC1 and the element isolation region ST surrounding the active region AC3 are in common. The element isolation region ST surrounding the active region. AC1 and the element isolation region ST surrounding the active region AC3 are therefore in common in that the trench TR filled with the element isolation region ST has, on the inner surface thereof, a nitride layer SN obtained by nitriding the inner surface. The element isolation region ST surrounding the active region AC1 and the element isolation region ST surrounding the active region AC3 can therefore be suppressed or prevented from being re-oxidized and thereby expanding in various steps after formation of the element isolation region ST. This makes it possible to suppress or prevent generation of crystal defects in the semiconductor substrate SB in the active regions AC1 and AC3 which would otherwise be caused by expansion of the element isolation region ST. As a result, the semiconductor device thus manufactured can have improved reliability.

In the semiconductor device of Second Modification Example shown in FIGS. 28 and 29 as in the semiconductor device described above referring to FIGS. 1 to 4 and FIG. 25, a portion of the gate electrode GE1 of the low-breakdown-voltage channel MISFETQp extends over the element isolation region ST and below the gate electrode GET, fluorine (F) is introduced into the vicinity of a boundary between the element isolation region ST and the channel region of the p channel MISFETQp. This makes it possible to suppress or prevent the low-breakdown-voltage p channel MISFETQp from having deteriorated NBTI characteristics and at the same time, suppress or prevent a deterioration degree of the NBTI characteristics from depending on the gate width.

On the other hand, a portion of the gate electrode GE3 of the high-breakdown-voltage p channel MISFETQp3 extends over the element isolation region. ST, but below the gate electrode GE3, fluorine (F) is sometimes introduced and sometimes is not introduced into the vicinity of a boundary between the element isolation region ST and the channel region of the p channel MISFETQp3.

When in the p channel MISFETQp and the p channel MISFETQp3, fluorine (F) is introduced into the vicinity of a boundary between the element isolation region ST and the channel region below the respective gate electrodes (GE1 and GE3), both the low-breakdown-voltage p channel MISFETQp and the high-breakdown-voltage p channel MISFETQp3 can be suppressed or prevented from, having deteriorated. NBTI characteristics. In addition, in both the low-breakdown-voltage p channel MISFETQp and the high-breakdown-voltage p channel MISFETQp3, a deterioration degree of the NBTI characteristics can be suppressed or prevented from depending on the gate width.

In the active region AC3 for high-breakdown-voltage p channel MISFET and the element isolation region ST surrounding the active region, introduction of fluorine (F) into the vicinity of a boundary between the element, isolation region ST and the channel region below the gate electrode GE3 can be prevented. In this case, however, in the active region AC1 for low-breakdown-voltage p channel MISFET and the element isolation region ST surrounding it, fluorine (F) is introduced into the vicinity of a boundary between the element isolation region ST and the channel region below the gate electrode GE1, because deterioration in the NBTI characteristics is likely to become a problem. In the low-breakdown-voltage MISFET than in the high-breakdown-voltage MISFET. It is common that the gate width (channel width) of the high-breakdown voltage MISFET is greater than the gate width (channel width) of the low-breakdown-voltage MISFET. As is apparent from the data of Second Investigation Example in the graph shown in FIG. 24, deterioration in NBTI characteristics due to the nitride layer SN is likely to increase when the gate width is small, but deterioration in NBTI characteristics due to the nitride layer SN relatively decreases with an increase in the gate width. The low-breakdown-voltage MISFET having a small gate width is therefore required to be less deteriorated in NBTI characteristics. The high-breakdown-voltage MISFET having a large gate width, compared with the low-breakdown-voltage one, is not so required to be less deteriorated in NBTI characteristics. The gate width (channel width) of the high-breakdown-voltage p channel MISFETQp3 is greater than the gate width (channel width) of the low-breakdown-voltage p channel MISFETQp.

In Second Modification Example, in the active region AC1 for low-breakdown-Voltage p channel MISFET and the element isolation region ST surrounding it, fluorine (F) is introduced into the vicinity of a boundary between the element isolation region ST and the channel region below the gate electrode GE1. In the active region AC3 for high-breakdown-voltage p channel MISFET and the element isolation region ST surrounding it, it is preferred that no fluorine (F) is introduced into the vicinity of a boundary between the element isolation region ST and the channel region below the gate electrode GE3. In other words, it is prefer red in Second Modification Example, that the configuration described above referring to FIGS. 1 to 4 and FIG. 25 is applied to the low-breakdown-voltage MISFET and the configuration described above referring to Second Investigation Example shown in FIG. 23 is applied to the high-breakdown-voltage MISFET.

Since in the active region AC1 and the element isolation region ST surrounding it, fluorine (F) is introduced into the vicinity of a boundary between the element isolation region ST and the channel region below the gate electrode GE1, the low-breakdown-voltage p channel MISFETQp required to be less deteriorated in NBTI characteristics can be suppressed or prevented from having deteriorated NBTI characteristics. On the other hand, in the high-breakdown-voltage p channel MISFETQp3 not so required to be less deteriorated in NBTI characteristics, fluorine (F) is not introduced into the vicinity of a be between the element isolation region ST and the channel region below the gate electrode GE3 so that a risk of the characteristics of the high-breakdown-voltage p channel MISFETQp3 undergoing an unintentional change due to introduction of fluorine (F) can be avoided. As a result, the semiconductor device thus manufactured can have more properly improved reliability.

Fluorine (F) is ion-implanted by the above ion implantation IM1, with the photoresist pattern PR2 as an ion implantation preventive mask (mask layer). It is recommended to cover the active region AC3 for the high-breakdown-voltage p channel MISFET and the element isolation region ST surrounding it with the photoresist pattern PR2. This makes it possible to prevent fluorine (F) from being ion-implanted by the above ion implantation IM1 into the semiconductor substrate SB in the active region AC3 or in the vicinity of a boundary between the semiconductor substrate SB in the active region AC3 and the element isolation region ST. The semiconductor device thus manufactured can therefore have no fluorine (F) introduced into the vicinity of a boundary between the element isolation region ST and the channel region below the gate electrode GE3.

Of manufacturing steps of the semiconductor device having the low-breakdown-voltage p channel MISFETQp and the high-breakdown-voltage p channel MISFETQp3, a gate insulating film formation step can be performed as follows. Described specifically, in the steps shown in FIGS. 16 and 17, after formation of n wells NW and NW3 by ion implantation, an insulating film GF3 is formed on the surface of the n well NW and on the surface of the n well NW3 by thermal oxidation or the like, the insulating film GF3 is removed from the surface of the n well NW, while leaving the insulating film GF3 on the surface of the n well NW3. Then, an insulating film GF is formed on the surface of the n well NW by thermal oxidation or the like. During the thermal oxidation for forming the insulating film OF, the thickness of the insulating film GF3 on the surface of the n well NW3 increases. In such a manner, a structure is obtained in which the semiconductor substrate SB (n well NW) in the active region AC1 has thereon the insulating film GE and the semiconductor substrate SB (on the n well NW3) in the active region AC3 has thereon the insulating film GF3 thicker than the insulating film GF.

The steps of forming the high-breakdown-voltage p channel MISFETQp3 are essentially similar to the steps of forming the low-breakdown-voltage p channel MISFETQp except for the gate insulating film formation step.

Described specifically, in forming the n well NW by the step shown in FIGS. 16 and 17, not only the n well NW but also the n well NW3 is formed. By the step shown in FIGS. 16 and 17, the gate electrodes GE1 and GE3 are formed by forming a polysilicon film as a gate electrode conductive film and then patterning the polysilicon film. The gate electrode GE1 is formed on the semiconductor substrate SB (n well NW) via the insulating film GF and the gate electrode GE3 is formed on the semiconductor substrate SB (n well NW3) via the insulating film GE3. In forming the p$^-$ type semiconductor region E1 by the step shown in FIGS. 18 and 19, not only the p$^-$ type semiconductor region E1 but also the p$^-$ type semiconductor region E3 is formed. In forming the sidewall spacer SW by the step shown in FIGS. 18 and 19, the sidewall spacer SW is formed on the side wall of the crate electrode GE1 and the side wall of the gate electrode GE3. In forming the p$^+$ type semiconductor region H1 by the steps shown in FIGS. 18 and 19, not only the p$^+$ type semiconductor region H1 but also the p$^+$ type semiconductor region H3 is formed. In forming the metal suicide layer SL by the steps shown in FIGS. 20 and 21, the metal suicide layer SL is formed on the surfaces of the gate electrode GE1, the gate electrode GE3, the p$^+$ type semiconductor region H1, and the p$^+$ type semiconductor region H3. Steps other than those described above are essentially similar to the manufacturing steps described above referring to FIGS. 3 to 21 so that an overlapping description is omitted here.

(Second Embodiment)
<Structure of Semiconductor Device>

Figure 30:
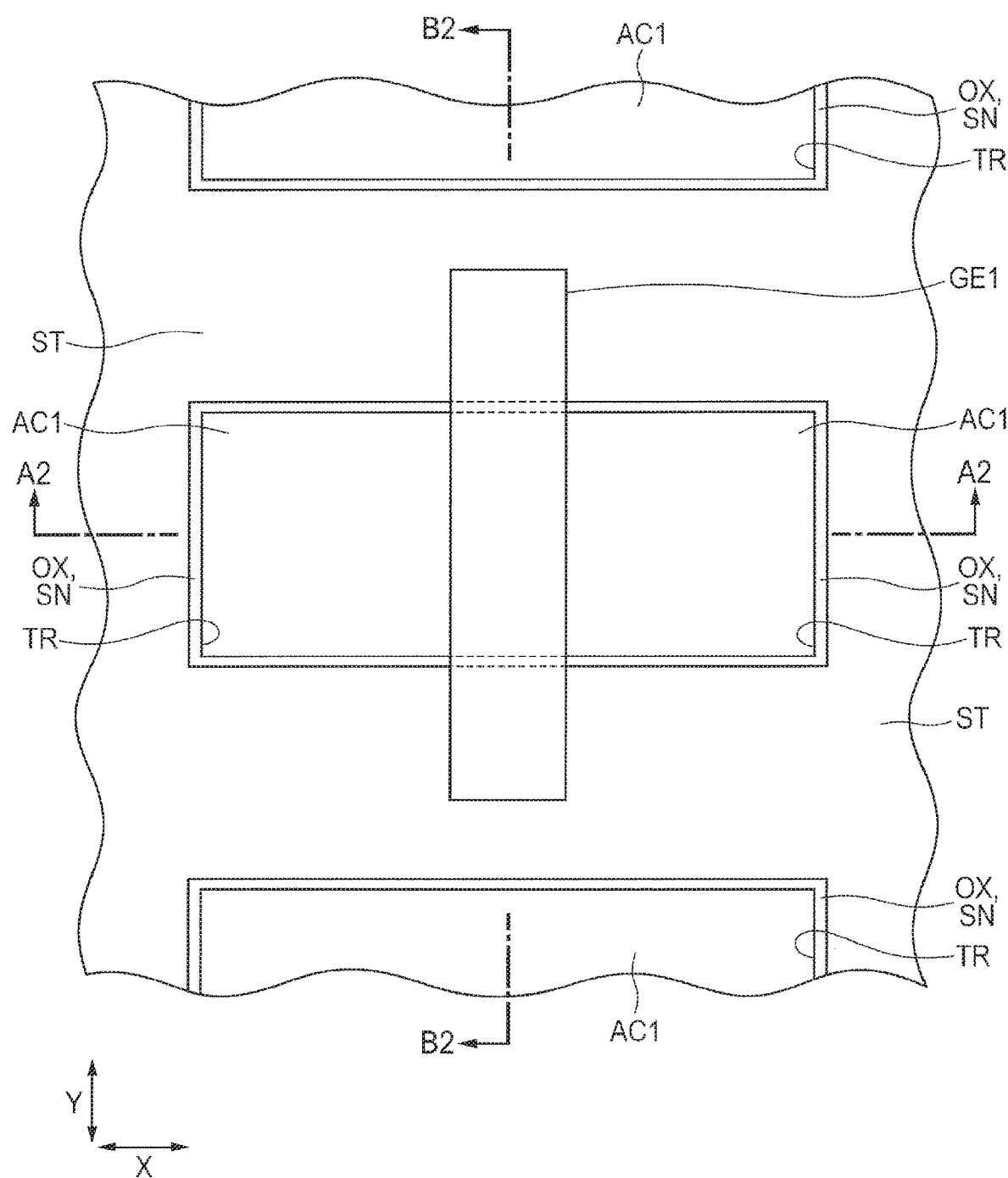
FIG. 30 is a fragmentary plan view of a semiconductor device of Second Embodiment.
Figure 31:
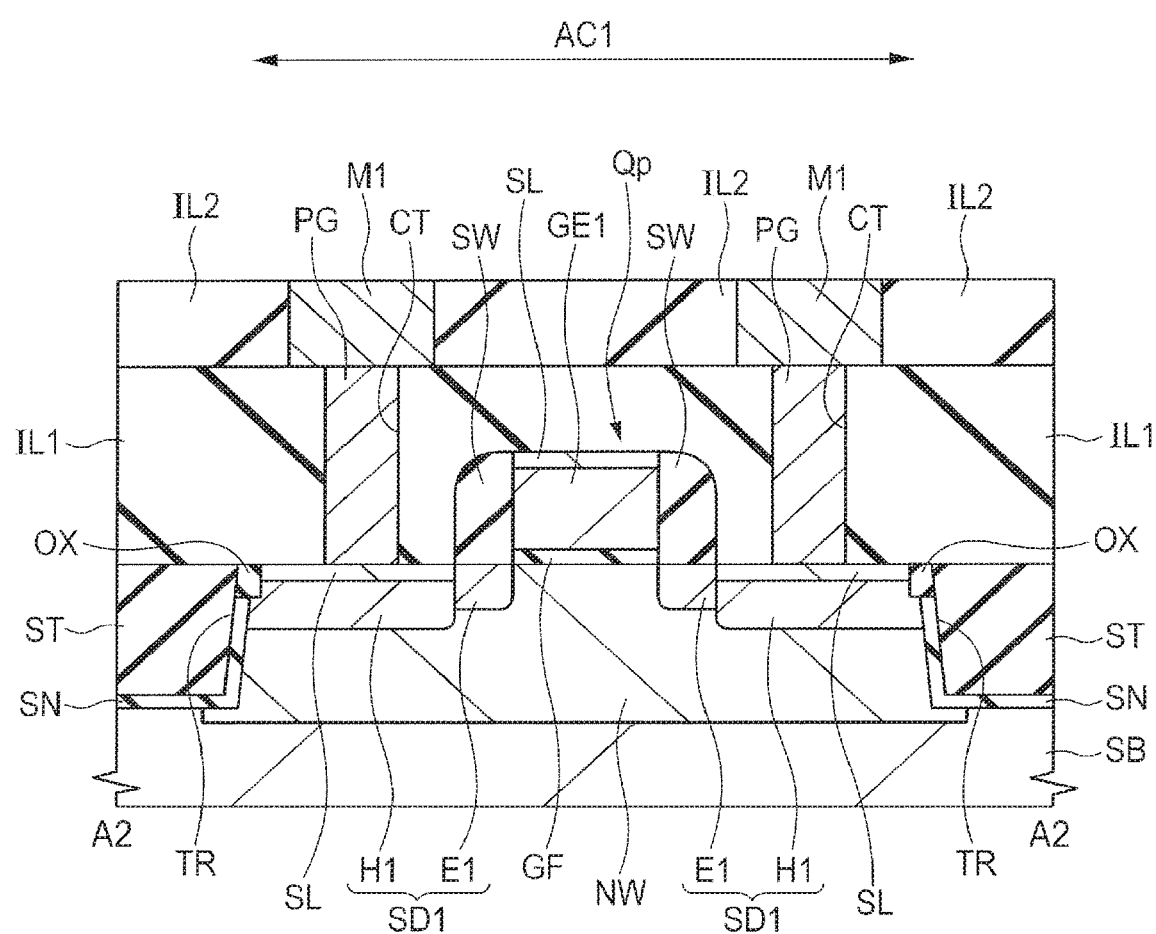
FIG. 31 is a fragmentary cross-sectional view of the semiconductor device of Second Embodiment.
Figure 32:
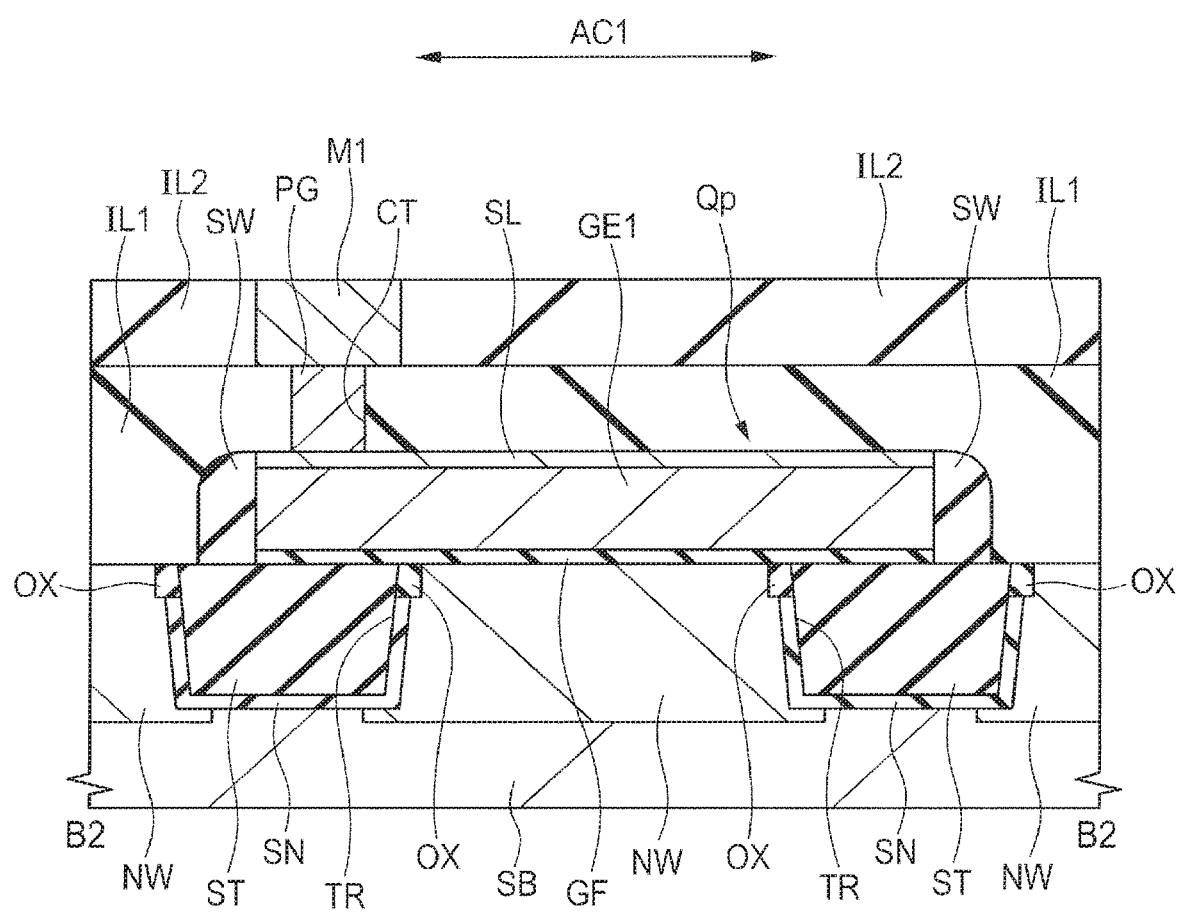
FIG. 32 is another fragmentary cross-sectional view of the semiconductor device of Second Embodiment.

The semiconductor device of Second Embodiment will be described referring to some drawings. FIG. 30 is a fragmentary plan view of the semiconductor device of the present embodiment; and. FIGS. 31 and 32 are fragmentary cross-sectional views of the semiconductor device of the present embodiment. FIGS. 30 to 32 correspond no FIGS. 1, 3, and 4 of First Embodiment, respectively. Therefore, the cross-sectional view taken along the line A2-A2 of FIG. 30 substantially corresponds to FIG. 31 and the cross-sectional view taken along the line B2-B2 of FIG. 30 substantially corresponds to FIG. 32.

The semiconductor device of Second Embodiment shown in FIGS. 30 and 31 is different from the semiconductor device of First Embodiment in the following point.

This means that in the semiconductor device of Second Embodiment, fluorine (F) is not introduced into the vicinity of a boundary between the element isolation region ST and the semiconductor substrate SB in the active region AC1. In other words, the semiconductor device of Second Embodiment does not have therein a region corresponding to the fluorine implanted region FR. The manufacturing steps of the semiconductor device of Second Embodiment therefore do not include a step corresponding to the ion implantation IM1.

In the semiconductor device of Second Embodiment, the trench TR in the semiconductor substrate SB has a nitride layer SN obtained by nitridinq the inner surface of the trench, but has no nitride layer SN at a boundary between the upper portion of the semiconductor substrate SB in the active region AC1 and the upper portion of the element isolation region ST. This means that in the semiconductor device of Second Embodiment, the trench TR does not have the nitride layer SN on the upper portion of the side surface of the trench TR but has it in the other region of the inner surface (side surface and bottom surface) of the trench TR.

More specifically, the upper portion (portion adjacent to the upper portion of the side surface of the trench TR) of the nitride layer SN formed on the inner surface (side surface and bottom surface) of the trench TR is oxidized into an oxidation portion OX.

The other configuration of the semiconductor device of Second Embodiment is essentially similar to that of the semiconductor device of First Embodiment so that an overlapping description is omitted here.

<Manufacturing Steps of Semiconductor Device>

Next, manufacturing steps of the semiconductor device of Second Embodiment will be described.

Figure 33:
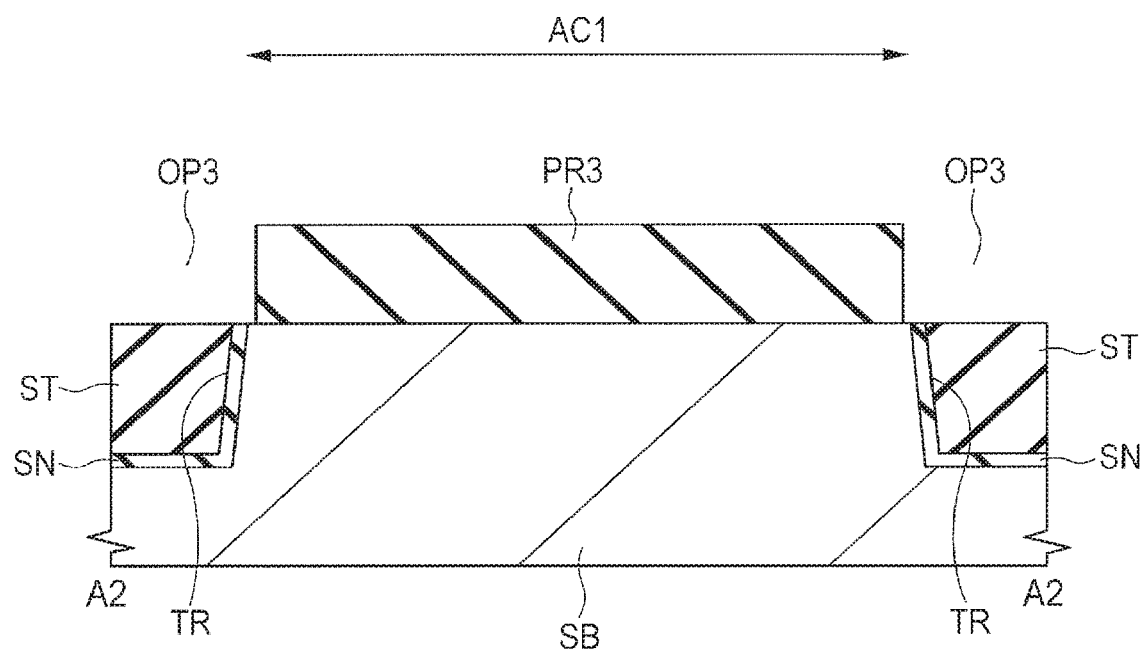
FIG. 33 is a fragmentary cross-sectional view of the semiconductor device of Second Embodiment during a manufacturing step thereof.
Figure 34:
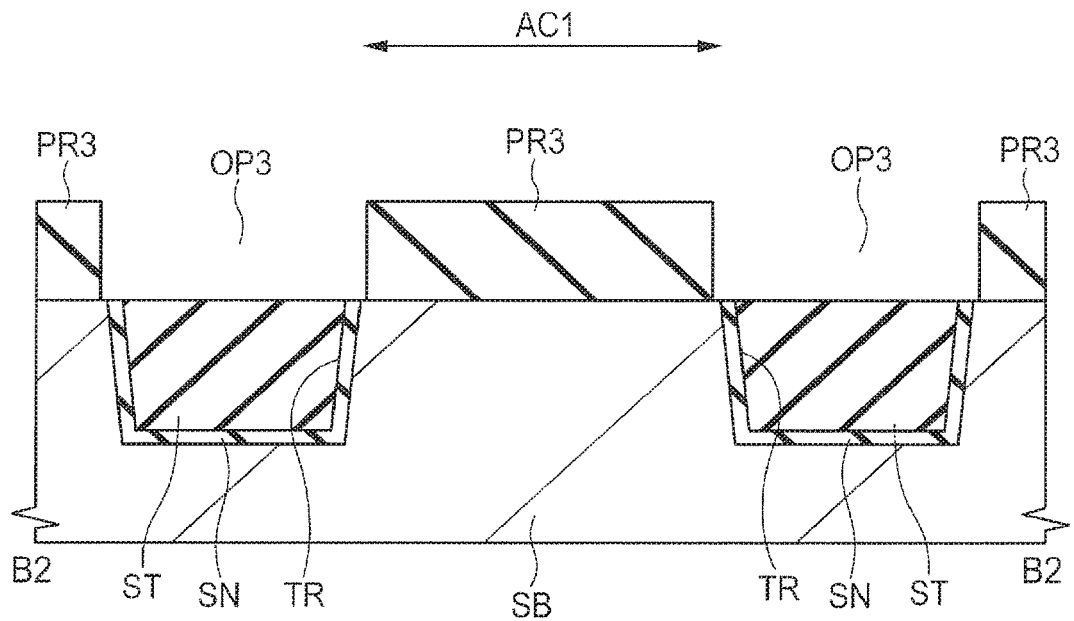
FIG. 34 is a fragmentary cross-sectional view of the semiconductor device during a manufacturing step similar to that of FIG. 33.
Figure 35:
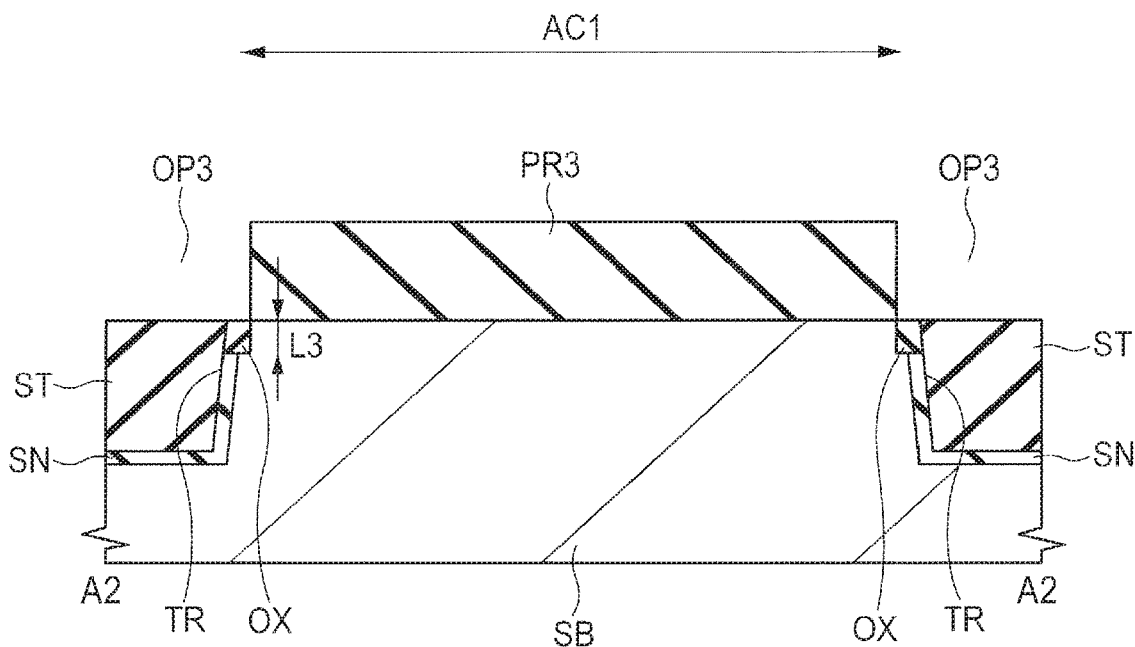
FIG. 35 is a fragmentary cross-sectional view of the semiconductor device during a manufacturing step following that of FIG. 33.

FIGS. 33 to FIG. 38 are fragmentary cross-sectional views of the semiconductor device of Second Embodiment during manufacturing steps thereof, in which FIGS. 33, 35, and. 37 show cross-sections corresponding to FIG. 31, that is, cross-sections at a position corresponding to the line A2-A2 of FIG. 30 and FIGS. 34, 36, and 38 show cross-sections corresponding to FIG. 32, that is, cross-sections at a position corresponding to the line B2-B2 of FIG. 30.

The manufacturing steps of the semiconductor device of Second Embodiment are similar to those of First Embodiment until the structure shown in FIGS. 11 and 12 is obtained so that an overlapping description is omitted here.

The structure shown in FIGS. 11 and 12 is obtained in a manner similar to that described in First Embodiment. In Second Embodiment, a photoresist layer is then applied to the main surface (entire main surface) of the semiconductor substrate SB, followed by exposure and development of the resulting photoresist layer to form a photoresist pattern (resist pattern, resist layer, mask layer) PR3 as a mask layer on the semiconductor substrate SB as shown in FIGS. 33 and 34.

An opening portion OP3 of the photoresist pattern PR3 has a planar shape and size slightly greater than those of the opening portion OP1 of the photoresist pattern PR1. In plan view, therefore, the opening portion OP3 of the photoresist pattern PR3 embraces the element isolation region ST and has a planar shape and size slightly greater than those of the element isolation region ST. The planar shape and size of the opening portion OP3 are preferably set so that the element isolation region ST buried in the trench TR in the semiconductor substrate SB and the nitride layer SN formed on the inner surface of the trench TR in the semiconductor substrate SB are just exposed from the opening portion OP3 of the photoresist pattern PR3. This means that it is preferred to expose the element isolation region ST and the nitride layer SN from the opening portion OP3 of the photoresist pattern PR3 and prevent exposure of the semiconductor substrate SB in the active region (AC1) to the utmost.

Figure 36:
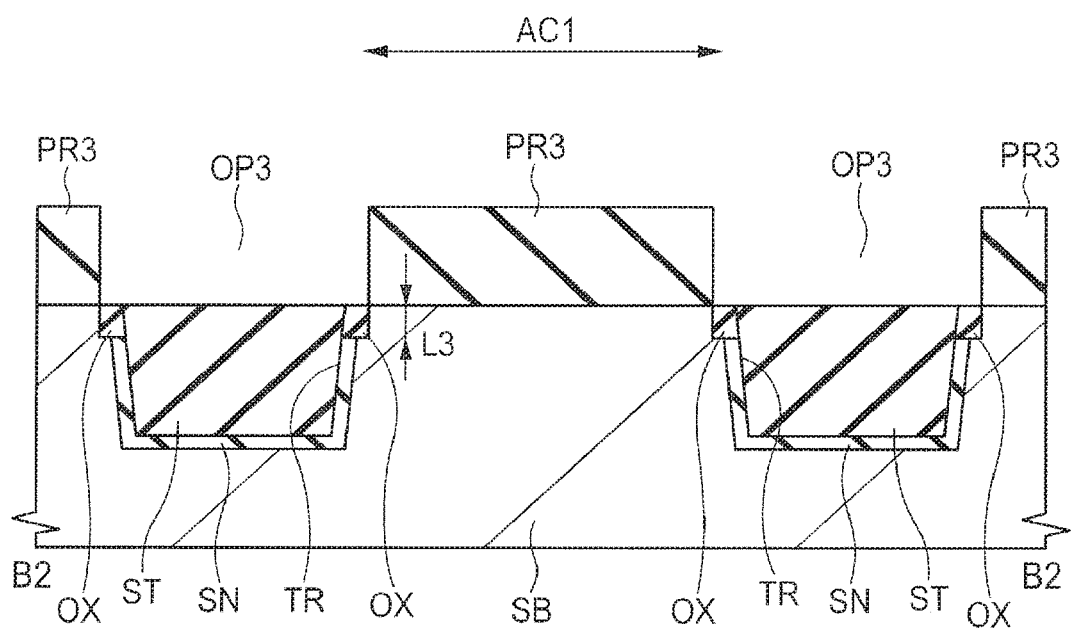
FIG. 36 is a fragmentary cross-sectional view of the semiconductor device during a manufacturing step similar to that of FIG. 35.

Next, an oxidation portion OX is formed as shown in FIGS. 35 and 36 by subjecting the semiconductor substrate SB to oxidation treatment to oxidize the upper portion of the nitride layer SN present between the semiconductor substrate SB in the active region (AC1) and the element isolation region ST. The above oxidation treatment will hereinafter be dallied "oxidation treatment of FIGS. 35 and 36". The oxidation treatment of FIGS. 35 and 36 is preferably thermal oxidation, with wet oxidation being particularly preferred. The oxidation portion OX is composed mainly of silicon oxide.

Before oxidation treatment of FIGS. 35 and 36, the trench TR in the semiconductor substrate SB has, on an inner surface (side surface and bottom surface) thereof, the nitride layer SN, but by the oxidation treatment of FIGS. 35 and 36, the upper portion (portion adjacent to the upper portion of the side surface of the trench TR) of she nitride layer SN formed on the inner surface (side surface and bottom surface) of the trench TR. is oxidized into an oxidation portion OX, while the other portion of the nitride layer SN remains as is. This means that the nitride layer SN is formed on the inner surface (side surface and bottom surface) of the trench TR; and a portion of the nitride layer SN formed on the upper portion of the side surface of the trench TR is oxidized by the oxidation treatment of FIGS. 35 and 36 into an oxidation portion OX, while the other portion of the nitride layer SN remains without being oxidized. In short, a portion of the nitride layer SN sandwiched between the upper portion of the semiconductor substrate SB in the active region (AC1) and the upper portion of the element isolation region ST is oxidized by the oxidation treatment of FIGS. 35 and 36 into the oxidation portion OX.

When viewed in the depth direction, a size L3 of a region of the nitride layer SN formed on the side surface of the trench TR and becoming the oxidation portion OX by oxidation treatment of FIGS. 35 and 36, that is, a size L3 of the oxidation portion OX thus formed can be set at, for example, from about 1 to 10 nm. The size L3 is a depth-direction size, that is, a size (thickness, depth) in a direction substantially perpendicular to the main surface of the semiconductor substrate SB. By the oxidation treatment of FIGS. 35 and 36, of the nitride layer SN present on the entire inner surface of the trench TR, a portion of the nitride layer SN having a depth corresponding to the size L3 from the main surface of the semiconductor substrate SB is oxidized into the oxidation portion OX and the other portion of the nitride layer SN extending in a region deeper than the size L3 remains as the nitride layer SN without being oxidized.

The oxidation treatment of FIGS. 35 and 36 is treatment for oxidizing the upper portion of the nitride layer SN at a boundary between the element isolation region ST and the semiconductor substrate SB in the active region (AC1) surrounded by the element isolation region ST. In other words, the oxidation treatment of FIGS. 35 and 36 is treatment for oxidizing, of the nitride layer SN formed on the inner surface (side surface and bottom surface) of the trench TR, a portion of the nitride layer SN formed on the upper portion of the side surface of the trench TR and thereby converting it into the oxidation portion OX. Before the oxidation treatment of FIGS. 35 and 36, the trench TR has, on the entire inner surface thereof, the nitride layer SN, but after the oxidation treatment of FIGS. 35 and 36, the trench TR has, on the upper portion of the side surface thereof, no nitride layer SN. The oxidation treatment of FIGS. 35 and 36 can therefore also be regarded as treatment of removing the nitride layer SN on the upper portion of the side surface of the trench TR.

Figure 37:
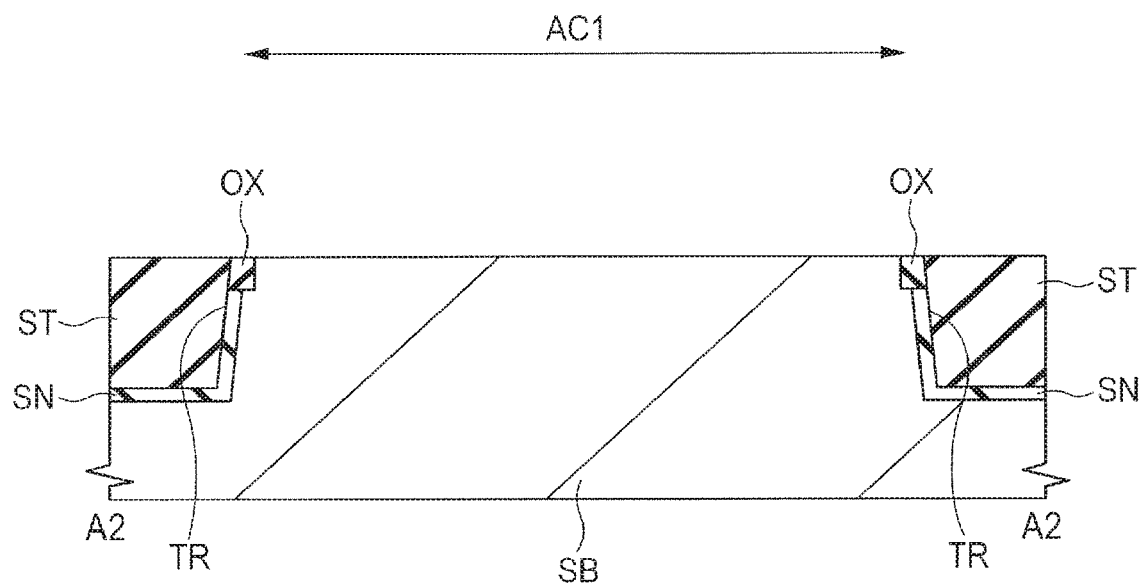
FIG. 37 is a fragmentary cross-sectional view of the semiconductor device during a manufacturing step following than of FIG. 35.
Figure 38:
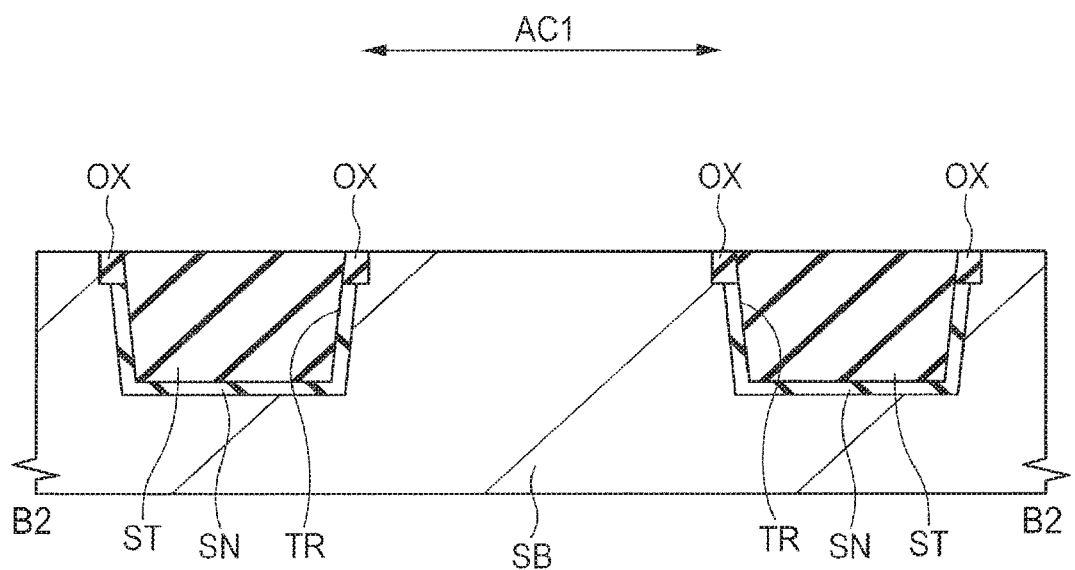
FIG. 38 is a fragmentary cross-sectional view of the semiconductor device during a manufacturing step similar to that of FIG. 37.

After the oxidation treatment of FIGS. 35 and 36, as shown in FIGS. 37 and 38, the photoresist pattern PR3 is removed. After removal of the photoresist pattern PR3, washing treatment can be performed. This washing treatment may etch the surface layer portion of the element isolation region ST or a portion of the oxidation portion OX. The photoresist pattern PR3 may be replaced by a hard mask (mask layer using an insulating film pattern). In this case, the formation position of the opening portion OP3 in the hard mask is as described above.

Next, also in Second Embodiment, an n well NW formation step and steps thereafter are performed as in First Embodiment without the ion implantation IM1 (fluorine ion implantation). Illustration and overlapping description of them will be omitted here.

<Main Characteristics and Advantages>

The semiconductor device of Second Embodiment has the semiconductor substrate SB, the element isolation region ST buried in the trench TR formed in the semiconductor substrate SB, a gate electrode GE1 formed, via a gate insulating film GF (first gate insulating film), on the semiconductor substrate SB in the active region AC1 (first active region) surrounded by the element is region ST, and a source/drain region formed in the semiconductor substrate SB in the active region AC1.

The gate electrode GE1 (first gate electrode) is a gate electrode for MISFETQp (first MISFET), the gate insulating film GF ((first gate insulating film) below the gate electrode GE1 functions as a gate insulating film for MISFETQp (first MISFET), and the source/drain region SD1 (first source/drain region) is a source/drain region for MISFETQp (first MISFET). The element isolation region ST is composed mainly of silicon oxide, more specifically, is comprised of a silicon oxide film buried in the trench TR.

One of the main characteristics of Second Embodiment is that the trench TR of the semiconductor substrate has, on the inner surface (side surface and bottom surface) thereof, a nitride layer SN obtained by nitriding the inner surface.

The nitride layer thus formed can suppress or prevent the element isolation region ST buried in the trench TR from being re-oxidized and thereby expanding in various steps performed after formation of the element isolation region ST. For example, it can suppress or prevent the element isolation region ST buried in the trench TR from expanding in the thermal oxidation step for forming an insulating film (corresponding to the insulating film GF) for gate insulating film. Generation of defects in the semiconductor substrate in the active region due to expansion of the element isolation region ST can therefore be suppressed or prevented so that the semiconductor device thus manufactured can have improved reliability.

The other one of the main characteristics of Second Embodiment is that a portion of the gate electrode GE1 extends over the element isolation region ST and no nitride layer SN is formed at a boundary between the upper portion of the semiconductor substrate SE in the active region AC1 and the upper portion of the element isolation region ST. This makes it possible to suppress or prevent deterioration in NBTI characteristics and the semiconductor device thus obtained can have improved reliability. This will be described more specifically.

As described above in First Embodiment, when a gate electrode extends over not only a semiconductor substrate in an active region but also an element isolation region surrounding the active region, a nitride layer formed by nitriding the entire inner surface in the element isolation trench is likely to affect the NBTI characteristics because the nitride layer is close to a gate insulating film or channel region of MISFET. In the semiconductor device of Second Investigation Example shown in FIG. 23, the nitride layer SN is near the gate insulating film or channel region of the MISFET so that the nitride layer SN adversely affects the NBTI characteristics of the MISFET and enhances deterioration in NBTI characteristics. The degree of deterioration in NBTI characteristics depends on the gate width so that with a decrease in the gate width, the p channel MISFET is presumed to have severely deteriorated NBTI characteristics.

In the semiconductor device of Second Investigation Example shown in FIG. 23, a region, of the nitride layer SN formed on the inner surface of the trench TR in the semiconductor substrate SB, close to the gate insulating film or channel region of the MISFET has a large influence on the deterioration in NBTI characteristics. In short, a portion of the nitride layer formed on the upper portion of the side surface of the trench TR has a large influence. Compared with a portion of the nitride layer SN formed on the upper portion of the side surface of the trench TR, a portion of the nitride layer SN formed on the lower portion of the side surface of the trench TR or on the bottom surface of the trench TR has a relatively small influence on the deterioration in NBTI characteristics because it is distant from the gate insulating film or channel region of the MISFET.

In the semiconductor device of Second Embodiment, on the other hand, the nitride layer SN is not formed at a boundary between the upper portion of the semiconductor substrate SB in the active region AC1 and the upper portion of the element isolation region ST. This means that on the inner surface (side surface and bottom surface) of the trench TR in the semiconductor substrate SB, the nitride layer SN is not formed on the upper portion of the side surface of the trench TR. More specifically, the upper portion (portion adjacent to the upper portion of the side surface of the trench TR) of the nitride layer SN formed on the inner surface (side surface and bottom surface) of the trench TR is oxidized into an oxidation portion OX.

A portion of the nitride layer SN in the semiconductor device of Second Investigation. Example shown in FIG. 23 which is likely to have a large influence on the deterioration in NBTI characteristics, that is, a portion of the nitride layer SN formed on the upper portion of the side surface of the trench TR is oxidized into an oxidation portion OX by the oxidation treatment shown in FIGS. 35 and 36. The other portion of the nitride layer SN, that is, a portion of the nitride layer SN formed on the inner surface of the trench TR except for the upper portion of the side surface is left as is in Second Embodiment.

In Second Embodiment, the nitride layer SN formed on the entire inner surface of the trench TR in the semiconductor substrate SB causes deterioration in NBTI characteristics so that the nitride layer SN is not formed on the upper portion of the side surface of the trench TR where an influence on the deterioration in NBTI characteristics is likely to become large, compared with another portion of the inner surface of the trench TR in the semiconductor substrate SB. In the semiconductor device of Second Embodiment, compared with the semiconductor device of Second Investigation Example shown in FIG. 23 having the nitride layer SN on the entire inner surface of the trench TR in the semiconductor substrate SB, deterioration in NBTI characteristics can be suppressed or prevented and in addition, dependence of the deterioration degree of NBTI characteristics on the gate width can be suppressed or prevented. The semiconductor device having such a structure can therefore have improved reliability.

In Second Embodiment, the nitride layer SN is not formed at boundary between the upper portion of the semiconductor substrate SB in the active region AC1 and the upper portion of the element isolation region ST in order to suppress or prevent deterioration in NBTI characteristics. In Second investigation. Example, as described above, a portion of the nitride layer SN formed on the inner surface of the trench TR in the semiconductor substrate SB and likely to contribute to deterioration in NBTI characteristics is near the gate insulating film or channel region of the MISFET. In short, it is the nitride layer SN present in the vicinity of a boundary between the element isolation region ST and the channel region below the gate electrode GE1. It is therefore important not to form the nitride layer SN, which is at a boundary between the upper portion of the semiconductor substrate SB in the active region AC1 and the upper portion of the element isolation region ST, in a region below the gate electrode GE1 (that is, a region overlapping with the gate electrode GE1 in plan view). This means that not forming the nitride layer SN at a boundary between the upper portion of the semiconductor substrate SB in the active region AC1 and the upper portion of the element isolation region ST in a region below the gate electrode GE1 (that is, a region overlapping with the gate electrode GE1 in plan view) is particularly effective for suppressing or preventing deterioration in NBTI characteristics due to the nitride layer SN.

In Second Embodiment, therefore, it is also possible not to form the nitride layer SN at a boundary between the upper portion of the semiconductor substrate SB in the active region AC1 and the upper portion of the element isolation region ST, in the entire outer periphery of the active region AC1. In this case, in the entire outer periphery of the active region AC1, the trench TR surrounding the active region AC1 has, on the lower portion of the side surface and the bottom surface thereof, the nitride layer SN, but the trench TR does not have, on the upper portion of the side surface thereof, the nitride layer SN. In Second Embodiment, it is also possible to avoid, only in a region in the periphery of the active region AC1 and at the same time, below the gate electrode GE1 (that is, a region overlapping with the gate electrode GE1 in plan view), forming the nitride layer SN at a boundary between the upper portion of the semiconductor substrate SB in the active region AC1 and the upper portion of the element isolation region ST. In this case, the gate electrode GE1 has, in a region therebelow, the nitride layer SN on the lower side surface and the bottom surface of the trench TR, but does not have the nitride layer SN on the upper portion of he side surface of the trench TR. In a region not overlapping with the gate electrode GE1 in plan view, the trench TR has the nitride layer SN on the entire side surface and the bottom surface thereof.

In Second Embodiment, therefore, the trench TR has the nitride layer SN obtained by nitriding the inner surface thereof, but the nitride layer SN is not formed, in ate, least a region below the gate electrode GE1 (that is, a region overlapping with the gate electrode GE1 in plan view), at a boundary between the upper portion of the semiconductor substrate SB in the actives region AC1 and the upper portion of the element isolation region ST. This means that the trench TR has the nitride layer SN obtained by nitriding the inner surface thereof but the nitride layer SN is not formed, in at least a region below the gate electrode GE1 (that is, a region overlapping with the gate electrode GE1 in plan view), on the upper portion of the side surface of the trench TR. As a result, the MISFET(Qp) thus obtained can be suppressed or prevented from having deteriorated NBTI characteristics.

In First Embodiment, fluorine can be introduced only into a region hatched with dots in FIG. 25, while in Second Embodiment, an upper portion of the nitride layer SN can also be oxidized into the oxidation portion OX only in a region hatched with dots in FIG. 25.

In either Second Embodiment or First Embodiment, generation of crystal defects in the semiconductor substrate SB in the active region due so expansion of the element isolation region ST can be suppressed or prevented and in addition, deterioration in NBTI characteristics can be suppressed or prevented. As a result, the semiconductor device thus obtained can have improved reliability.

When Second Embodiment and First Embodiment are compared, however, First Embodiment is advantageous over Second Embodiment from the standpoint of preventing as much as possible generation of crystal defects in the semiconductor substrate SB in the active region due to expansion of the element isolation region ST. The semiconductor device of Second Embodiment does not have the nitride layer SN on the upper portion of the side surface of the trench TR in the semiconductor substrate SB, while the semiconductor device of First Embodiment has the nitride layer SN also on the upper portion of the side surface of the trench TR in the semiconductor substrate SB and therefore has the nitride layer SN on the entire inner surface of the trench TR in the semiconductor substrate SB. In First Embodiment, since the trench TR in the semiconductor substrate SB has, oh the entire inner surface thereof, the nitride layer SN, the element isolation region ST can be suppressed or prevented more properly from being re-oxidized and thereby expanding.

In Second Embodiment, on the other hand, it is not necessary to introduce (implant) fluorine (F) for preventing deterioration in NBTI characteristics into the semiconductor substrate SB so that a risk of the characteristics of MISFET undergoing an unintentional change due to introduction of fluorine (F) can be avoided.

<Third Modification Example>

Next, a modification example (application example) of Second Embodiment will be described.

Figure 39:
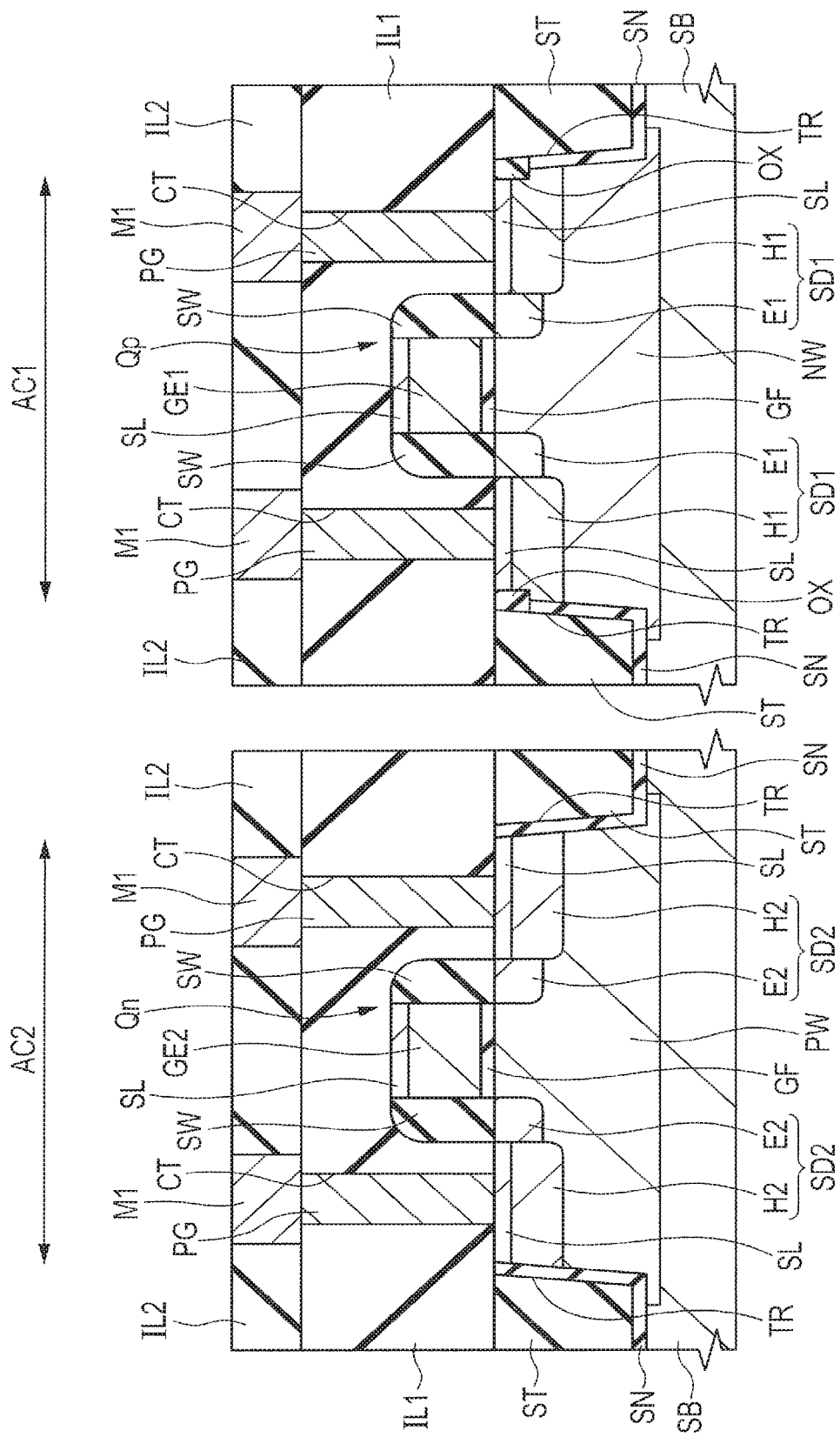
FIG. 39 is a fragmentary cross-sectional view of a semiconductor device of Third Modification Example.
Figure 40:
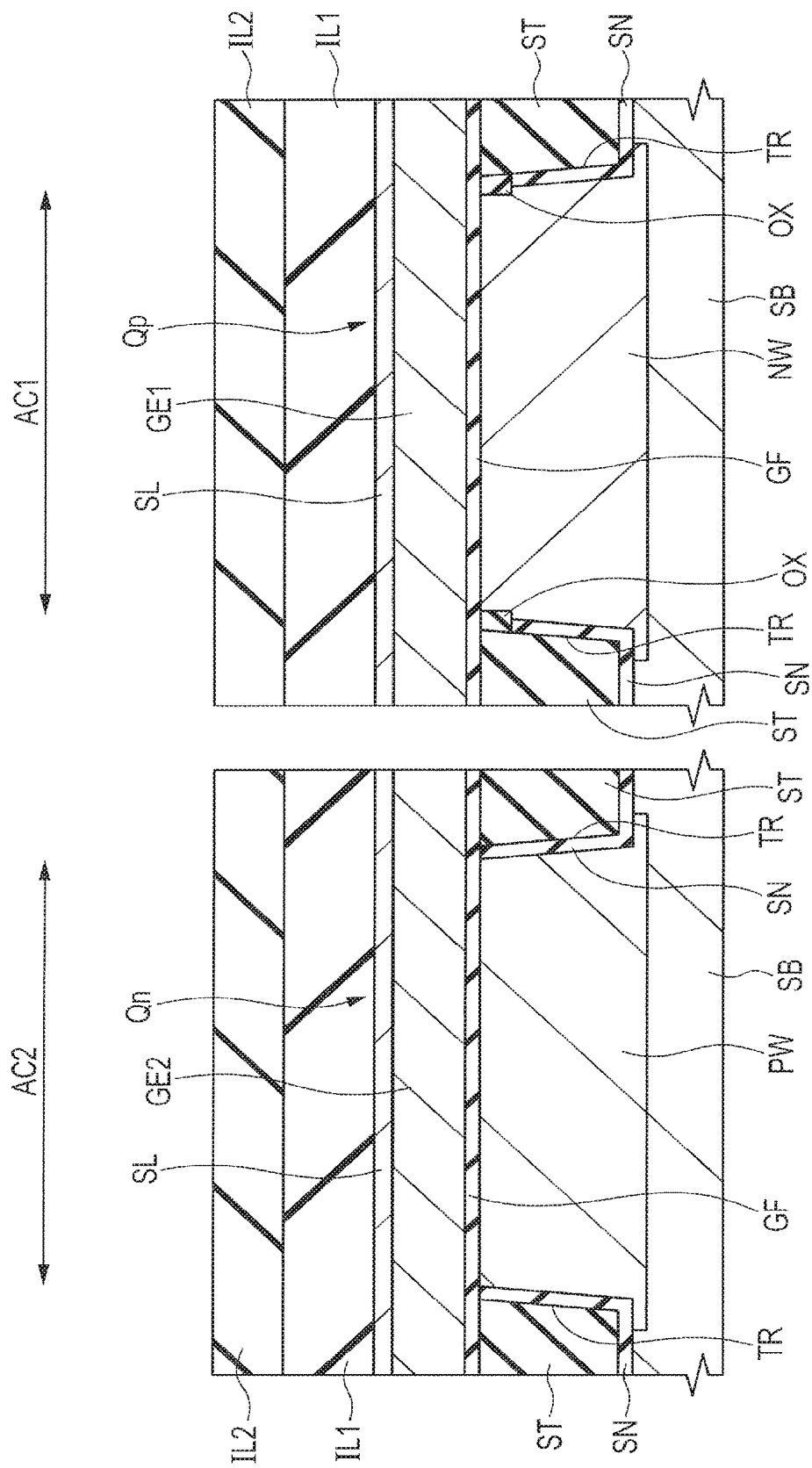
FIG. 40 is another fragmentary cross-sectional view of the semiconductor device of Third Modification Example.

FIGS. 39 and 40 are fragmentary cross-sectional views showing a semiconductor device of Third Modification Example of Second Embodiment, in which FIG. 39 shows a cross-section (cross-section along a gate length direction) corresponding to FIG. 31, and FIG. 40 shows a cross-section (cross-section along a gate width direction) corresponding to FIG. 32.

Similar to the semiconductor device of First Modification Example of First Embodiment shown in FIGS. 26 and 27, the semiconductor device of Third Modification Example of Second Embodiment shown in FIGS. 39 and 40 has, on a semiconductor substrate SB, both a p channel MISFET and an n channel MISFET.

The semiconductor device of Third Modification Example of Second Embodiment shown in FIGS. 39 and 40 is different in the following points from the semiconductor device of First Modification Example of First Embodiment shown in FIGS. 26 and 27.

The semiconductor device of Third Modification Example of Second Embodiment shown in FIGS. 39 and 40 does not have fluorine (F) in the vicinity of a boundary between the element isolation region ST and the semiconductor substrate SB in the active regions AC1 and AC2. In short, the semiconductor device of Third Modification Example does not have a region corresponding to the fluorine implanted region FR. Manufacturing steps of the semiconductor device of Third Modification Example therefore do not include a step corresponding to the above-described ion implantation IM1.

In addition, the semiconductor device of Third Modification Example of Second Embodiment has a nitride layer obtained by nitriding the inner surface of the trench TR in the semiconductor substrate SB, but does not have the nitride layer SN at a boundary between the upper portion of the semiconductor substrate SB in the active region. AC1 and the upper portion of the element isolation region ST. In other words, the semiconductor device of Third Modification Example of Second Embodiment does not have the nitride layer SN on the upper portion of the side surface of the trench TR on the side adjacent to the semiconductor substrate SB in the active region AC1 but has it in the other region of the inner surface (side surface and bottom surface) of the trench TR surrounding the active region AC1. More specifically, the upper portion of the nitride layer SN formed on the side surface of the trench TR on the side adjacent to the semiconductor substrate SB in the active region AC1 is oxidized into an oxidation portion OX. This means that also in Third Modification Example, the nitride layer SN present between the element isolation region ST surrounding the active region AC1 and the semiconductor substrate SB in the active region AC1 has a configuration similar to that of the nitride layer SN present between the element isolation region ST surrounding the active region AC1 and the semiconductor substrate SB the active region AC1 as shown above in FIGS. 30 to 32.

The other configuration of the semiconductor device of Third Modification Example of Second Embodiment is essentially similar to that of First Modification Example of First Embodiment so that an overlapping description is omitted here.

The semiconductor device of Third Modification Example shown in FIGS. 39 and 40 has the nitride layer SN obtained by nitriding the inner surface of the trench TR in the semiconductor substrate SB, but does not have the nitride layer at a boundary between the upper portion of the semiconductor substrate SB in the active region AC1 for p channel MISFET and the upper portion of the element isolation region ST surrounding the active region AC1. This means that on the inner surface of the trench TR surrounding the active region AC1 for p channel MISFET, the semiconductor device does not have the nitride layer SN on the upper portion of the side surface of the trench TR on the side adjacent to the semiconductor substrate SB in the active region AC1.

In the active region AC1 for p channel MISFET, therefore, generation of crystal defects in the the semiconductor substrate SB in the active region AC1 due to expansion of the element isolation region ST can be suppressed or prevented and in addition, the p channel MISFETQp formed in the active region AC1 can be suppressed or prevented from having deteriorated NBTI characteristics. The reason is similar to that described above for the semiconductor device of FIGS. 30 to 32.

On the other hand, at a boundary between the upper portion of the semiconductor substrate SB in the active region AC2 for n channel MISFET and the upper portion of the element isolation region ST surrounding the active region AC2, the nitride layer SN is sometimes present and the nitride layer is sometimes not present. When the nitride layer SN is present at a boundary between the upper portion of the semiconductor substrate SB in the active region AC2 for n channel MISFET and the upper portion of the element isolation region ST, the nitride layer SN is also present on the upper portion of the side surface of the trench TR on the side adjacent to the semiconductor substrate SB in the active region AC2. The trench TR surrounding the active region. AC2 therefore has the nitride layer SN on the entire inner surface thereof. When the nitride layer SN is not present at a boundary between the upper portion of the semiconductor substrate SB in the active region AC2 for n channel MISFET and the upper portion of the element isolation region ST, the nitride layer SN is not present on the upper portion of the side surface of the trench TR on the side adjacent to the semiconductor substrate SB in the active region AC2 and the nitride layer SN is present in the other region of the inner surface of the trench TR surrounding the active region AC2.

When the nitride layer SN is not present at a boundary between the upper portion of the semiconductor substrate SB in the active regions (AC1 and AC2) and the upper portion of the element isolation region ST, in both the active region AC1 for p channel MISFET and the active region AC2 for n channel MISFET, the p channel MISFETQp and the n channel MISFETQn can each be prevented from having deteriorated NBTI characteristics. In addition, in both the p channel MISFETQp and the n channel MISFETQn, the deterioration degree of NBTI characteristics can be suppressed or prevented from depending on the gate width.

As described above in First. Modification Example of First Embodiment, the p channel MISFET requires suppression of deterioration in NBTI characteristics and compared with the p channel MISFET, the n channel MISFET does not require suppression of deterioration in NBTI characteristics so eagerly.

In Third Modification Example, the nitride layer SN is preferably present at a boundary between the upper portion of the semiconductor substrate SB in the active region AC2 for n channel MISFET and the upper portion of the element isolation region ST. In other words, the nitride layer SN is also present preferably on the upper portion of the side surface of the trench TR on the side adjacent to the semiconductor substrate SB in the active region AC2 for n channel MISFIT and therefore, the nitride layer SN is present preferably on the entire side surface of the trench TR on the side adjacent to the semiconductor substrate SB in the active region AC2. This makes it possible to more properly suppress or prevent the element isolation region ST surrounding the active region AC2 for n channel MISFET from being re-oxidized and thereby expanding and accordingly, more properly suppress or prevent generation of crystal defects in the semiconductor substrate SB in the active region AC2 for n channel MISFET which would otherwise be caused by expansion of the element isolation region ST.

During the oxidation treatment shown in FIGS. 35 and 36, the active region AC2 for n channel MISFET and the element isolation region ST surrounding the active region may be covered with the photoresist pattern PR2 in advance. When covered, the upper portion of the nitride layer SN present between the semiconductor substrate SB in the active region AC1 and the element isolation region ST is oxidized into an oxidation portion OX by the oxidation treatment shown in FIGS. 35 and 36, but the upper portion of the nitride layer SN present between the semiconductor substrate SB in the active region AC2 and the element isolation region ST remains unoxidized. The semiconductor device thus manufactured can therefore has a structure not having the nitride layer SN at a boundary between the upper portion of the semiconductor substrate SB in the active region AC1 for p channel MISFET and the upper portion of the element isolation region ST, but having the nitride layer at a boundary between the the upper portion of the semiconductor substrate SB in the active region AC2 for n channel MISFET and the upper portion of the element isolation region ST.

The step of forming each of the p channel MISFETQp and the n channel MISFETQn is similar to that of First Embodiment (including First Modification Example) so that a description on it is omitted here.

<Fourth Modification Example>

Figure 41:
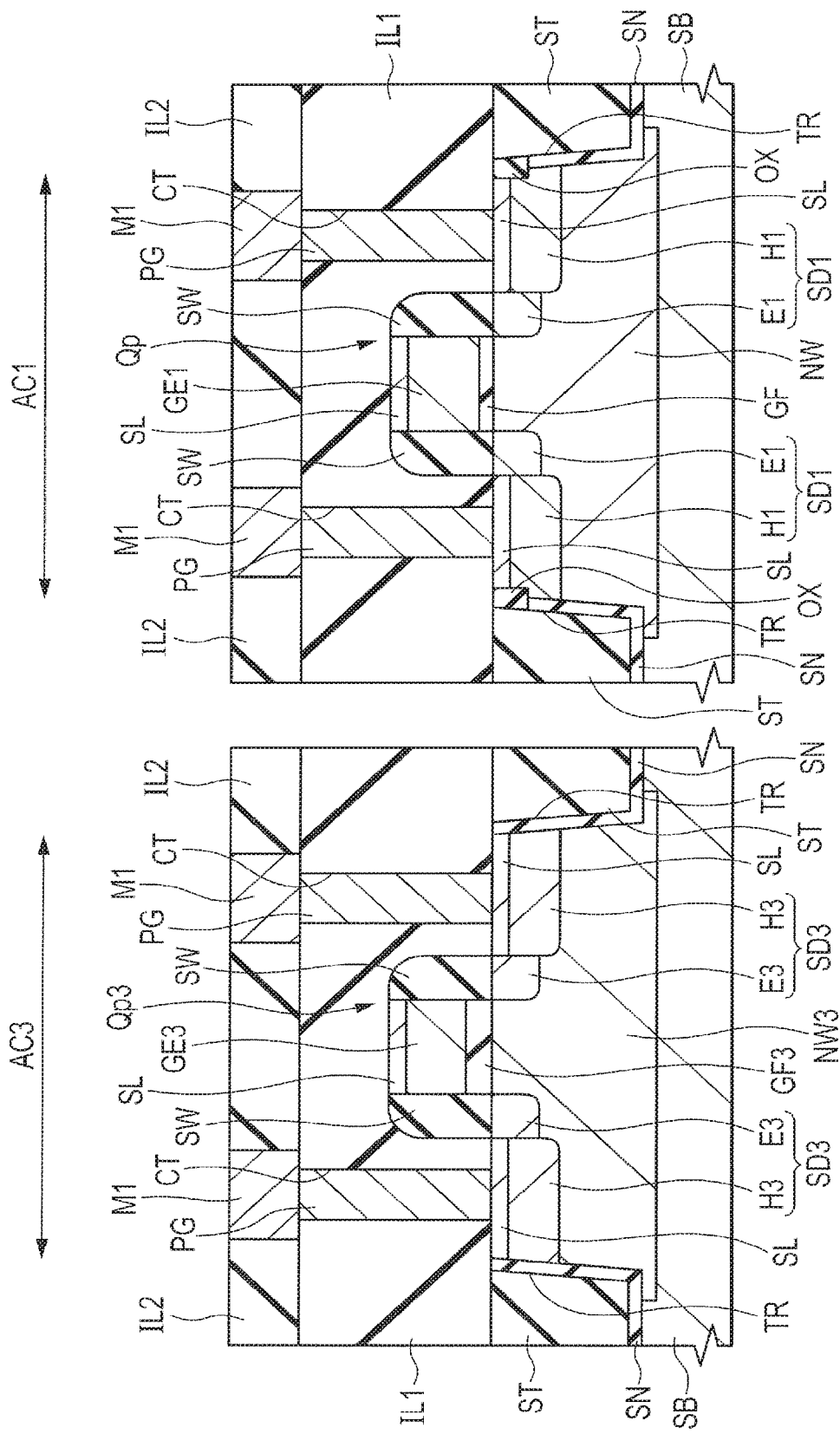
FIG. 41 is a fragmentary cross-sectional view of a semiconductor device of Fourth Modification Example.

FIGS. 41 and 42 are fragmentary cross-sectional views showing a semiconductor device of Fourth Modification Example of Second Embodiment, in which FIG. 41 shows, similar to FIG. 39, a cross-section (cross-section along a gate length direction) corresponding to FIG. 31 and FIG. 42 shows, similar to FIG. 40, a cross-section (cross-section along a gate width direction) corresponding to FIG. 32.

Similar to the semiconductor device of Second Modification Example of First Embodiment shown above in FIGS. 28 and 29, the semiconductor device of Fourth Modification Example of Second Embodiment shown in FIGS. 41 and 42 also has, on the semiconductor substrate SB, a low-breakdown-voltage MISFET (Qp) and a high-breakdown-voltage MISFET (Qp3).

The semiconductor device of Fourth Modification Example of Second Embodiment shown in FIGS. 41 and 42 is different in the following points from the semiconductor device of Second Modification Example of First Embodiment shown in FIGS. 28 and 29.

The semiconductor device of Fourth Modification Example of Second Embodiment shown in FIGS. 41 and 42 does not have fluorine (F) introduced into a region in the vicinity of a boundary between the element isolation region ST and the semiconductor substrate SB in the active regions AC1 and AC3. This means that the semiconductor device of Fourth Modification Example does not have a region corresponding to the fluorine implanted region FR. Manufacturing steps of the semiconductor device of Fourth Modification Example therefore do not include a step corresponding to the above-described ion implantation IM1.

The semiconductor device of Fourth Modification Example of Second Embodiment has a nitride layer SN obtained by nitriding the inner surface of the trench TR in the semiconductor substrate SB, but does not have the nitride layer SN at a boundary between the upper portion of the semiconductor substrate SB in the active region AC1 and the upper portion of the element isolation region ST. This means that the semiconductor device of Fourth Modification Example of Second Embodiment does not have the nitride layer SN on the upper portion of the side surface of the trench TR on the side adjacent to the semiconductor substrate SB in the active region AC1, but has it in the other region of the inner surface (side surface and bottom surface) of the trench TR surrounding the active region AC1. More specifically, the upper portion of the nitride layer SN formed on the side surface of the trench TR on the side adjacent to the semiconductor substrate SB in the active region AC1 is oxidized into an oxidation portion OX. This means that also in Fourth Modification Example, the nitride layer SN present between the element isolation region ST surrounding the active region AC1 and the semiconductor substrate SB in the active region AC1 has a configuration similar to that of the nitride layer SN present between the element isolation region ST surrounding the active region AC1 and the semiconductor substrate SB in the active region AC1 as shown in FIGS. 30 to 32.

The other configuration of the semiconductor device of Fourth Modification Example of Second Embodiment is essentially similar to that of the semiconductor device of Second Modification Example of First Embodiment so that an overlapping description is omitted here.

The semiconductor device of Fourth Modification Example shown in FIGS. 41 and 42 has the nitride layer SN obtained by nitriding the inner surface of the trench TR in the semiconductor substrate SB but does not have the nitride layer at a boundary between the upper portion of the semiconductor substrate SB in the active region AC1 for low-breakdown-voltage p channel MISFET and the upper portion of the element isolation region ST surrounding the active region AC1. This means that on the inner surface of the trench TR surrounding the active region AC1 for the low-breakdown-voltage p channel MISFET, the nitride layer SN is not present on the upper portion of the side surface of the trench TR on the side adjacent to the semiconductor substrate SB in the active region AC1.

In the active region AC1 for low-breakdown-voltage MISFET, generation of crystal defects in the semiconductor substrate SB in the active region AC1 due to expansion of the element isolation region ST can be suppressed or prevented. In addition, the low-breakdown-voltage MISFET (Qp) formed in the active region AC1 can be suppressed or prevented from having deteriorated NBTI characteristics. The reason is similar to that described for the semiconductor device shown in FIGS. 30 to 32.

On the other hand, the semiconductor device sometimes has the nitride layer SN and sometimes does not have the nitride layer SN at a boundary between the upper portion of the semiconductor substrate SB in the active region AC3 for high-breakdown-voltage MISFET and the upper portion of the element isolation region ST surrounding the active region AC3. When the nitride layer SN is present at a boundary between the upper portion of the semiconductor substrate SB in the active region AC3 for high-breakdown-voltage MISFET and the upper portion of the element isolation region ST, the nitride layer SN is also present on the upper portion of the side surface of the trench TR on the side adjacent to the semiconductor substrate SB in the active region AC3 and the nitride layer SN is present on the entire inner surface of the trench TR surround in the active region AC3. When the nitride layer SN is not present at the boundary between the upper portion of the semiconductor substrate SB in the active region AC3 for high-breakdown-voltage MISFET and the upper portion of the element isolation region ST, the nitride layer SN is not present on the upper portion of the side surface of the trench TR on the side adjacent to the semiconductor substrate SB in the active region AC3 and the nitride layer SN is present in the other region of the inner surface of the trench TR surrounding the active region AC3.

When the nitride layer SN is not present at the boundary between the upper portion of the semiconductor substrate SB in the active regions (AC1 and AC3), more specifically, in the active region (AC1) for low-breakdown-voltage MISFET and the active region (AC3) for high-breakdown-voltage MISFET, and the upper portion of the element isolation region ST, both the low-breakdown-voltage MISFET (Qp) and the high-breakdown-voltage MISFET (Qp3) can be suppressed or prevented from having deteriorated NBTI characteristics. In addition, in both the low-breakdown-voltage MISFET (Qp) and the high-breakdown-voltage MISFET (Qp3), a deterioration degree of NBTI characteristics can be suppressed or prevented from depending on the gate width.

As described above for Second Modification Example of First Embodiment, only the low-breakdown-voltage MISFET requires suppression of deterioration in NBTI characteristics. Compared with it, the high-breakdown-voltage MISFET does not require suppression of deterioration in NBTI characteristics so much.

In Fourth Modification Example, therefore, the nitride layer SN is formed preferably at the boundary between the upper portion of the semiconductor substrate SB in the active region AC3 for high-breakdown-voltage MISFET (Qp3) and the upper portion of the element isolation region ST. This means that the nitride layer SN is preferably formed also on the upper portion of the side surface of the trench TR on the side adjacent to the semiconductor substrate SB in the active region AC3 for high-breakdown-voltage MISFET (Qp3) and therefore, the nitride layer SN is present preferably on the entire side surface of the trench TR on the side adjacent to the semiconductor substrate SB in the active region AC3. This makes it possible to more properly suppress or prevent the element isolation region ST surrounding the active region AC3 for high-breakdown-voltage MISFET (Qp3) from being re-oxidized and thereby expanding and therefore makes it possible to more properly suppress or prevent generation of crystal defects in the semiconductor substrate SB in the active region AC3 for high-breakdown-voltage MISFET (Qp3) due to expansion of the element isolation region ST.

It is recommended to cover the active region AC3 for high-breakdown-voltage MISFET (Qp3) and the element isolation region ST surrounding it with the photoresist pattern PR2 when the oxidation treatment shown in FIGS. 35 and 36 is performed. By the oxidation treatment shown in FIGS. 35 and 36, the upper portion of the nitride layer SN present between the semiconductor substrate SB in the active region AC1 and the element isolation region ST is oxidized into the oxidation portion OX, but the upper portion of the nitride layer SN present between the semiconductor substrate SB in the active region AC3 and the element isolation region ST remains unoxidized because of covering. As a result, the semiconductor device thus obtained has a structure not having the nitride layer SN at a boundary between the upper portion of the semiconductor substrate SB in the active region AC1 for low-breakdown-voltage MISFET (Qp) and the upper portion of the element isolation region ST, while having the nitride layer SN at a boundary between the upper portion of the semiconductor substrate SB in the active region AC3 for high-breakdown-voltage MISFET (Qp3) and the upper portion of the element isolation region ST.

The step of forming each of the low-breakdown-voltage p channel MISFETQp and the high-breakdown-voltage p channel MISFETQp3 is similar to that of First Embodiment (including Second Modification Example) so that a description on it is omitted.

The in made by the present inventors has been described specifically based on some embodiments of it. It is needless to say that the present invention is not limited to or by these embodiments but can be changed without departing from the gist of the invention.

Some of the details described in the above embodiments will next be described.

[Appendix 1]
A method of manufacturing a semiconductor device including the steps of:
(a) providing a semiconductor substrate;
(b) forming a trench in the semiconductor substrate;
(c) nitriding the inner surface of the trench in the semiconductor substrate to form a nitride layer;
(d) after the step (c), forming in the trench an element isolation region composed mainly of silicon oxide;
(e) oxidizing an upper portion of the nitride layer at a boundary between the element isolation region and the semiconductor substrate in a first active region surrounded by the element isolation region;
(f) after the step (e), forming a first gate electrode for first MISFET on the semiconductor substrate in the first active region via a first gate insulating film; and
(g) forming a first source/drain region for the first MISFET in the semiconductor substrate in the first active region, wherein a portion of the first gate electrode extends over the element isolation region.

[Appendix 2]
The method of manufacturing a semiconductor device according to Appendix 1, wherein the first MISFET is a p channel type.

What is claimed is:
1. A semiconductor device comprising:
a semiconductor substrate having a first element isolation region and an active region adjacent to the first element isolation region; and
a MISFET having:
  a gate insulating film formed on the semiconductor substrate in the active region,
  a gate electrode formed on the gate insulating film,
  a source region formed in the semiconductor substrate in the active region and formed on one side of the gate electrode,
  a drain region formed in a second portion of the semiconductor substrate in the active region and formed on the other side of the gate electrode, and
  a channel region formed in the semiconductor substrate in the active region and formed between the source region and the drain region,
wherein the semiconductor substrate in the first element isolation region has a first trench,
wherein a first insulating film is buried in the first trench,
wherein the first insulating film is overlapped with a part of the gate electrode,
wherein the first insulating film has:
  a first portion into which fluorine is implanted, and located beneath the part of the gate electrode, and
  a second portion located lower side of the first insulating film than the first portion in cross-section view, and
wherein a concentration of fluorine in the first portion is higher than a concentration of fluorine in the second portion.

2. The semiconductor device according to claim 1, wherein fluorine is not implanted into the second portion of the first insulating film.

3. The semiconductor device according to claim 1, wherein a thickness of the first portion is 10 nm or more and 500 nm or less, and
wherein the concentration of fluorine in the first portion is $1 \times 10^{18}/cm^3$ or more and $1 \times 10^{21}/cm^3$ or less.

4. The semiconductor device according to claim 1, wherein the first insulating film is comprised of silicon oxide, and
wherein a second insulating film comprised of nitride is formed between the semiconductor substrate in the active region and the first insulating film.

5. The semiconductor device according to claim 1, wherein the semiconductor substrate comprises a second element isolation region formed in opposite side of the first element isolation region with the active region sandwiched between the first and second element isolation regions,
wherein the semiconductor substrate in the second element isolation region has:
  a second trench; and
  a third insulating film buried in the second trench, and
wherein the third insulating film is overlapped with the other part of the gate electrode.

6. The semiconductor device according to claim 5, wherein the channel region is formed between the first and second element isolation regions, and wherein fluorine is implanted into both ends of the channel region in a channel width direction of the channel region.

7. The semiconductor device according to claim 5, wherein fluorine is not implanted into a region between the both ends of the channel region.

8. The semiconductor device according to claim 1, wherein the MISFET is a p channel MISFET.

* * * * *